United States Patent
Nagai

(10) Patent No.: US 9,129,853 B2
(45) Date of Patent: Sep. 8, 2015

(54) SEMICONDUCTOR DEVICE AND METHOD OF MANUFACTURING THE SAME

(75) Inventor: Kouichi Nagai, Kawasaki (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 465 days.

(21) Appl. No.: 13/491,737

(22) Filed: Jun. 8, 2012

(65) Prior Publication Data

US 2012/0244642 A1 Sep. 27, 2012

Related U.S. Application Data

(60) Division of application No. 12/758,459, filed on Apr. 12, 2010, now abandoned, which is a continuation of application No. PCT/JP2007/071419, filed on Nov. 2, 2007.

(51) Int. Cl.
| | |
|---|---|
| H01L 21/4763 | (2006.01) |
| H01L 23/48 | (2006.01) |
| H01L 27/115 | (2006.01) |
| H01L 23/532 | (2006.01) |
| H01L 27/06 | (2006.01) |
| H01L 49/02 | (2006.01) |
| H01L 23/00 | (2006.01) |

(52) U.S. Cl.
CPC .... *H01L 27/11509* (2013.01); *H01L 23/53238* (2013.01); *H01L 23/53295* (2013.01); *H01L 24/05* (2013.01); *H01L 27/0629* (2013.01); *H01L 27/11502* (2013.01); *H01L 28/55* (2013.01); *H01L 2924/07802* (2013.01); *H01L 2924/13091* (2013.01)

(58) Field of Classification Search
USPC ............. 438/3, 618, 622–628; 257/295, 532, 257/758, 760
See application file for complete search history.

(56) References Cited

U.S. PATENT DOCUMENTS

| | | | |
|---|---|---|---|
| 5,739,579 A | 4/1998 | Chiang et al. | |
| 5,866,920 A | 2/1999 | Matsumoto et al. | |
| 6,037,207 A | * 3/2000 | Asano et al. | 438/241 |
| 6,130,154 A | 10/2000 | Yokoyama et al. | |

(Continued)

FOREIGN PATENT DOCUMENTS

| | | |
|---|---|---|
| JP | 10-275859 A | 10/1998 |
| JP | 2005-183842 A | 7/2005 |
| JP | 2006-202848 A | 8/2006 |
| JP | 2007-201153 A | 8/2007 |
| JP | 2007-266429 A | 10/2007 |

OTHER PUBLICATIONS

US Office Action dated Mar. 5, 2013, issued in corresponding U.S. Appl. No. 12/758,459.

(Continued)

*Primary Examiner* — Ori Nadav
(74) *Attorney, Agent, or Firm* — Westerman, Hattori, Daniels & Adrian, LLP

(57) ABSTRACT

A method for manufacturing a semiconductor device including a semiconductor substrate having transistors formed thereon, a first interlayer insulating film formed above the semiconductor substrate and the transistors, a ferroelectric capacitor formed above the first interlayer insulating film, a second interlayer insulating film formed above the first interlayer insulating film and the ferroelectric capacitor, a first metal wiring formed on the second interlayer insulating film, and a protection film formed on an upper surface of the wiring but not on a side surface of the wiring.

9 Claims, 53 Drawing Sheets

(56) References Cited

U.S. PATENT DOCUMENTS

| | | |
|---|---|---|
| 6,627,996 B1 | 9/2003 | Kishimoto et al. |
| 7,078,242 B2 | 7/2006 | Matsuura et al. |
| 7,407,893 B2 | 8/2008 | Seamons et al. |
| 7,518,173 B2 | 4/2009 | Hikosaka et al. |
| 8,183,109 B2 * | 5/2012 | Izumi et al. .................. 438/253 |
| 2004/0113189 A1 | 6/2004 | Takamatsu et al. |

OTHER PUBLICATIONS

International Search Report of PCT/JP2007/071419, mailing date of Feb. 5, 2008.
Japanese Office Action dated Sep. 11, 2012, issued in corresponding application No. 2009-538900, with English translation.
US Office Action dated Aug. 13, 2013 issued in corresponding U.S. Appl. No. 12/758,459.

* cited by examiner

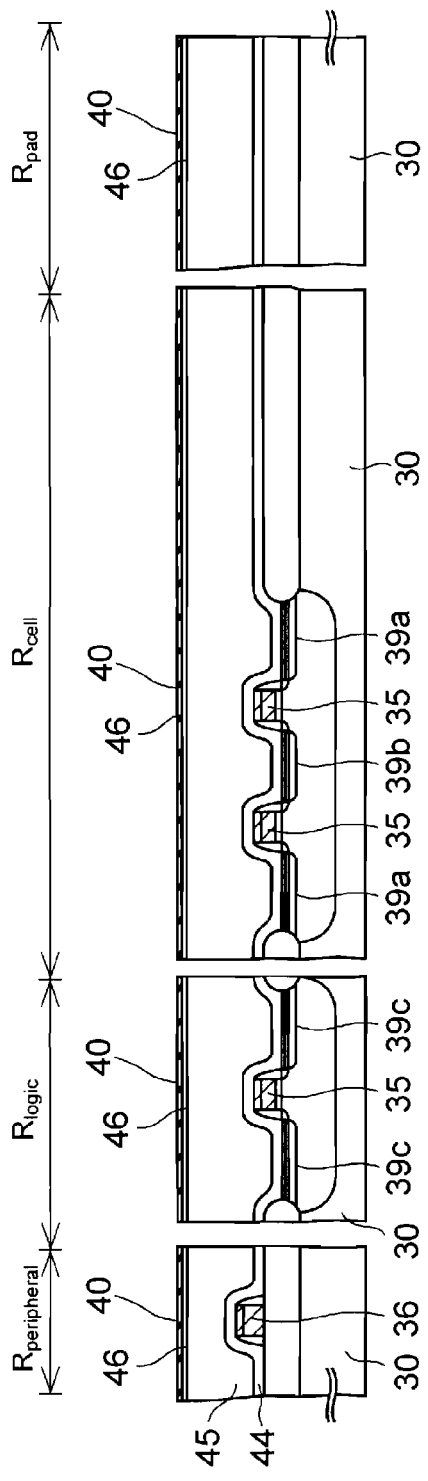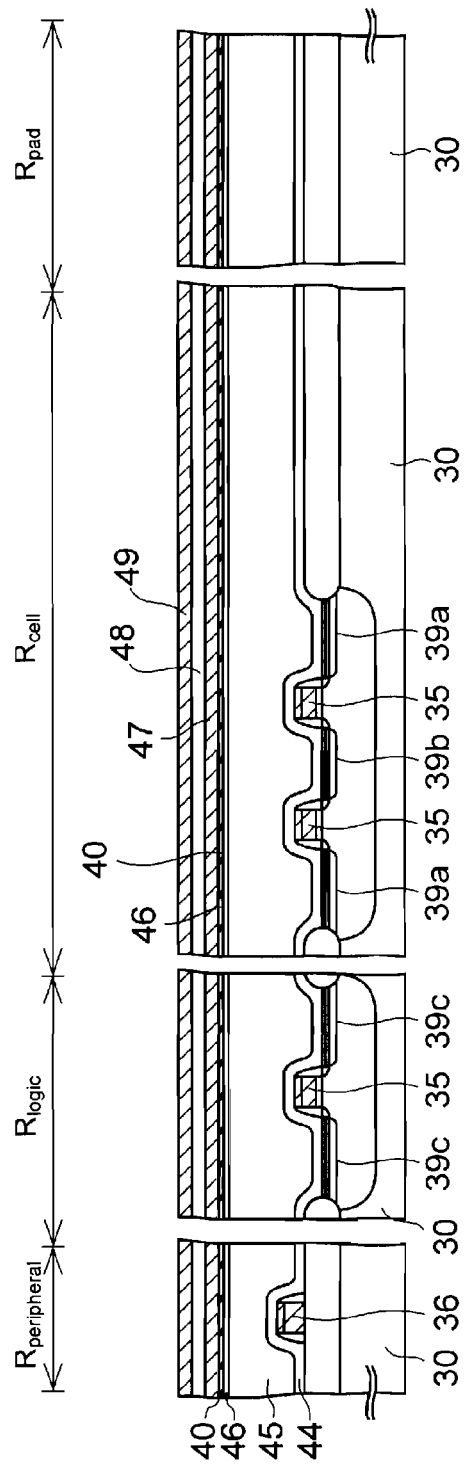

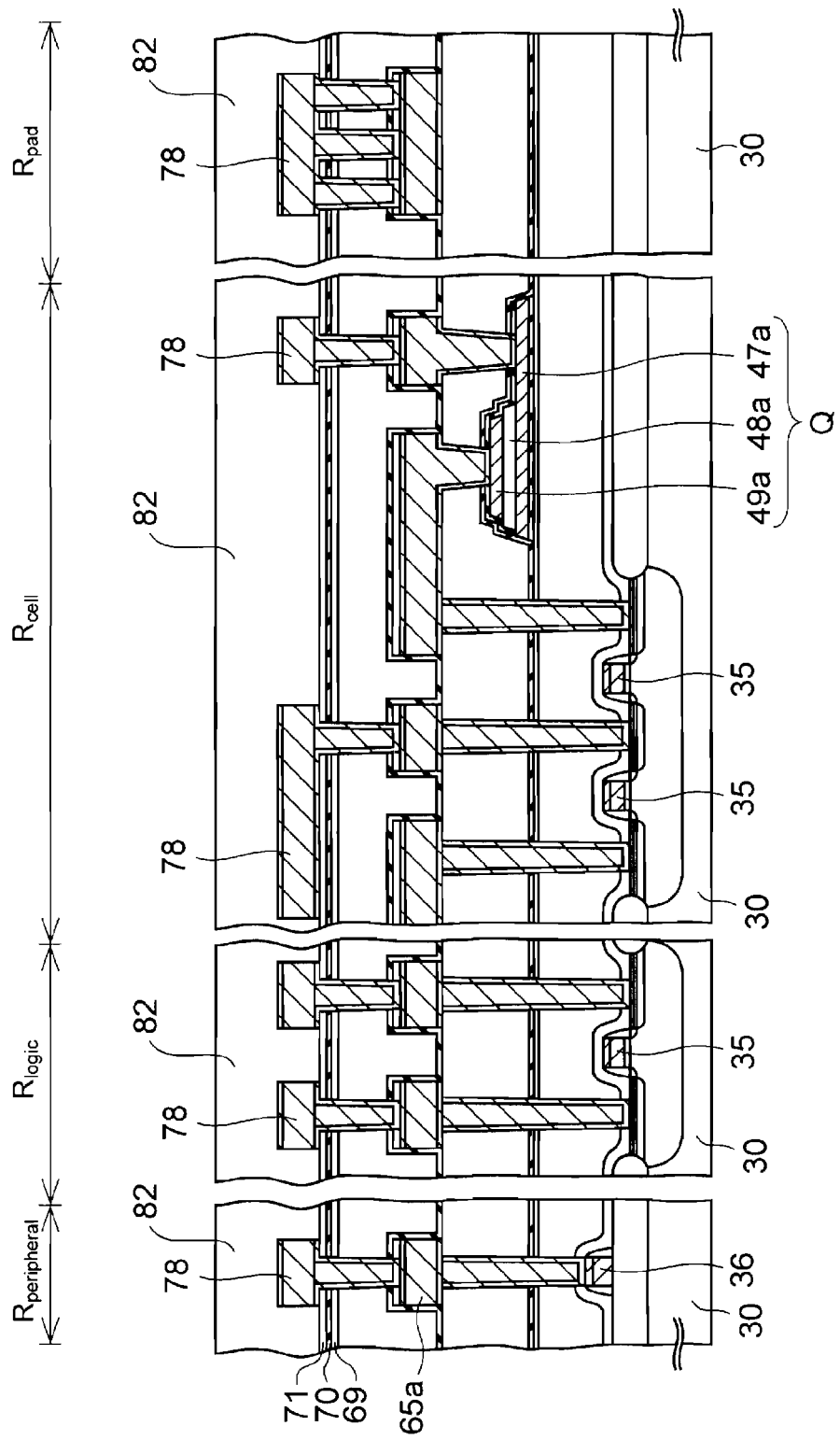

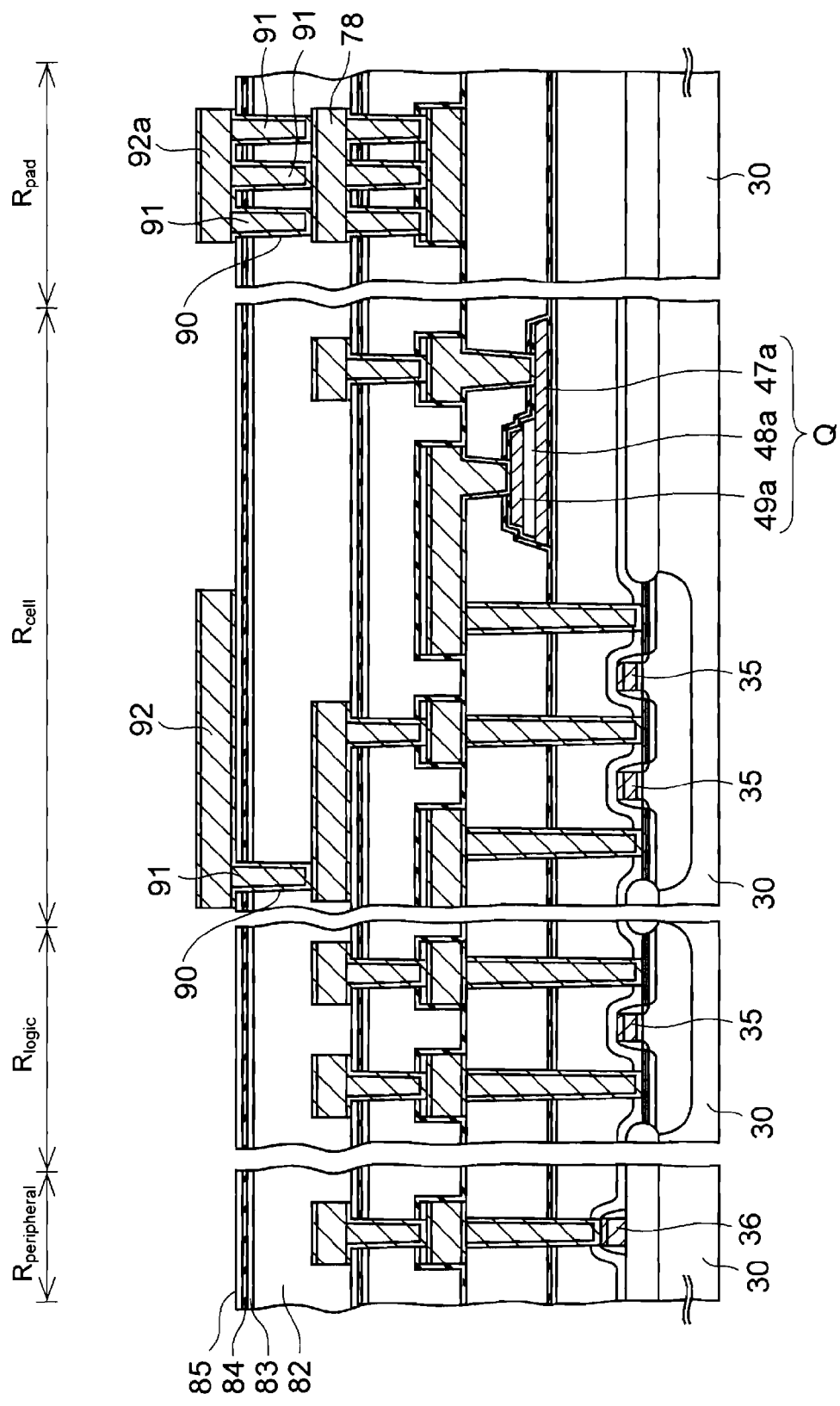

SEMICONDUCTOR DEVICE AND METHOD OF MANUFACTURING THE SAME

CROSS-REFERENCE TO RELATED APPLICATIONS

This application is a divisional of U.S. application Ser. No. 12/758,459 filed on Apr. 12, 2010, which is a Continuation of Patent Application No. PCT/JP2007/071419, filed on Nov. 2, 2007, the entire contents of which being incorporated herein by reference.

FIELD

It is related to a semiconductor device and a method of manufacturing the same.

BACKGROUND

In recent years, ferroelectric random access memories (FeRAMs) are developed in which information is stored in ferroelectric capacitors by using polarization inversion of a ferroelectric material. FeRAMs are nonvolatile memory which do not lose information stored therein, even if being turned off, and can achieve high integration degree, high-speed drive, high durability, low power consumption and the like. Due to these advantages, attention is given especially to FeRAMs.

A related art is disclosed in Japanese Laid-open Patent publication Nos. 2005-183842 and 2006-202848

In Japanese Laid-open Patent publication No. 2006-202848, a capacitor is enveloped by an alumina film (paragraph No. 0030).

SUMMARY

According to one aspect discussed herein, there is provided a semiconductor device including a semiconductor substrate including a transistor, a first interlayer insulating film formed over the semiconductor substrate and the transistor, a ferroelectric capacitor formed over the first interlayer insulating film, a second interlayer insulating film formed over the first interlayer insulating film and the ferroelectric capacitor, a wiring formed over the second interlayer insulating film, and a protection film formed over an upper surface of the wiring but not on a side surface of the wiring.

According to another aspect discussed herein, there is provided a method of manufacturing a semiconductor device, including forming a transistor on a semiconductor substrate, forming a first interlayer insulating film over the semiconductor substrate and the transistor, forming a ferroelectric capacitor over the first interlayer insulating film, forming a second interlayer insulating film over the first interlayer insulating film and the ferroelectric capacitor, forming a wiring over the second interlayer insulating film, and forming a protection film over an upper surface of the wiring but not on a side surface of the wiring.

Other Objects and further features of the present application will become apparent from the following detailed description when read in conjunction with the attached drawings.

BRIEF DESCRIPTION OF THE DRAWINGS

FIGS. 2A to 2Z and 3A to 3E are cross-sectional views of a semiconductor device according to a first embodiment in the course of manufacturing;

DESCRIPTION OF EMBODIMENTS

Before providing description of embodiments, results of an investigation carried out by the inventor of the present application are described.

In the course of manufacturing a FeRAM, a capacitor dielectric film made of a ferroelectric oxide is damaged by various factors.

For example, in the step of depositing an interlayer insulating film made of silicone oxide over the capacitor dielectric film, the capacitor dielectric film is reduced by reducing substances such as hydrogen contained in a deposition atmosphere, and is thereby deteriorated.

In addition, from experience of the inventor of the present application, it is also known that plasma damage occurs in the capacitor dielectric film, when the interlayer insulating film is formed by a plasma chemical vapor deposition (CVD) method. It is empirically revealed that such plasma damage prominently occurs when a wiring electrically connected to an upper electrode is exposed to plasma. Moreover, plasma damage occurs in the capacitor dielectric film also when the upper electrode or the capacitor dielectric film is exposed to a plasma atmosphere.

Such deterioration of the capacitor dielectric film attributable to the reducing substances or plasma damage is considered to be prevented if an insulating hydrogen barrier film is formed on the wirings.

In the following, description is given of a FeRAM including such an insulating hydrogen barrier film.

FIGS. 1A to 1G are cross-sectional views of a FeRAM in the course of manufacturing used in the investigation by the inventor of the present application.

Figure 1A:
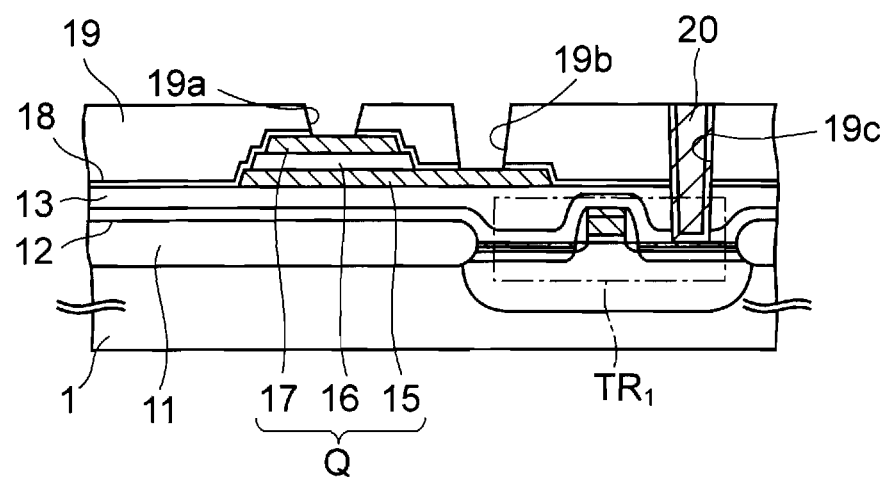
FIGS. 1A to 1G are cross-sectional views of an investigated FeRAM in the course of manufacturing.

Firstly, steps for obtaining a cross-sectional structure illustrated in FIG. 1A are described.

First, by a local oxidation of silicon (LOCOS) method, an element isolation insulating film 11 is formed on a silicon substrate 1. Then, a metal oxide semiconductor (MOS) transistor TR is formed in each active region of the silicon substrate 1 defined by the element isolation insulating film 11.

Thereafter, a cover insulating film 12 made of silicon nitride (SiN) and a base insulating film 13 made of silicon oxide ($SiO_2$) are formed over the entire upper surface of the silicon substrate 1 by a plasma CVD method.

Moreover, a ferroelectric capacitor Q is formed on the base insulating film 13. The capacitor Q is formed by laminating a lower electrode 15 made of platinum, a capacitor dielectric film 16 made of PZT and an upper electrode 17 made of iridium oxide ($IrO_2$), in this order from the bottom.

Subsequently, the capacitor Q is covered by a first insulating hydrogen barrier film 18 made of alumina, to protect the capacitor dielectric film 16 from a reducing material.

After forming the first interlayer insulating film 19 made of silicon oxide on the first insulating hydrogen barrier film 18, the first interlayer insulating film 19 is patterned by a photolithography, and thereby first to third holes 19a to 19c are formed as illustrated in FIG. 1A.

Thereafter, a conductive plug 20 mainly made of tungsten is embedded in the third hole 19c reaching the transistor TR.

Figure 1B:
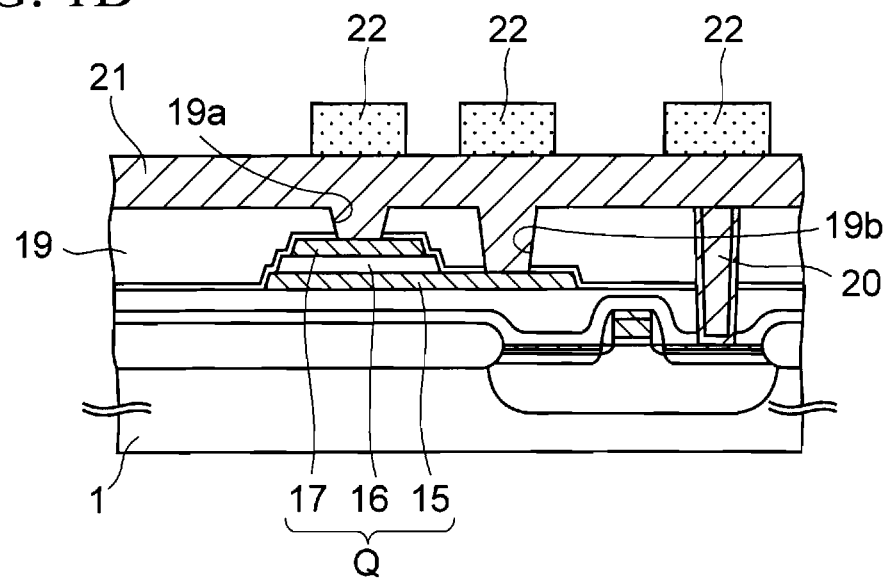

Next, as illustrated in FIG. 1B, a metal laminated film 21 mainly made of an aluminum film is formed in the first and the second holes 19a and 19b and on the interlayer insulating film 19.

Moreover, a photoresist is applied to the metal laminated film 21, and is then exposed and developed. Thereby, a resist pattern 22 is formed.

Figure 1C:
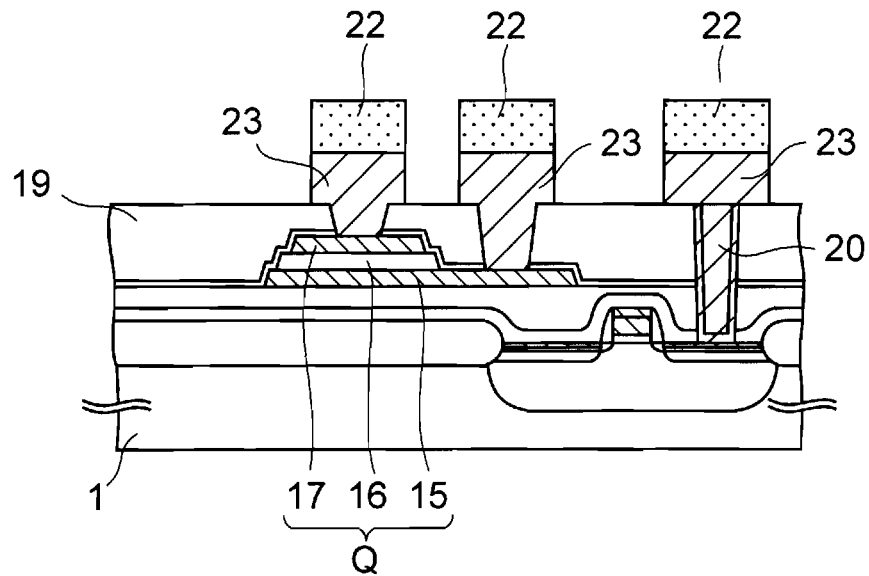

Subsequently, as illustrated in FIG. 1C, the metal laminated film 21 is patterned by using the resist pattern 22 as a mask, and thereby wirings 23 are formed.

Figure 1D:
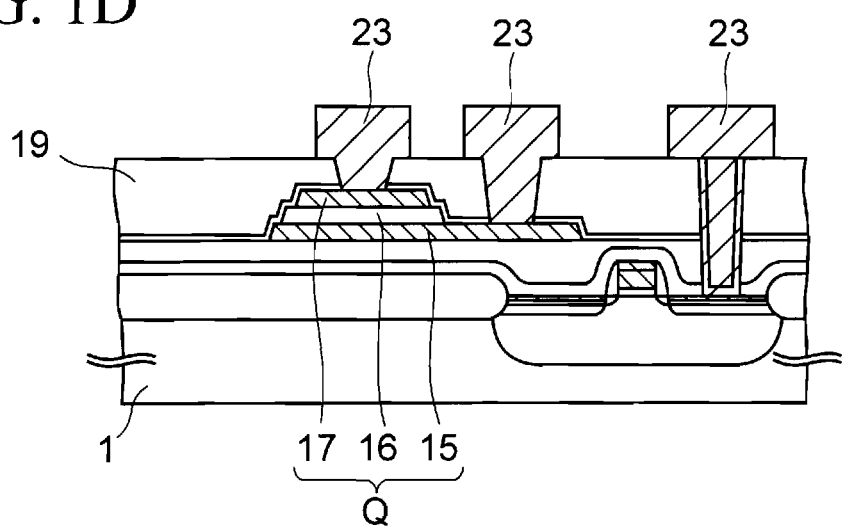

Then, as illustrated in FIG. 1D, the resist pattern 23 is removed by ashing, and then a resist residue is removed by a wet process using chemical liquid and pure water.

By this wet process, the wirings 23 absorb moisture. In addition, impurities attributable to a resist such as hydrocarbon may be attached to the surfaces of the wirings 23, since it is difficult to completely remove the resist residue by the wet process.

If moisture and hydrocarbon are attached to the wirings 23 in this manner, a film to be formed on the wirings 23 may peel off from the wirings 23.

Figure 1E:
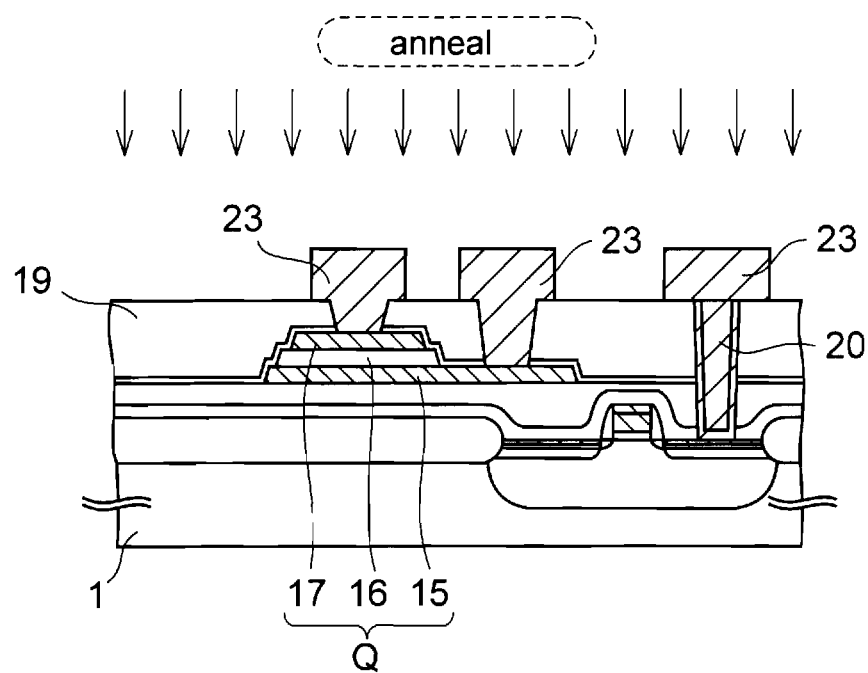

To deal with this problem, as illustrated in FIG. 1E, in the next step, annealing is performed on the wirings 23 in a nitrogen atmosphere. Thereby, impurities such as moisture and hydrocarbon attached to the wirings 23 evaporate, and thus the surfaces of the wirings 23 are cleaned. This annealing is performed under the conditions of, for example, a substrate temperature of 350° C., a nitrogen flow rate of 20 liter/min, and a process time of 30 minutes.

Figure 1F:
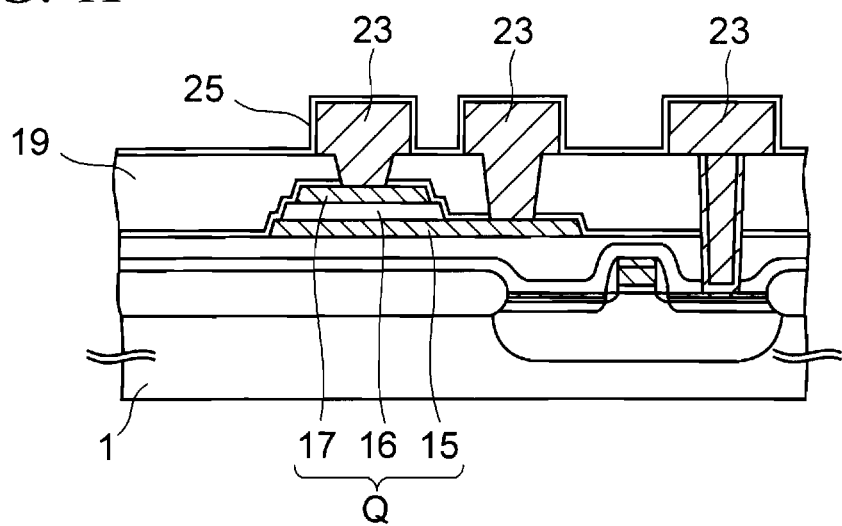

Subsequently, as illustrated in FIG. 1F, an alumina film is formed as a second insulating hydrogen barrier film 25 on the wirings 23 and the first interlayer insulating film 19 by a sputtering method.

Since the impurities are vaporized by the annealing performed on the wirings 23 in the step illustrated in FIG. 1E, excellent adhesiveness is obtained between the second insulating hydrogen barrier film 25 and the wirings 23.

Figure 1G:
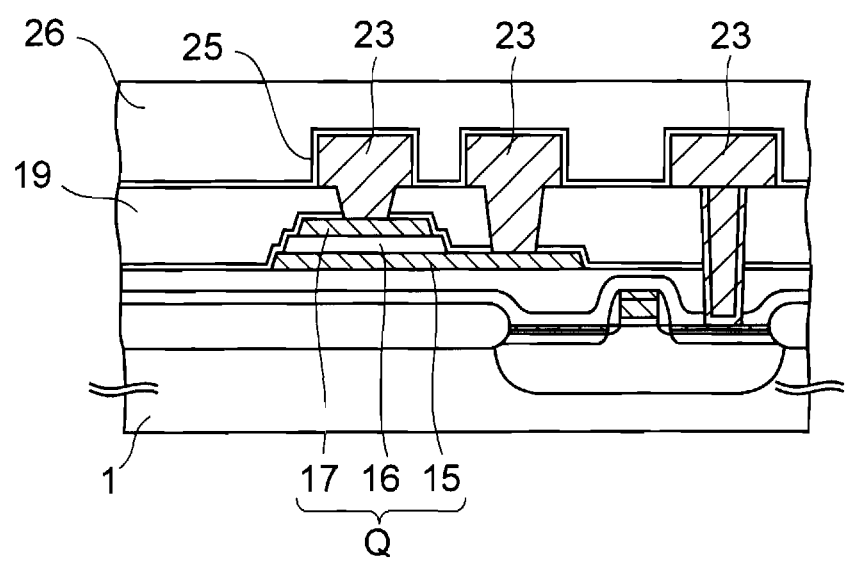

Then, as illustrated in FIG. 1G, a silicon oxide film to serve as a second interlayer insulating film 26 is formed on the second insulating hydrogen barrier film 25 by a plasma CVD method using tetraethoxysilane (TEOS) gas. Since a deposition temperature can be lowered in a plasma CVD method than in a low-pressure CVD method or the like, the plasma CVD method is advantageous in that the capacitor dielectric film 16 is less likely to deteriorate due to heat.

When depositing the second interlayer insulating film 26, the wirings 23 are covered with the second insulating hydrogen barrier film 25, and are hence not directly exposed to a plasma atmosphere used in depositing the second interlayer insulating film 26. Accordingly, plasma damage to the capacitor dielectric film 16 can be reduced in the capacitor Q electrically connected to the wirings 23.

Subsequently, an upper surface of the second interlayer insulating film 26 is polished by a chemical mechanical polishing (CMP) method. In this way, a basic structure of the FeRAM used in this investigation is completed.

In the above-described method of manufacturing a FeRAM, the second insulating hydrogen barrier film 25 is formed to cover the wirings 23, and consequently the wirings 23 are isolated from the plasma atmosphere used when depositing the second interlayer insulating film 26. Thereby, plasma damage caused on the capacitor dielectric film 16 through the wirings 23 is intended to be prevented.

However, this method requires annealing as described by using FIG. 1E, in order to prevent the second insulating hydrogen barrier film 25 from peeling off from the wirings 23. This causes another problem that the capacitor dielectric film 16 is deteriorated by heat if such annealing is performed after the capacitor Q is formed. The investigation carried out by the inventor of the present application reveals that the residual polarization charge of the capacitor dielectric film 16 decreases by approximately 3% to 8% in the case of performing such annealing compared with the case of not performing the annealing.

In addition, if water is remaining on the first interlayer insulating film 19, the capacitor Q is steamed during the annealing, which causes further deterioration of the capacitor dielectric film 16. This problem of steaming is prominent especially when the alumina film is formed at a mid-depth of the first interlayer insulating film 19 to effectively prevent hydrogen in an external atmosphere from reaching the capacitor Q.

It is also conceivable to compensate oxygen deficiency of the capacitor dielectric film 16 by annealing the capacitor dielectric film 16 at a high temperature in an oxygen-containing atmosphere after the wirings 23 are formed, in order to restore the residual polarization charge. However, if such annealing is performed, the conductive plug 20 mainly made of tungsten, which is easily oxidized, and the wirings 23 are oxidized. This causes another problem that contact resistance between the conductive plug 20 and the wirings 23 increases.

The inventor of the present application has reached the embodiments to be described below, in order to solve these newly-found problems.

First Embodiment

Firstly, description is given of a semiconductor device according to a first embodiment on the basis its manufacturing steps.

FIGS. 2A to 2Z and 3A to 3E are cross-sectional views of the semiconductor device according to this embodiment in the course of manufacturing. Note that, in these drawings, a peripheral circuit region $R_{peripheral}$, a logic circuit region $R_{logic}$, a cell region $R_{cell}$ and a pad region $R_{pad}$ of a single semiconductor chip are illustrated.

This semiconductor device is a planar-type FeRAM, and is manufactured as follows.

Figure 2A:
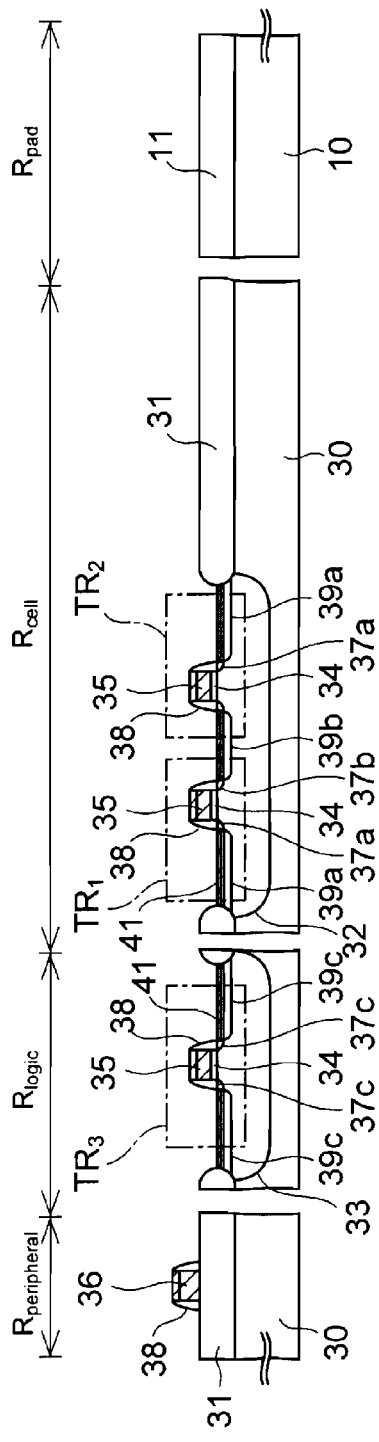

Firstly, description is given of steps for obtaining a cross-section structure illustrated in FIG. 2A.

First, an element isolation insulating film 31 is formed by thermally oxidizing a surface of an n-type or p-type silicon (semiconductor) substrate 30, and active regions for transistors are defined by the element isolation insulating film 31. The element isolation insulating film 31 has a film thickness of, for example, approximately 200 nm when measured from the upper surface of the silicon substrate 30. Instead of such an element isolation technique using LOCOS, shallow trench isolation (STI) may be used.

Then, first and second p-wells 32 and 33 are formed by implanting ions of a p-type impurity, for example, boron, into active regions of the silicon substrate 30, and a surface of each active region is thermally oxidized. Thereby, a thermal oxide film to serve as a gate insulating film 34 is formed to have a thickness of approximately 6 nm to 7 nm.

Subsequently, an amorphous silicon film having a thickness of approximately 50 nm and a tungsten silicide film having a thickness of approximately 150 nm are formed in this order over the entire upper surface of the silicon substrate 30. Here, a polycrystalline silicon film may be formed instead of the amorphous silicon film. Then, by patterning these films by photolithography, gate electrodes 35 are formed in the logic circuit region $R_{logic}$ and the cell region $R_{cell}$ of the silicon substrate 30, whereas a wiring 36 is formed in the peripheral circuit region $R_{peripheral}$ of the element isolation insulating film 31.

The gate length of each gate electrode 35 is approximately 360 μm, for example.

Next, by ion implantation using the gate electrodes 35 as masks, phosphorus is implanted as an n-type impurity into the silicon substrate 30 beside the gate electrodes 35. Thereby, first to third source/drain extensions 37a to 37c are formed.

Thereafter, an insulating film is formed over the entire upper surface of the silicon substrate 30, and the insulating film is etched back so that the insulting film is left as insulating side walls 38 on the side surfaces of the gate electrodes 35 and the wiring 36. As the insulating film, a silicon oxide film is formed to a thickness of 45 nm by a CVD method, for example.

Then, ions of an n-type impurity such as arsenic are implanted into the silicon substrate 30 while using the insulating side walls 38 and the gate electrodes 35 as masks. Thereby, first to third source/drain regions 39a to 39c are formed in the silicon substrate 30 beside the gate electrodes 35.

Further, a refractory metal film such as a cobalt film is formed on the entire upper surface of the silicon substrate 30 by a sputtering method. Then, by heating the refractory metal film to cause the refractory metal film to react with silicon, a refractory silicide layer 41 such as a cobalt silicide layer is formed on the first to third source/drain regions 39a to 39c of the silicon substrate 30. In this way, the resistance of each of the source/drain regions 39a to 39c is reduced. The refractory metal silicide layer is also formed on surfaces of the gate electrodes 35 and the wiring 36.

Thereafter, unreacted portions of the refractory metal layer on the element isolation insulating film 31 and the like are removed by wet etching.

Through the above-described steps, first to third MOS transistors $TR_1$ to $TR_3$ are formed in the cell region $R_{cell}$ and the logic region $R_{logic}$ of the silicon substrate 30. The first to third MOS transistors $TR_1$ to $TR_3$ are each formed of the gate insulating film 34, the gate electrode 35, and the first to third source/drain regions 39a to 39c and the like.

Figure 2B:
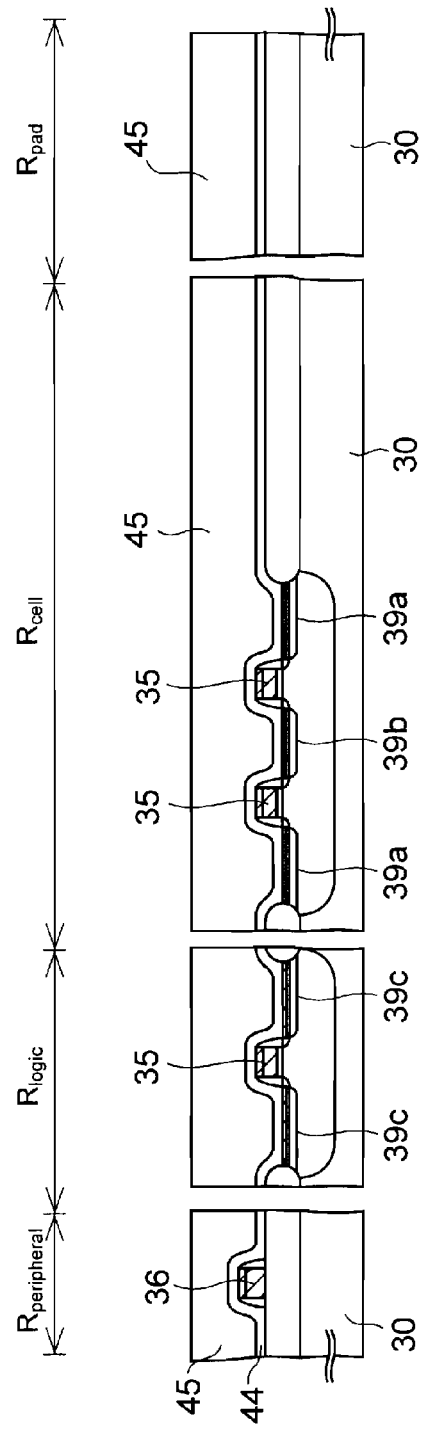

Next, as illustrated in FIG. 2B, a silicon oxynitride (SiON) film to serve as a base insulating film 44 is formed on the entire upper surface of the silicon substrate 30 by a plasma CVD method to have a thickness of approximately 200 nm.

Moreover, a silicon oxide film to serve as a first interlayer insulating film 45 is formed on the base insulating film 44 by a plasma CVD method using a mixed gas of TEOS gas and oxygen gas, to have a thickness of approximately 600 nm. Thereafter, to planarize an upper surface of the first interlayer insulating film 45, the upper surface is polished by a CMP method. The amount to be polished is approximately 200 nm, for example.

Thereafter, as illustrated in FIG. 2C, a silicon oxide film to serve as a first cap insulating film 46 is formed on the first interlayer insulating film 45 by a plasma CVD method using TEOS gas, to have a thickness of approximately 100 nm.

Then, as a dehydration process for the insulating films 45 and 46, annealing is performed at a substrate temperature of approximately 650° C. in a nitrogen atmosphere for approximately 30 minutes, and then an alumina film 40 is formed on the first cap insulating film 26 by a sputtering method to have a thickness of approximately 20 nm.

Subsequently, rapid thermal annealing (RTA) is performed on the alumina film 40 at a substrate temperature of 650° C. in an oxygen atmosphere for a process time of 60 seconds.

By forming the first cap insulating film 46 in advance before forming the alumina film 40 in this manner, micro scratches made in the upper surface of the first interlayer insulating film 45 due to contact with a polishing pad in the CMP are filled with the first cap insulating film 46. Thereby, the alumina film 40 is formed to be flat on the upper surface of the first cap insulating film 46.

Next, description is given of steps for obtaining a cross-sectional structure illustrated in FIG. 2D.

First, a platinum film is formed as a first conductive film 47 on the alumina film 40 by a sputtering method. The first conductive film 47 is later patterned to serve as a capacitor lower electrode having a film thickness of approximately 155 nm.

Moreover, a PZT film to serve as a ferroelectric film 48 is formed on the first conductive film 47 by a sputtering method to have a thickness of 150 nm to 200 nm.

As a method of depositing the ferroelectric film 48, a metal organic CVD (MOCVD) method or a sol-gel method may be employed instead of a sputtering method. In addition, the material of the ferroelectric film 48 is not limited to PZT, and the ferroelectric film 48 may be made of: a bismuth layer structured compound such as SBT($SrBi_2Ta_2O_9$), $SrBi_2(Ta_xNb_{1-x})_2O_9$ or $Bi_4Ti_2O_{12}$; PLZT($Pb_{1-x}La_xZr_{1-y}Ti_yO_3$) which is PZT doped with lanthanum; or other metal oxide ferroelectric.

Here, the PZT formed by the sputtering method is mostly not crystallized immediately after the deposition, and hence has poor dielectric characteristics. In view of this, as crystallization annealing for crystallizing the PZT forming the ferroelectric film 48, RTA is performed at a substrate temperature of approximately 585° C. in an oxygen-containing atmosphere having a oxygen flow rate of 0.025 liter/min, for approximately 90 seconds. Note that such crystallization annealing is not required when the ferroelectric film 48 is formed by a MOCVD method.

Next, a first iridium oxide film is formed on the ferroelectric film 48 by a sputtering method to have a thickness of approximately 50 nm, and then RTA is performed on the first iridium oxide film. Conditions for the RTA are not particularly limited. In this embodiment, the RTA is performed at a substrate temperature of 725° C. in an oxygen-containing atmosphere having an oxygen flow rate of 0.025 liter/min, for a process time of 20 seconds.

Subsequently, a second iridium oxide film is formed on the first iridium oxide film by a sputtering method to have a thickness of approximately 200 nm. The stacked film of the first and second iridium oxide films serves as a second conductive film 49.

Here, forming the first conductive film 47 on the alumina film 40 provides excellent orientation of platinum constituting the first conductive film 47, compared with the case in which the first conductive film 47 is formed directly on the first cap insulating film 46 without forming the alumina film 40. Due to the action of the orientation of the first conductive film 47, the orientations of the PZT constituting the ferroelectric film 48 are aligned, and hence the ferroelectric film 48 has improved ferroelectric characteristics.

Figure 2E:
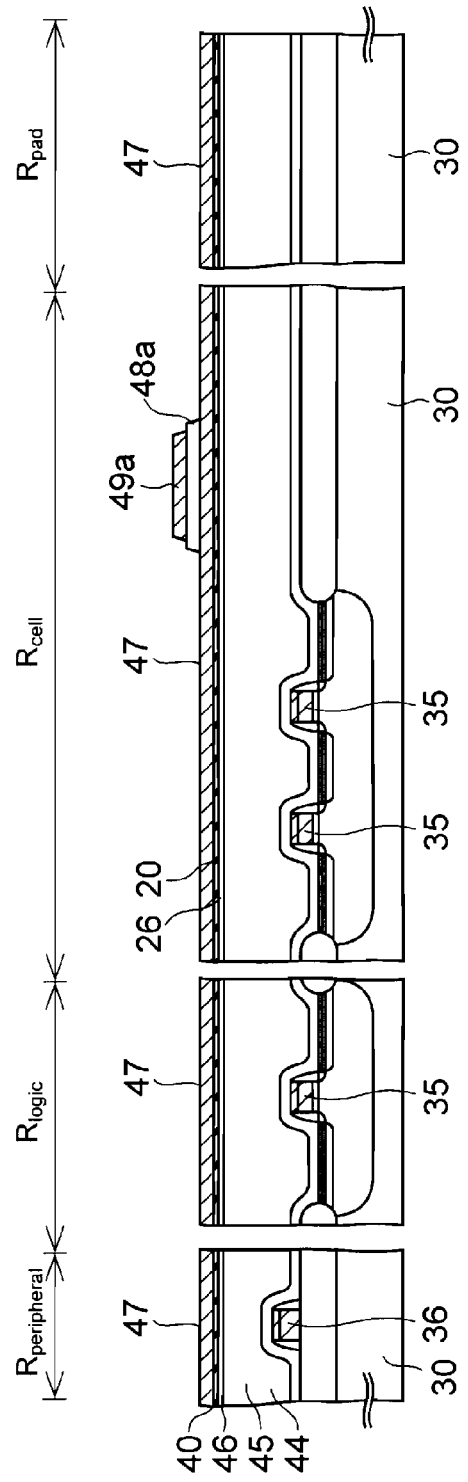

Next, description is given of steps for obtaining a cross-sectional structure illustrated in FIG. 2E.

First, the second conductive film 49 is patterned by photolithography to form an upper electrode 49a. Then, to recover damage caused to the ferroelectric film 48 by the patterning, recovery annealing is performed on the ferroelectric film 48 in a vertical furnace. This recovery annealing is performed in an oxygen-containing atmosphere having an oxygen flow rate of 20 liter/min under the conditions of a substrate temperature of 650° C. and a process time of 60 minutes, for example.

Thereafter, the ferroelectric film 48 is patterned by photolithography to form a capacitor dielectric film 48a made of a ferroelectric material such as PZT. Damage caused to the capacitor dielectric film 48a by the patterning is recovered by recovery annealing. This recovery annealing is performed in an oxygen-containing atmosphere in a vertical furnace under the conditions of an oxygen flow rate of 20 liter/min, a substrate temperature of 350° C. and a process time of 60 minutes.

Figure 2F:
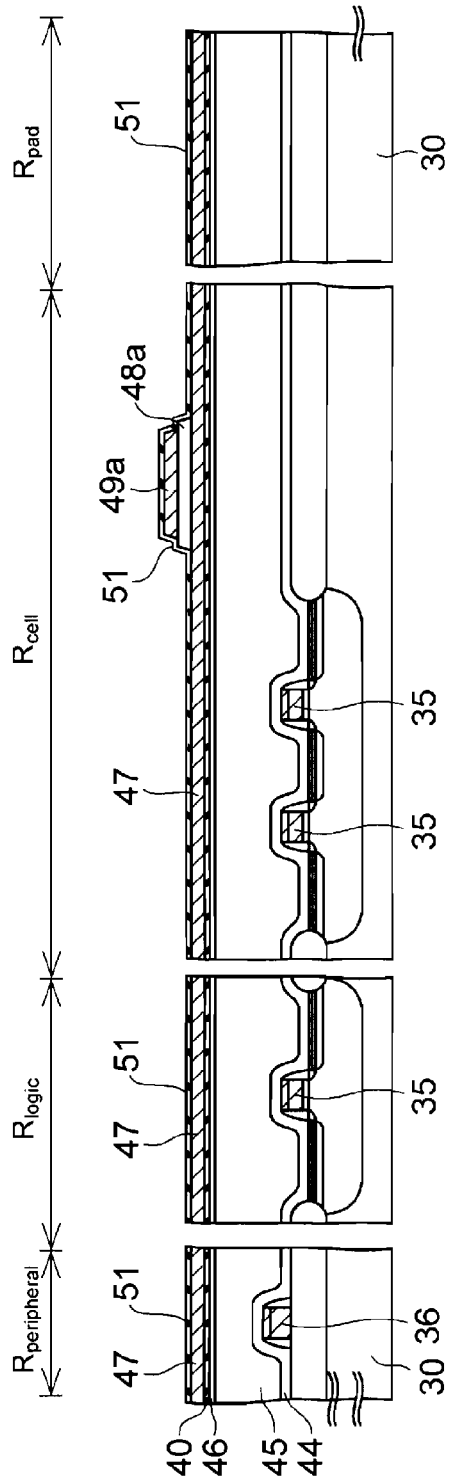

Subsequently, as illustrated in FIG. 2F, an alumina film is formed over the entire upper surface of the silicon substrate 30 by a sputtering method to have a thickness of approximately 50 nm, as a first insulating hydrogen barrier film 51 for protecting the capacitor dielectric film 48a from reducing substances such as hydrogen and moisture.

Here, instead of the alumina film, any one of a titanium oxide ($TiO_x$) film, a zirconium oxide ($ZrO_x$) film, a magnesium oxide ($MgO_x$) film and a titanium magnesium oxide ($MgTiO_x$) film may be formed as the first insulating hydrogen barrier film 51.

Then, to recover damage caused to the capacitor dielectric film 28a by the sputtering, recovery annealing is performed at a substrate temperature of 550° C. in an oxygen-containing atmosphere having an oxygen flow rate of 20 liter/min, for approximately 60 minutes. This recovery annealing is performed in a vertical furnace.

Figure 2G:
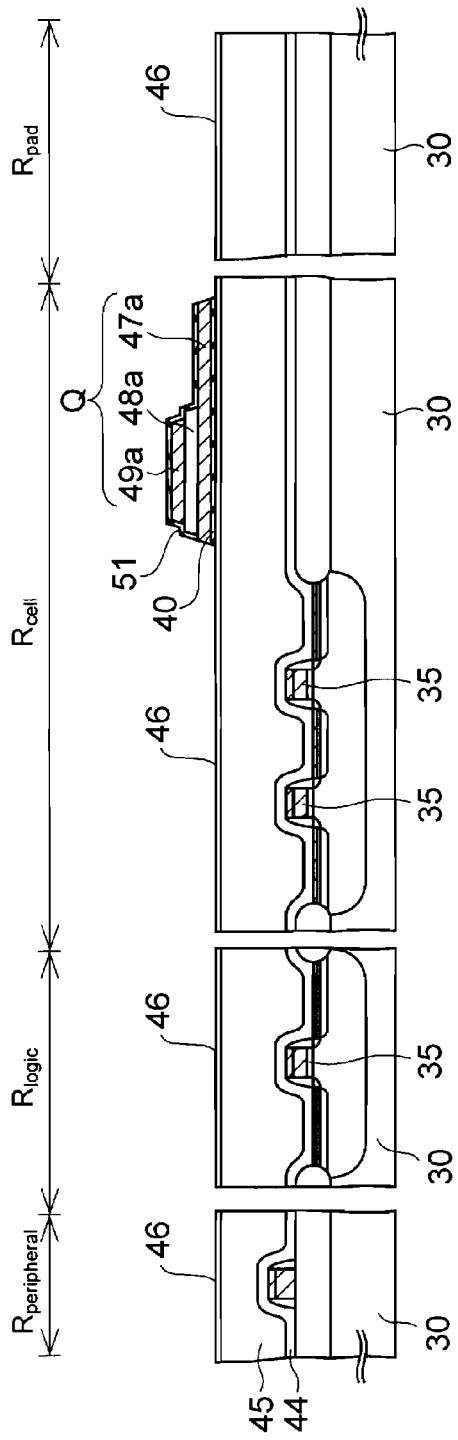

Subsequently, as illustrated in FIG. 2G, the first conductive film 47 and the first insulating hydrogen barrier film 51 are patterned by photolithography. By this patterning, a portion of the first conductive film 47 under the capacitor dielectric film 48a is made into a lower electrode 47a, and the first insulating hydrogen barrier film 51 is left so as to cover the lower electrode 47a.

In this patterning, portions of the alumina film 40 that are not covered by the lower electrode 47a are also removed.

Thereafter, to recover damage caused to the capacitor dielectric film 48a during the process, recovery annealing is performed on the capacitor dielectric film 48a in an oxygen-containing atmosphere having an oxygen flow rate of 20 liter/min under the conditions of a substrate temperature of 650° C. and a process time of 60 minutes. This recovery annealing is performed in a vertical furnace, for example.

Through the above-described steps, a capacitor Q including the lower electrode 47a, the capacitor dielectric film 48a and the upper electrode 49a deposited in this order is formed on the first interlayer insulating film 45. Although multiple capacitors Q are formed in the cell region $R_{cell}$, only a single capacitor Q is illustrated in this embodiment for the sake of simplicity.

Figure 2H:
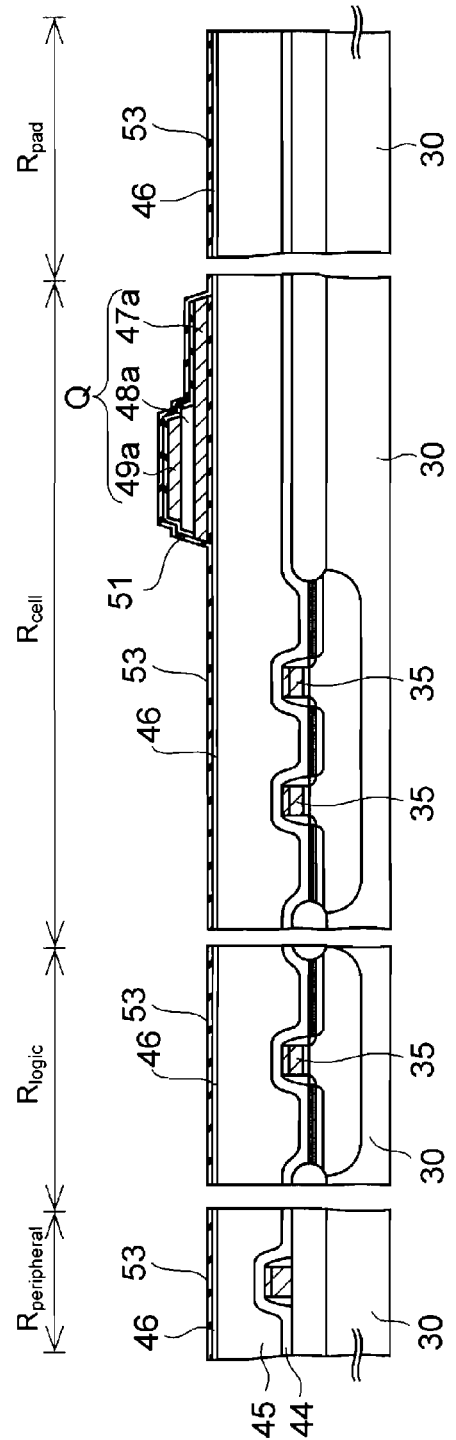

Subsequently, as illustrated in FIG. 2H, an alumina film is formed over the entire upper surface of the silicon substrate 30 by a sputtering method to have a thickness of approximately 20 nm, as a second insulating hydrogen barrier film 53 for protecting the capacitor Q. The second insulating hydrogen barrier film 53 together with the first insulating hydrogen barrier film 51 provided thereunder functions to prevent reducing substances such as hydrogen and moisture from reaching the capacitor dielectric film 48a and to thereby prevent deterioration of the ferroelectric characteristics of the capacitor dielectric film 48a attributable to reduction of the capacitor dielectric film 48a.

Films having such a function include a titanium oxide film, a zirconium oxide film, a magnesium oxide film and a titanium magnesium film in addition to an alumina film, and any one of these films may be formed as the second insulating hydrogen barrier film 53.

Then, recovery annealing is performed on the capacitor dielectric film 48a in an oxygen-containing atmosphere in a vertical furnace under the conditions of a substrate temperature of 550° C. and a process time of 60 minutes. The oxygen flow rate in this recovery annealing is 20 liter/min, for example.

Figure 2I:
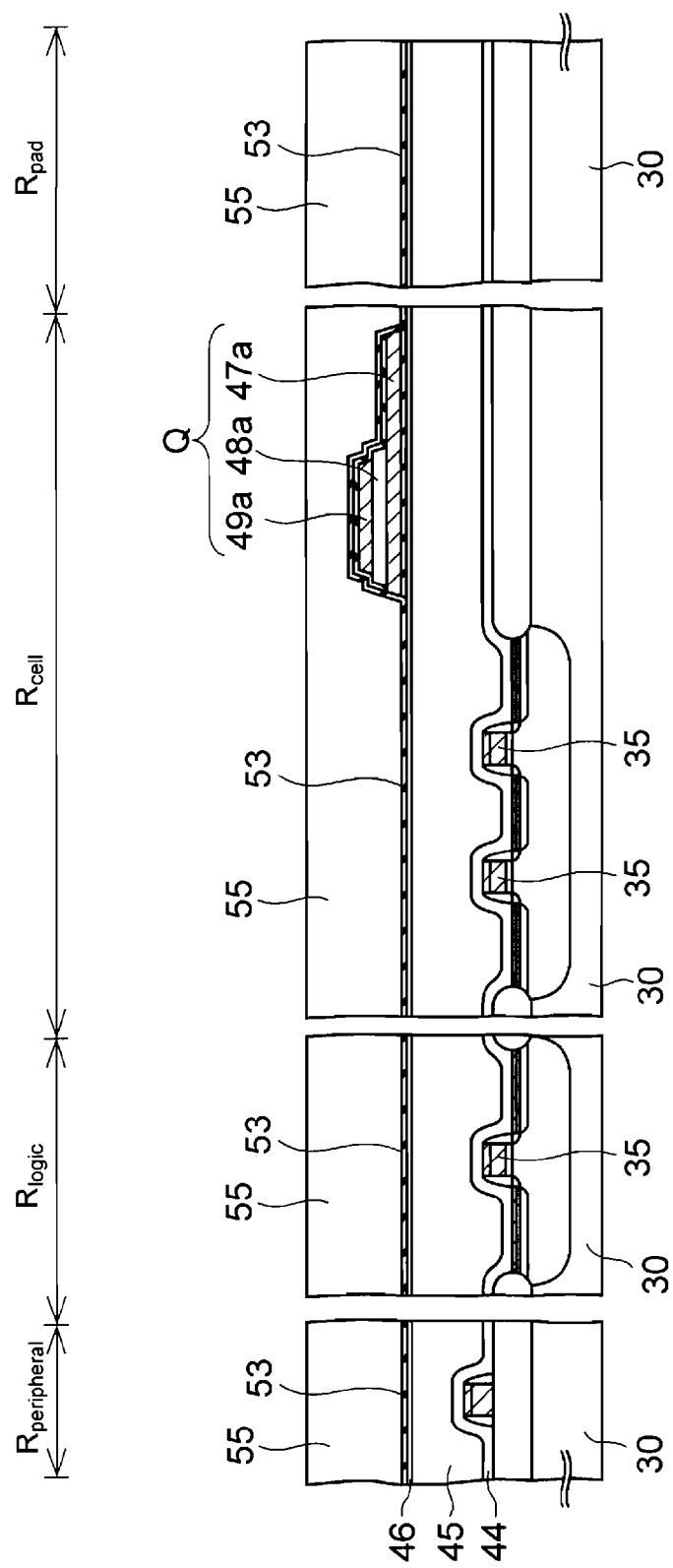

Subsequently, as illustrated in FIG. 2I, a silicon oxide film to serve as a second interlayer insulating film 55 is formed on the second insulating hydrogen barrier film 53 by a plasma CVD method using TEOS gas, to have a thickness of approximately 1500 nm.

Thereafter, as a dehydration process for the second interlayer insulating film 55, a $N_2O$ plasma process using a CVD apparatus is performed. For this process, the substrate temperature is set at 350° C., and the process time is set at two minutes.

This $N_2O$ plasma process dehydrates the second interlayer insulating film 55 and prevents moisture resorption of the second interlayer insulating film 55 by nitriding an upper surface of the second interlayer insulating film 55.

Figure 2J:
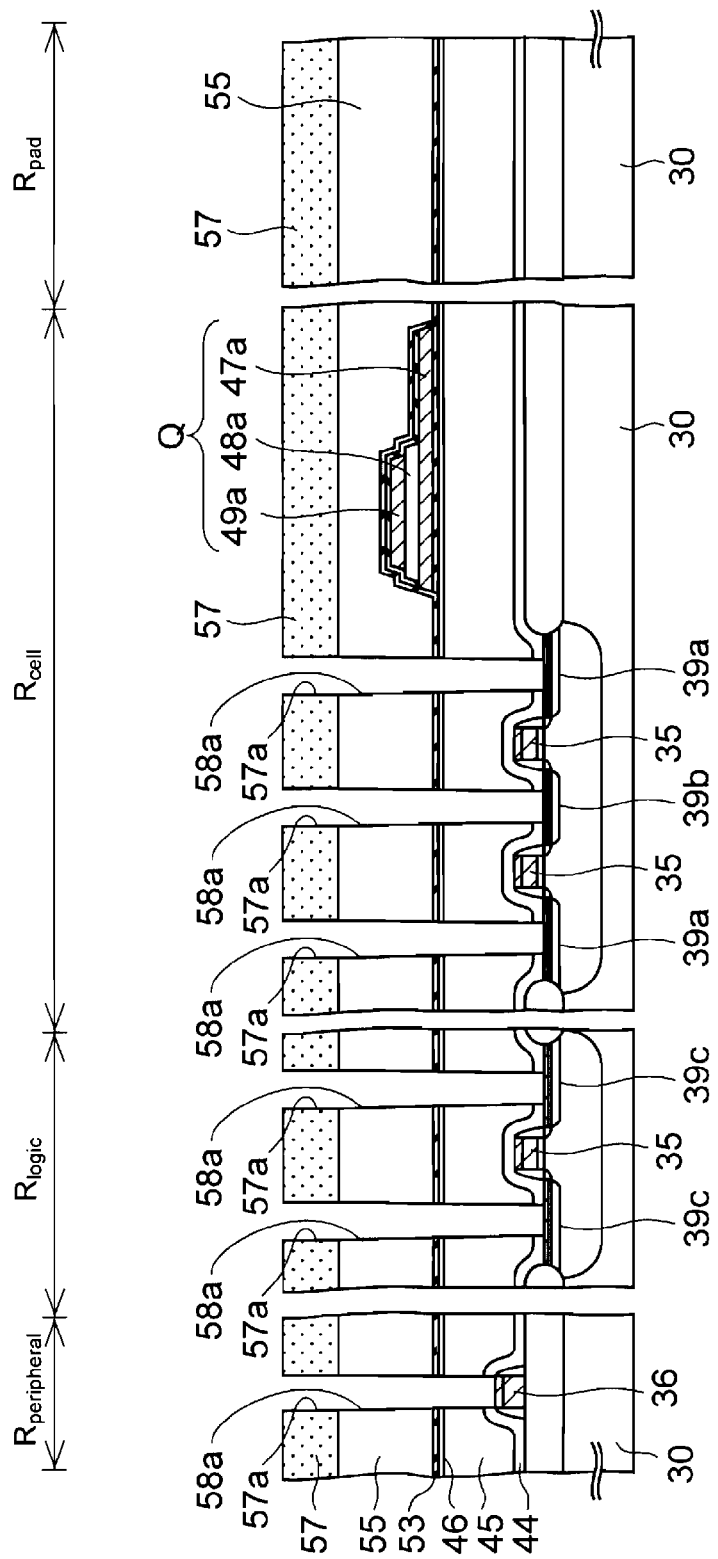

Next, description is given of steps for obtaining a cross-sectional structure illustrated in FIG. 2J.

First, a photoresist is applied onto the second interlayer insulating film 55, and is then exposed and developed. Thereby, a first resist pattern 57 including hole-shaped first windows 57a is formed.

Then, the insulating films from the second interlayer insulating film 55 to the base insulating film 44 are dry-etched by using the first resist pattern 57 as a mask. Thereby, a first hole 58a is formed in these films under each of the first windows.

This dry etching is performed in a parallel-plate type plasma etching apparatus (not illustrated). As an etching gas used for the first and second interlayer insulating films 45 and 55 and the first cap insulating film 46, which are made of silicon oxide, a gas mixture of $C_4F_8$, $O_2$, Ar is used. In some cases, CO gas may be added to the etching gas. Additionally, the second insulating hydrogen barrier film 53, made of alumina, is also etched by the sputtering action of this etching gas.

In contrast, as an etching gas for the base insulating film 44 made of silicon oxy-nitride, a gas mixture of $CHF_3$, $O_2$, and Ar is used.

When this etching is completed, the first resist pattern 57 is removed.

Figure 2K:
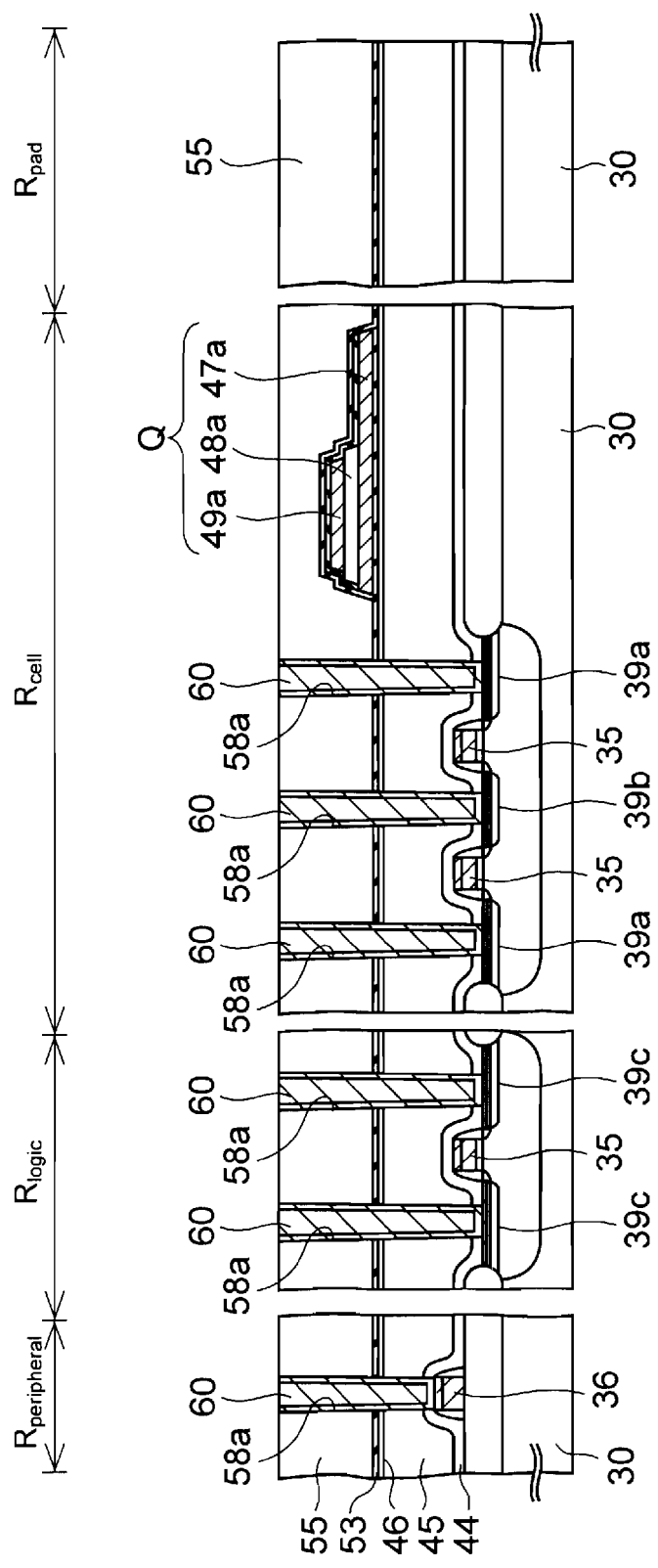

Next, description is given of steps for obtaining a cross-sectional structure illustrated in FIG. 2K.

First, a titanium (Ti) film and a titanium nitride (TiN) film to serve as a glue film are formed on an inner surface of each of the first holes 58a and the upper surface of the second interlayer insulating film 55 by a sputtering method to have a thickness of 20 nm and a thickness of 50 nm, respectively. Then, a tungsten film is formed on the glue film by a CVD method using tungsten hexafluoride gas, to have a thickness of 500 nm. Thereby, the first holes 58a are completely filled with the tungsten film.

Thereafter, excess glue film and the tungsten film on the second interlayer insulating film 55 is removed by polishing by a CMP method, and the glue film and the tungsten film are left in the first holes 58a as first conductive plugs 60.

Among the conductive plugs 60, those formed in the cell region $R_{cell}$ are each electrically connected to the corresponding one of the first and second source/drain regions 39a and 39b. On the other hand, the first conductive plugs 60 formed in the logic circuit region $R_{logic}$ are each electrically connected to the corresponding one of the third source/drain regions 39c. Then, the first conductive plug 60 formed in the peripheral circuit region $R_{peripheral}$ is electrically connected to the wiring 36.

An $N_2O$ plasma process using a CVD apparatus may be performed on the second interlayer insulating film 55 after the formation of the first conductive plugs 60, for dehydration and prevention of moisture resorption of the second interlayer insulating film 55. The dehydration process is performed under the conditions of a substrate temperature of 350° C. and a process time of two minutes, for example.

The first conductive plugs 60 are mainly made of tungsten, which is extremely easily oxidized. Accordingly, the first conductive plugs 60 may easily be oxidized in an oxygen-containing atmosphere and cause contact failure.

Figure 2L:
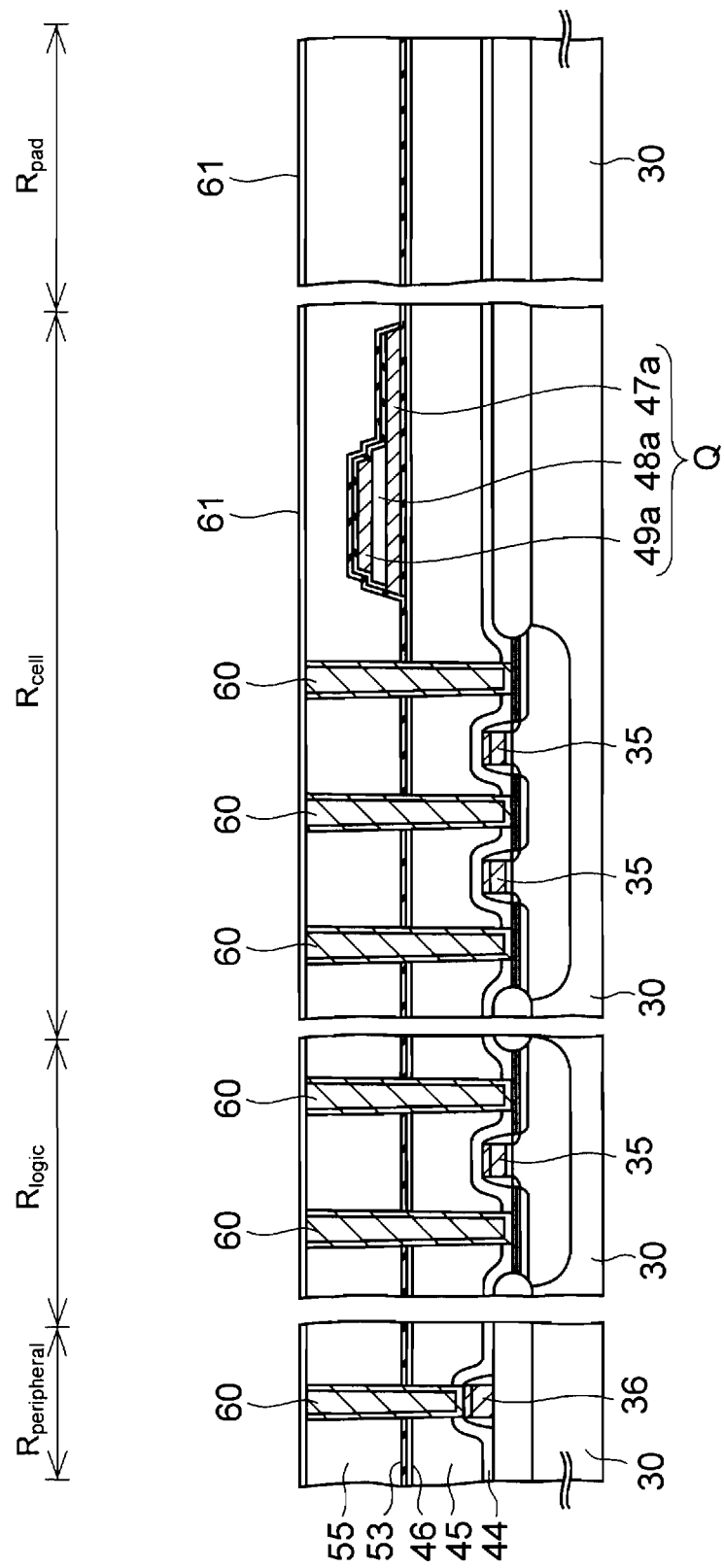

To deal with this problem, in the next step, as illustrated in FIG. 2L, a silicon oxy-nitride film to serve as an oxidation-prevention insulating film 61 is formed on upper surfaces of the conductive plugs 60 and the second interlayer insulating film 55 by a CVD method to have a thickness of approximately 100 nm, in order to prevent the first conductive plugs 60 from being oxidized.

Figure 2M:
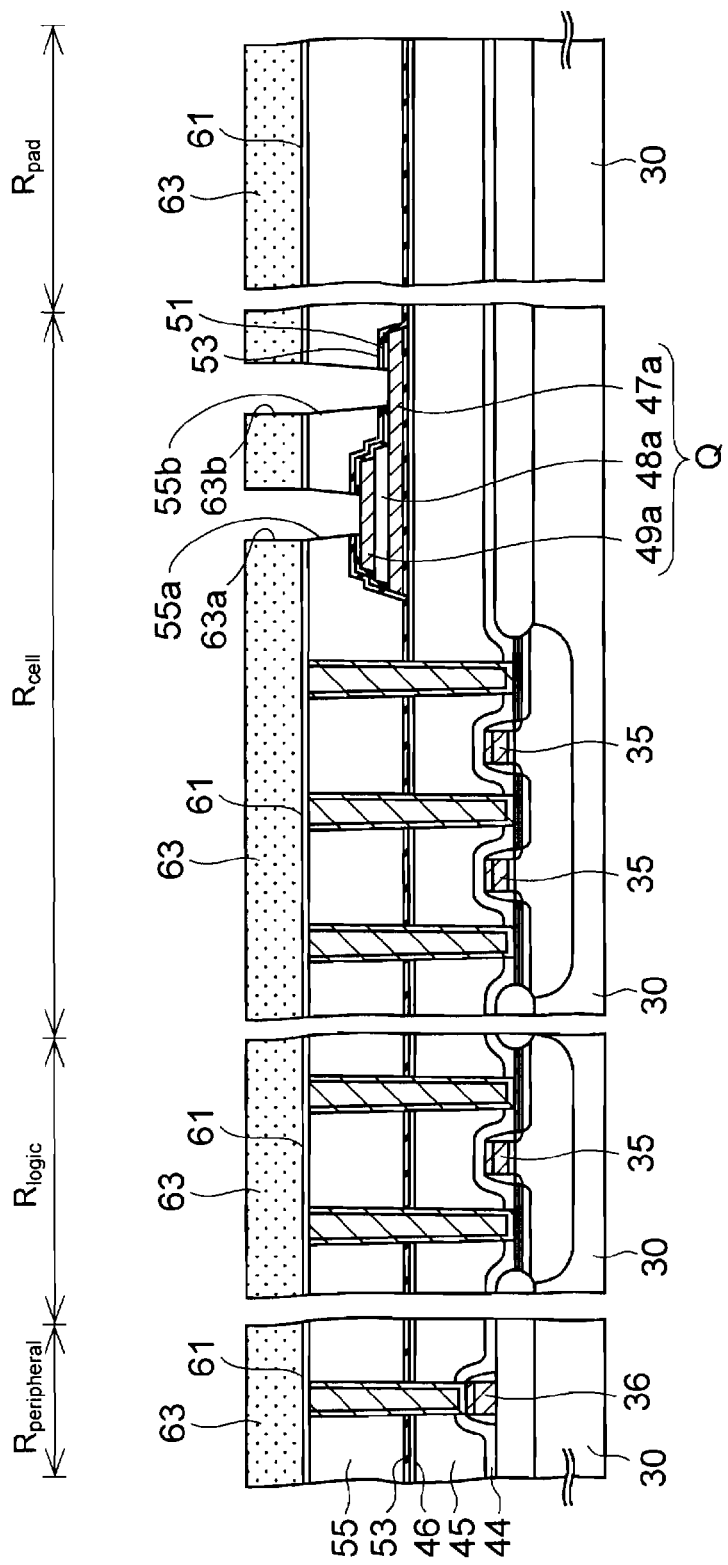

Next, description is given of steps for obtaining a cross-sectional structure illustrated in FIG. 2M.

First, a photoresist is applied onto the oxidation-prevention insulating film 61, and is then exposed and developed. Thereby, a second resist pattern 63 is formed. As illustrated in FIG. 2M, hole-shaped second and third windows 63a and 63b are formed respectively at portions, over the upper electrode 49a and the lower electrode 47a, of the second resist pattern 63.

Thereafter, a second hole 55a and a third hole 55b are formed respectively over the upper electrode 49a and a contact region of the lower electrode 47a, by etching the oxidation-prevention insulating film 61, the second interlayer insulating film 55 and the first and second insulating hydrogen barrier films 51 and 53 by using the second resist pattern 63 as a mask.

After the second resist pattern 63 is removed, the silicon substrate 30 is put into a vertical furnace having an oxygen-containing atmosphere, and recovery annealing is performed on the capacitor dielectric film 48 under the conditions of a substrate temperature of 500° C. and a process time of 60 minutes to recover damage caused to the capacitor dielectric film 48a in the above-described steps. For this annealing, the oxygen flow rate is set at 20 liter/min, for example.

Subsequently, the oxidation-prevention insulating film 61 is removed by etch back.

Figure 2N:
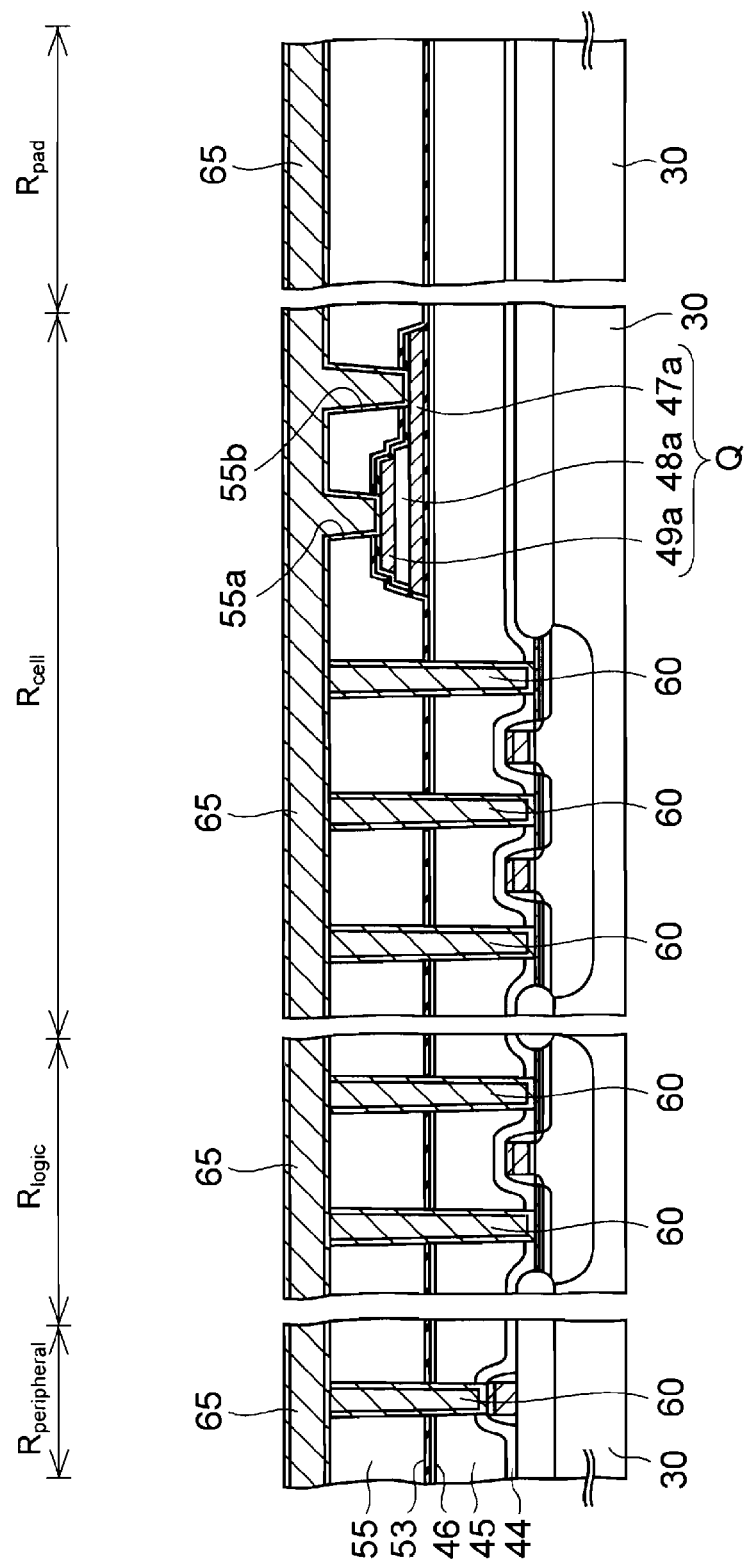
Figure 20:
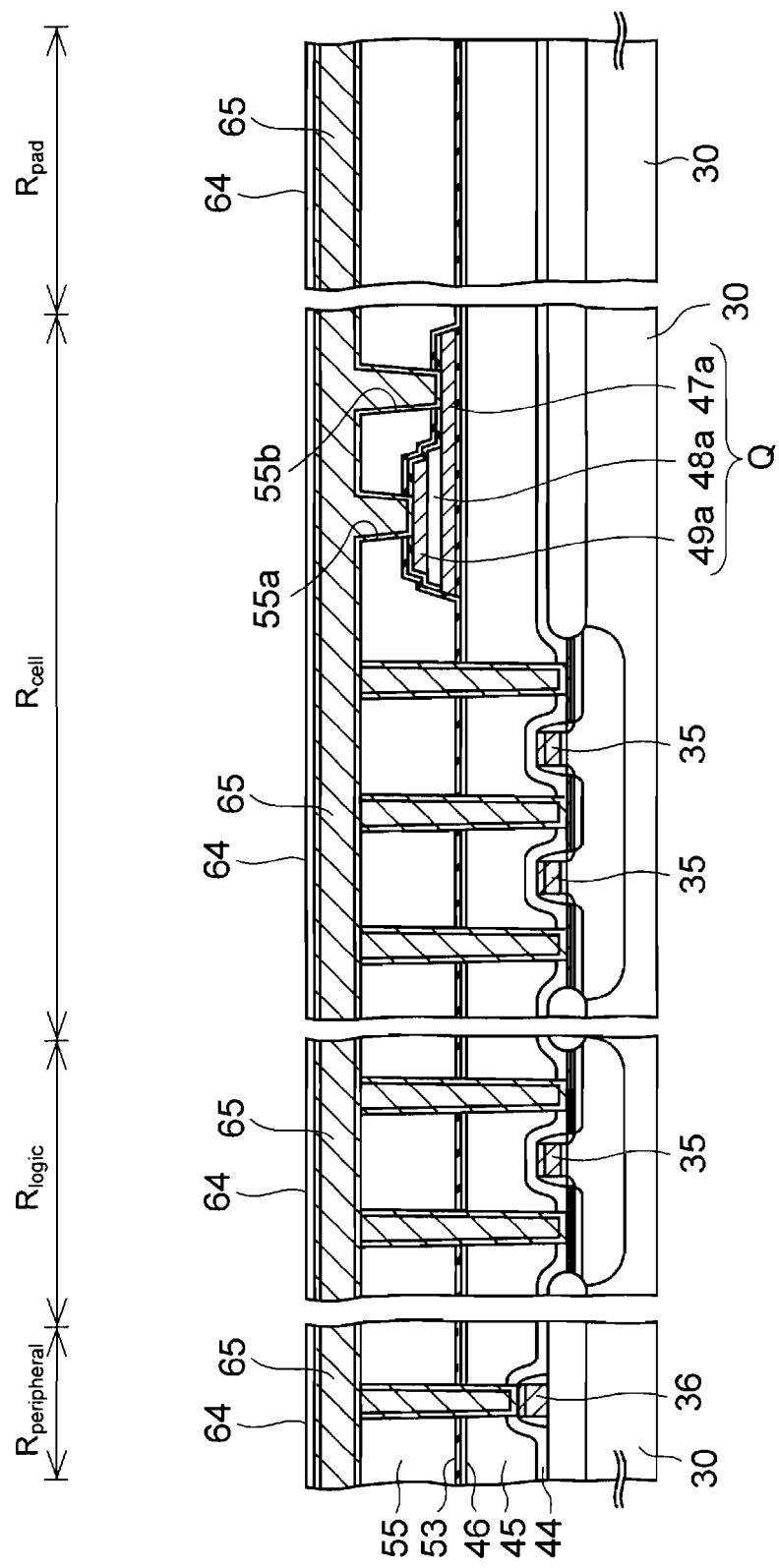

Next, as illustrated in FIG. 2N, a metal laminated film (conductive film) 65 is formed on upper surfaces of the second interlayer insulating film 55 and the first conductive plugs 60 and inner surfaces of the second and third holes 55a and 55b by a sputtering method. In this embodiment, as the metal laminated film 65, a titanium nitride film having a thickness of approximately 150 nm, a copper-containing aluminum film having a thickness of approximately 550 nm, a titanium film having a thickness of approximately 5 nm and a titanium nitride film having a thickness of approximately 150 nm are formed in this order.

The metal laminated film 65 immediately after deposition adsorbs little impurities such as moisture and hydrocarbon on its surface. For this reason, a film can be formed on the metal laminated film 65 immediately after the formation of the metal laminated film 65 without performing, on the metal laminated film 65, annealing such as that performed after removal of a resist to vapor such impurities. By skipping such annealing, deterioration of the capacitor dielectric film 48a due to heat can be prevented.

Next, as illustrated in FIG. 2O, an alumina film to serve as a protection film 64 is formed by a sputtering method to have a thickness of approximately 20 nm.

The protection film 64 functions as a plasma protection film which prevents the metal laminated film 65 from being directly exposed to a plasma atmosphere used in forming a third interlayer insulating film to be described later, and prevents deterioration of the capacitor Q connected to the metal laminated film 65 by plasma.

Accordingly, it is preferable to employ, as a method of depositing the protection film 64, a method not using a plasma atmosphere as a deposition atmosphere, so as to prevent deterioration of the capacitor Q in depositing the protection film 64.

Although a sputtering method uses a plasma atmosphere as a deposition atmosphere, plasma is attracted to a sputtering target facing a substrate and is not attracted to the substrate. Accordingly, even if the protection film 64 is formed by a sputtering method, little damage is caused to the capacitor Q.

The protection film 64 may alternatively be formed of an insulating metal oxide film other than an alumina film. Examples of such an insulating metal oxide film other than an alumina film include a titanium oxide film, a zirconium oxide film, a magnesium oxide film, and a titanium magnesium oxide film. These insulating metal oxide films also function as a hydrogen diffusion prevention film for preventing hydrogen contained in an external atmosphere from reaching the capacitor dielectric film 48a.

Moreover, as described above, since impurities such as moisture and hydrocarbon is not adhered to the surface of the metal laminated film 65 before the protection film 64 is formed, it is possible to prevent the peel off of the protection film 64 from the metal laminated film 65 attributable to the impurities, and to obtain excellent adhesiveness between the films.

Figure 2P:
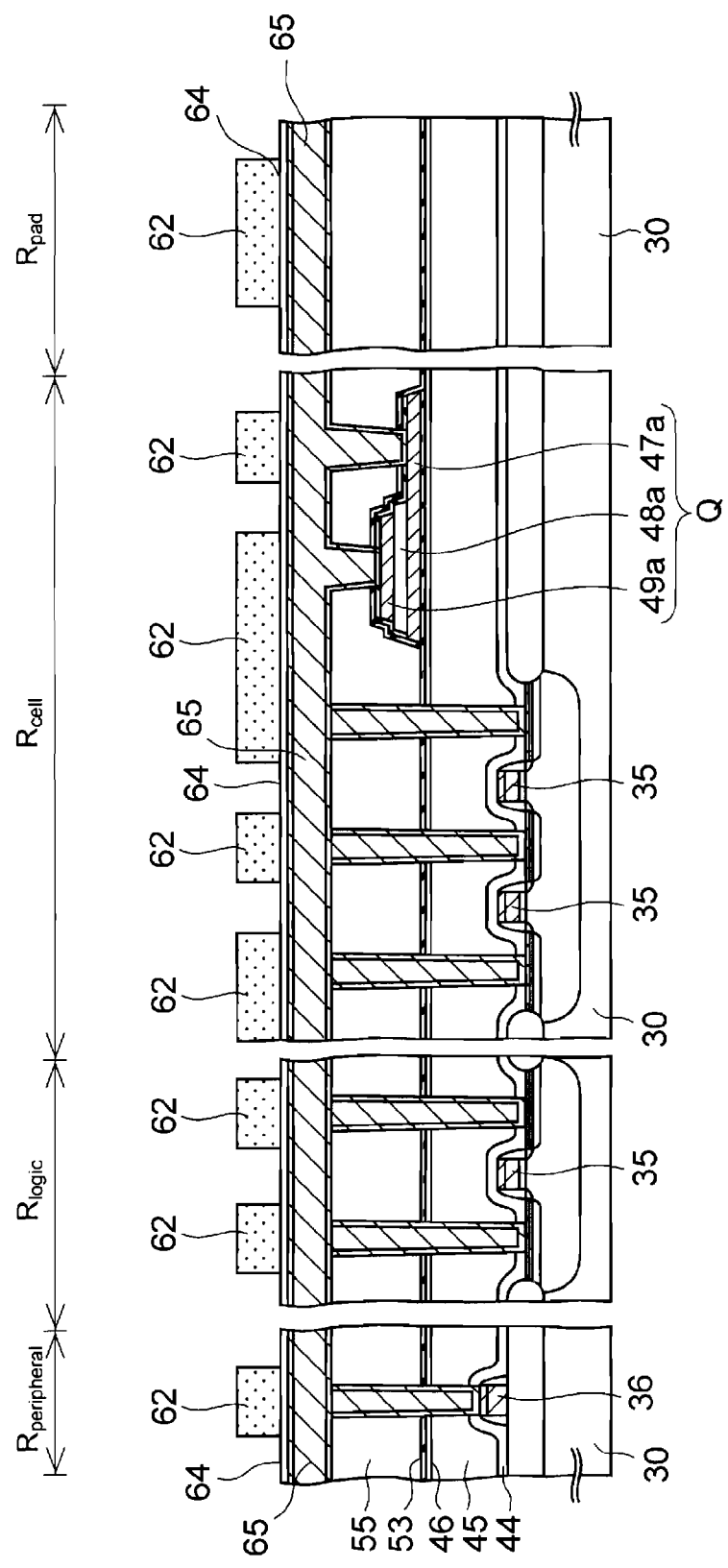

Subsequently, as illustrated in FIG. 2P, a photoresist is applied onto the protection film 64, and is then exposed and developed. Thereby, a third resist pattern 62 is formed.

Figure 2Q:
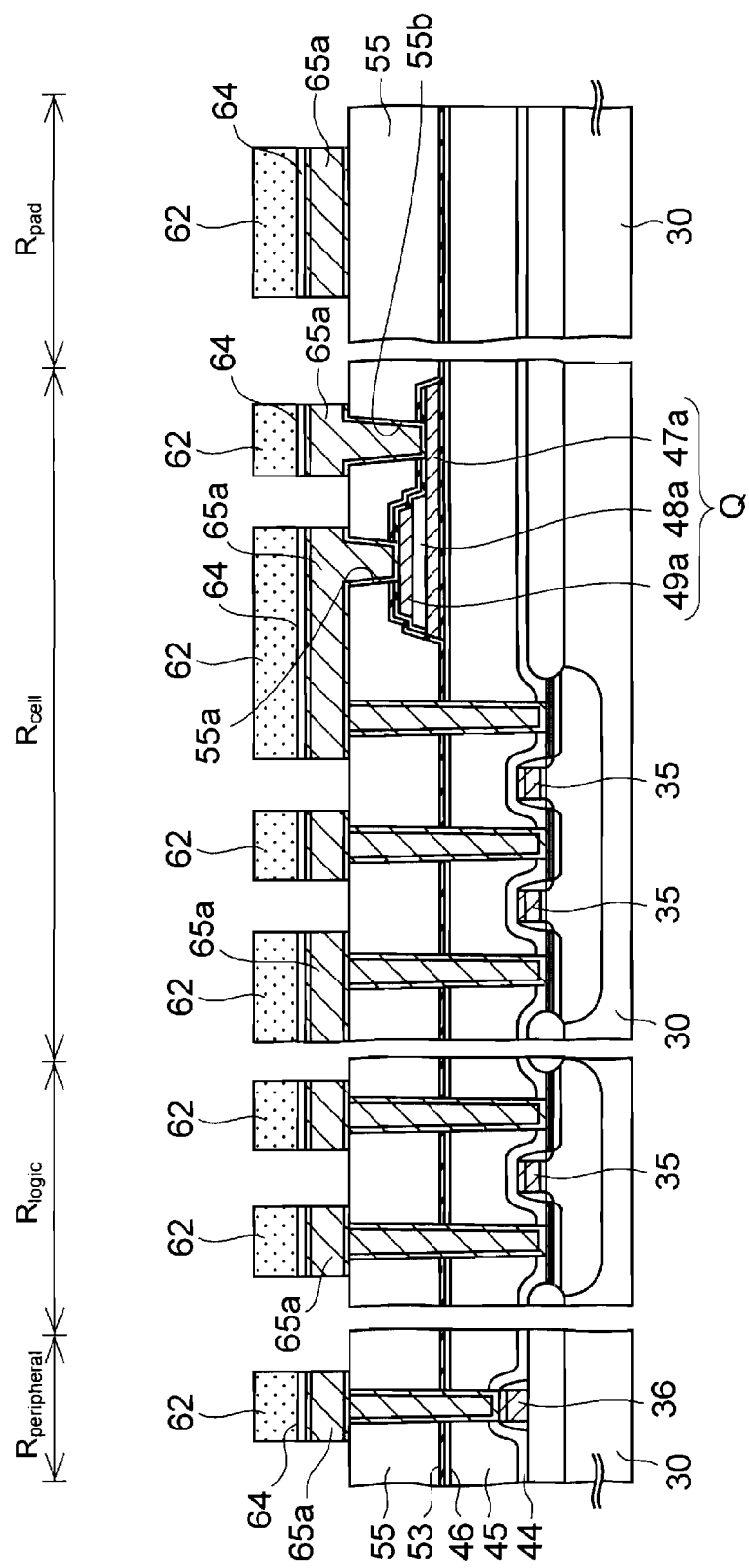

Then, as illustrated in FIG. 2Q, the protection film 64 and the metal laminated film 65 are dry-etched by using the third resist pattern 62 as a mask. Thereby, the metal laminated film 65 is made into first metal wirings 65a.

The dry etching for the protection film 64 is performed in a parallel-plate type etching apparatus by using a gas mixture of $C_4F_8$, Ar, and $O_2$ as an etching gas. In this case, the flow rates of $C_4F_8$ gas, Ar gas and $O_2$ gas are set at 20 sccm, 500 sccm and 12 sccm, respectively, for example. Additionally, $CF_4$, $CHF_3$ or CO may be added to these gases.

In contrast, the dry etching for the metal laminated film 65 is performed by using a gas mixture of $BCl_3$ and $Cl_2$ as an etching gas. The flow rates of $BCl_3$ gas and $Cl_2$ gas are set at 105 sccm and 45 sccm, respectively, for example.

The second interlayer insulating film 55 made of silicon oxide is hardly etched by the etching gas, and therefore functions as a stopper of the etching.

Here, among the first metal wirings 65a, those formed on the capacitor Q are electrically connected to the upper electrode 49a and the lower electrode 47a through the first and second holes 55a and 55b, respectively.

Thereafter, the third resist pattern 62 is removed by ashing.

Here, after the ashing, a residue of the third resist pattern 62 may be removed by a wet process using chemicals and pure water.

Even if the wet process is performed, a decrease in adhesiveness between the protection film 64 and the first metal wirings 65a due to water or hydrocarbon generated by the wet process does not occur, since the protection film 64 is already formed on the first metal wrings 65a.

Accordingly, it is not necessary to perform, on the first metal wirings 65a, annealing to improve adhesiveness with the protection film 64 by vaporizing water and hydrocarbon. By skipping such annealing, deterioration of the capacitor dielectric film 48a due to heat during the annealing can be prevented in this embodiment.

Figure 2R:
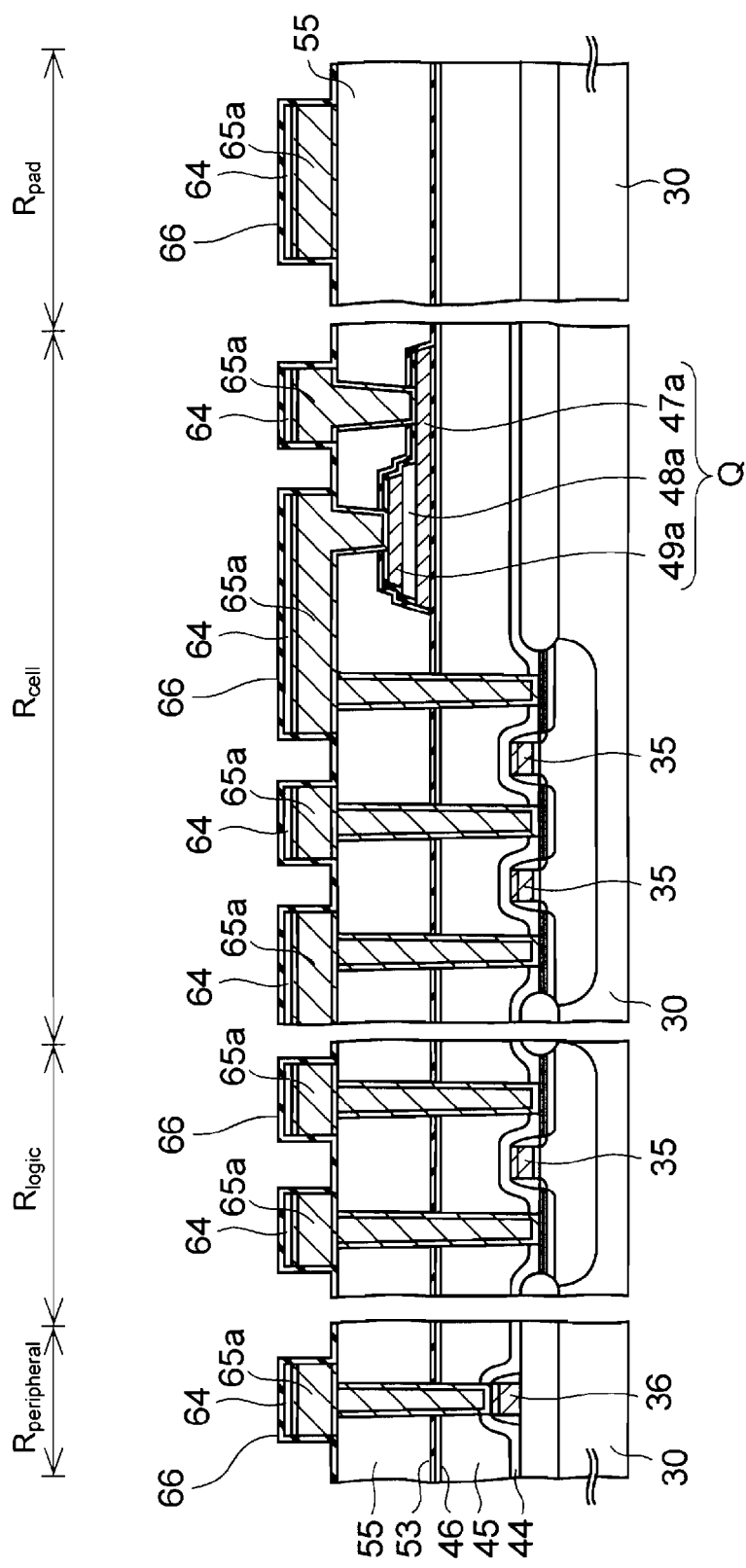

Then, as illustrated in FIG. 2R, an alumina film to serve as a third insulating hydrogen barrier film 66 for covering the first metal wirings 65a and the second interlayer insulating film 55 is formed by a sputtering method to have a thickness between 5 nm and 30 nm, e.g., 20 nm.

The third insulating hydrogen barrier film 66 has a function of blocking reducing substances such as hydrogen and moisture and thereby protecting the capacitor dielectric film 48a. Examples of a film having such a function other than an alumina film include a titanium oxide film, a zirconium oxide film, a magnesium oxide film and a titanium magnesium film, and any one of the films may be formed as the third insulating hydrogen barrier film 66.

To maintain sufficient barrier properties against reducing substances, it is preferable to form the third insulating hydrogen barrier film 66 having a thickness of 5 nm or thicker.

Alternatively, a silicon-containing insulating film containing nitrogen such as a silicon nitride (SiN) film or a silicon oxy-nitride (SiON) film may be formed as the third insulating hydrogen barrier film 66. Although falling behind an insulating metal oxide film, such silicon-containing insulating films have practically sufficient barrier properties against hydrogen.

Among these silicon-containing insulating films, the silicon nitride film has more excellent barrier properties against hydrogen than the silicon oxy-nitride film, and is hence preferable as the third insulating hydrogen barrier film 66.

If deterioration of the capacitor dielectric film 48a due to hydrogen is not an issue, the third insulating hydrogen barrier film 66 may be omitted.

Figure 2S:
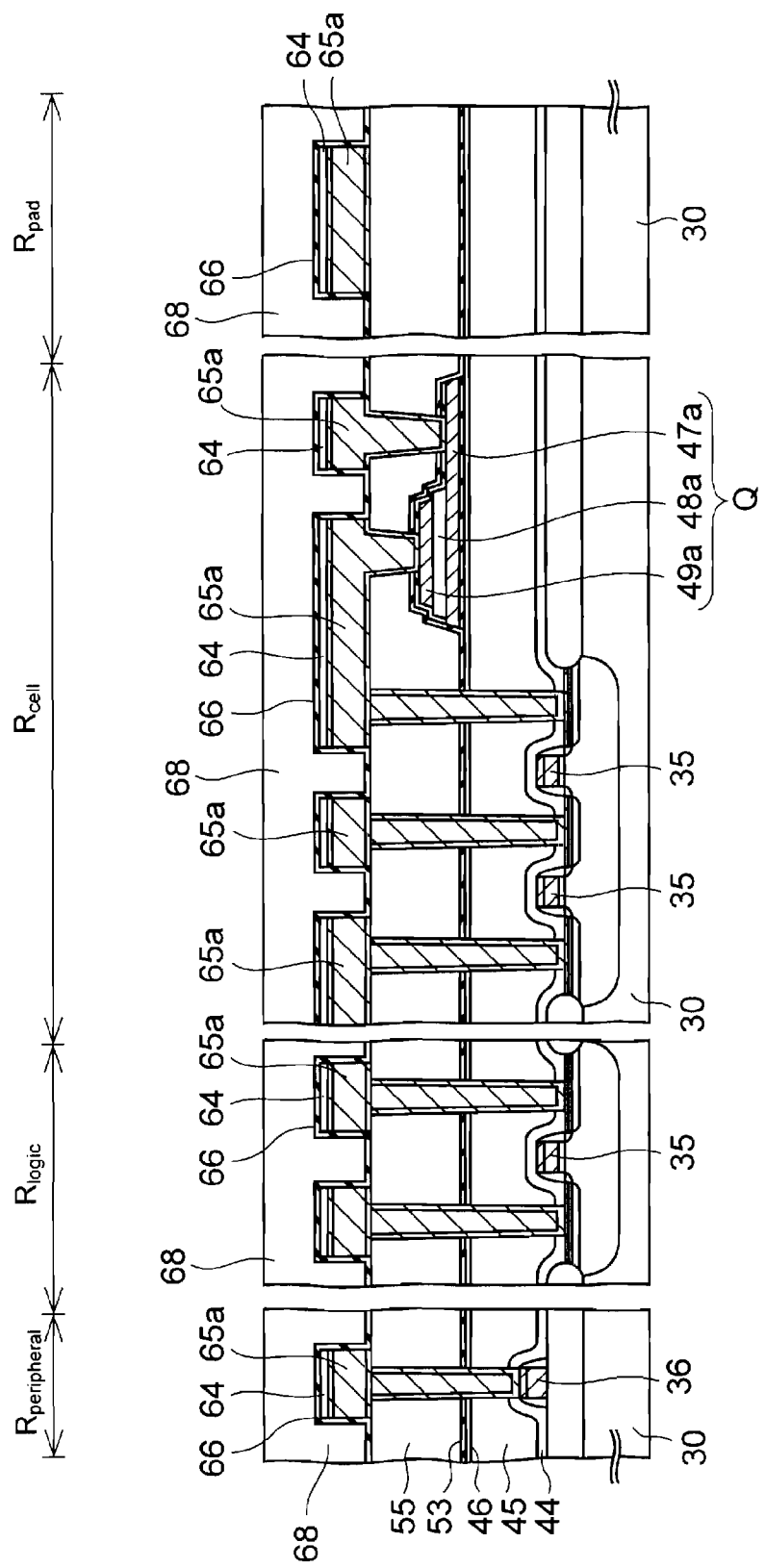

Next, description is given of steps for obtaining a cross-sectional structure illustrated in FIG. 2S.

Figure 5:
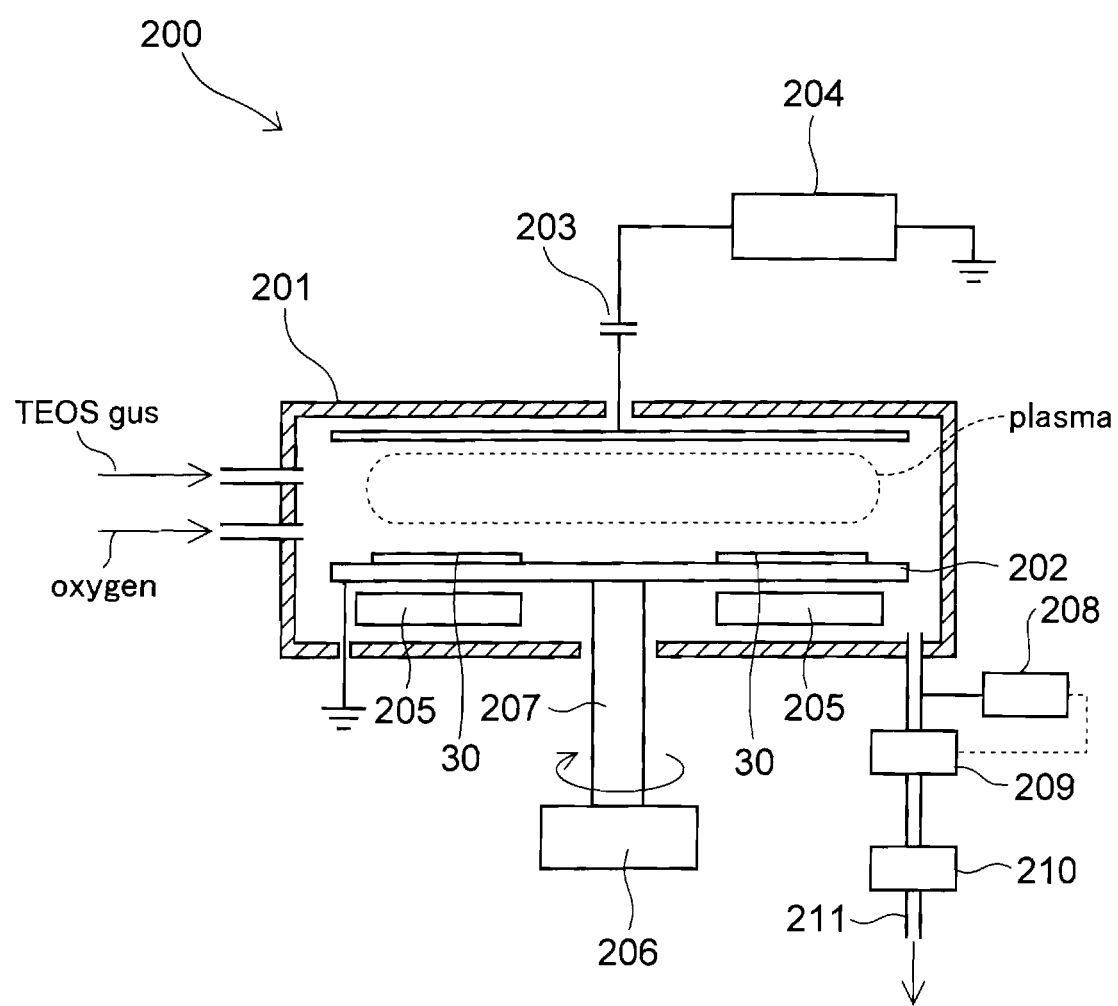
FIG. 5 is a configuration diagram of a plasma chemical vapor deposition (CVD) apparatus employed in the first embodiment and a second embodiment.

FIG. 5 is a configuration diagram of a plasma CVD apparatus employed in the step.

A plasma CVD apparatus 200 includes a chamber 201, in which a wafer stage 202 for holding multiple silicon substrates 30 is provided. Under the wafer stage 202, a heater 205 is provided for heating the silicon substrates 30 which is subjected to film deposition. The silicon substrate is heated by this heater 205 to a predetermined temperature. The wafer stage 202 is mechanically connected to a motor 206 via a rotation shaft 207, and is capable of rotating at a predetermined rotation speed in film deposition.

Moreover, a low-frequency power supply 204 is electrically connected to the chamber 201 via a blocking capacitor 203, so that a low-frequency power can be applied to a deposition atmosphere.

At a bottom portion of the chamber 201, an exhaust pipe 211 is provided. The exhaust pipe 211 is connected to an exhaust pump 210 via a butterfly valve 209. A manometer 208 is provided to the exhaust pipe 211. The opening degree of the butterfly valve 209 is adjusted based on an output signal from the manometer 208, to keep the inside of the chamber 201 at a predetermined pressure.

A plasma CVD can use a lower deposition temperature than a low-pressure CVD method and the like, and hence has an advantage that the capacitor dielectric film 48a is less likely to be deteriorated by heat.

In this embodiment, a silicon oxide film to serve as a third interlayer insulating film 68 is formed on the third insulating hydrogen barrier film 66 by a plasma CVD method by supplying a gas mixture of TEOS gas and oxygen gas to the chamber 201 as a reaction gas. The film thickness of the third interlayer insulating film 68 is approximately 2600 nm on the first metal wirings 65a, for example.

Deposition condition of the third interlayer insulating film 68 is not particularly limited. In this embodiment, the frequency of the low-frequency power to be applied to the chamber 201 by the low-frequency power supply 204 is set at 250 Hz and the power is set at 600 W. Here, in addition to the low-frequency power supply 204, an unillustrated high-frequency power supply may apply a high-frequency power to the chamber 201. In this case, the frequency of the high-frequency power is set at 13.56 MHz, and the power is set at 400 W. Moreover, a heating temperature of the silicon substrates 30 by the heater 205 is set to 250° C. to 400° C., e.g., 350° C. The flow rates of oxygen gas and TEOS gas are set at 800 sccm and 1800 sccm, respectively, and the pressure is set at approximately 2.2 Torr.

Even if the third interlayer insulating film 68 is deposited by the plasma CVD method in this manner, the protection film 64 prevents the upper surfaces of the first metal wirings 65a from being directly exposed to the plasma atmosphere used in the deposition. Accordingly, damage caused to the capacitor Q, electrically connected to the first metal wirings 65a, by plasma can be reduced, and deterioration of the capacitor Q during manufacture can be prevented.

Here, the protection film 64 is not formed on side surfaces of the first metal wirings 65a. However, since the plasma damage is mainly caused to the capacitor Q in a direction perpendicular to the upper surface of the silicon substrate 30, the capacitor Q can be protected from the plasma damages only by forming the protection film 64 on the upper surfaces of the first metal wirings 65a as in this embodiment.

Moreover, in this embodiment, the third insulating hydrogen barrier film 66 is formed in advance. This can prevent hydrogen contained in the deposition atmosphere of the third interlayer insulating film 68 from reaching the capacitor dielectric film 48a, and can prevent a deterioration of ferroelectric characteristics of the capacitor dielectric film 48a due to reduction of the capacitor dielectric film 48a by hydrogen.

Moreover, the third insulating hydrogen barrier film 66 is formed on the side surfaces of the first metal wirings 65a. This reduces plasma damage which may be caused to the side surfaces, and further effectively protects the ferroelectric capacitor Q from the plasma atmosphere.

Subsequently, the upper surface of the third interlayer insulating film 68 is polished by a CMP to be planarized, and then an $N_2O$ plasma process is performed on the surface of the third interlayer insulting film 68 in a CVD apparatus under the conditions of a substrate temperature of approximately 350° C. and a process time of approximately four minutes. By such an $N_2O$ plasma process, the third interlayer insulating film 68 is dehydrated, and the surface of the third interlayer insulating film 68 is nitrided. Thereby, silicon oxide, which has a high affinity for water, is prevented from absorbing moisture.

Figure 2T:
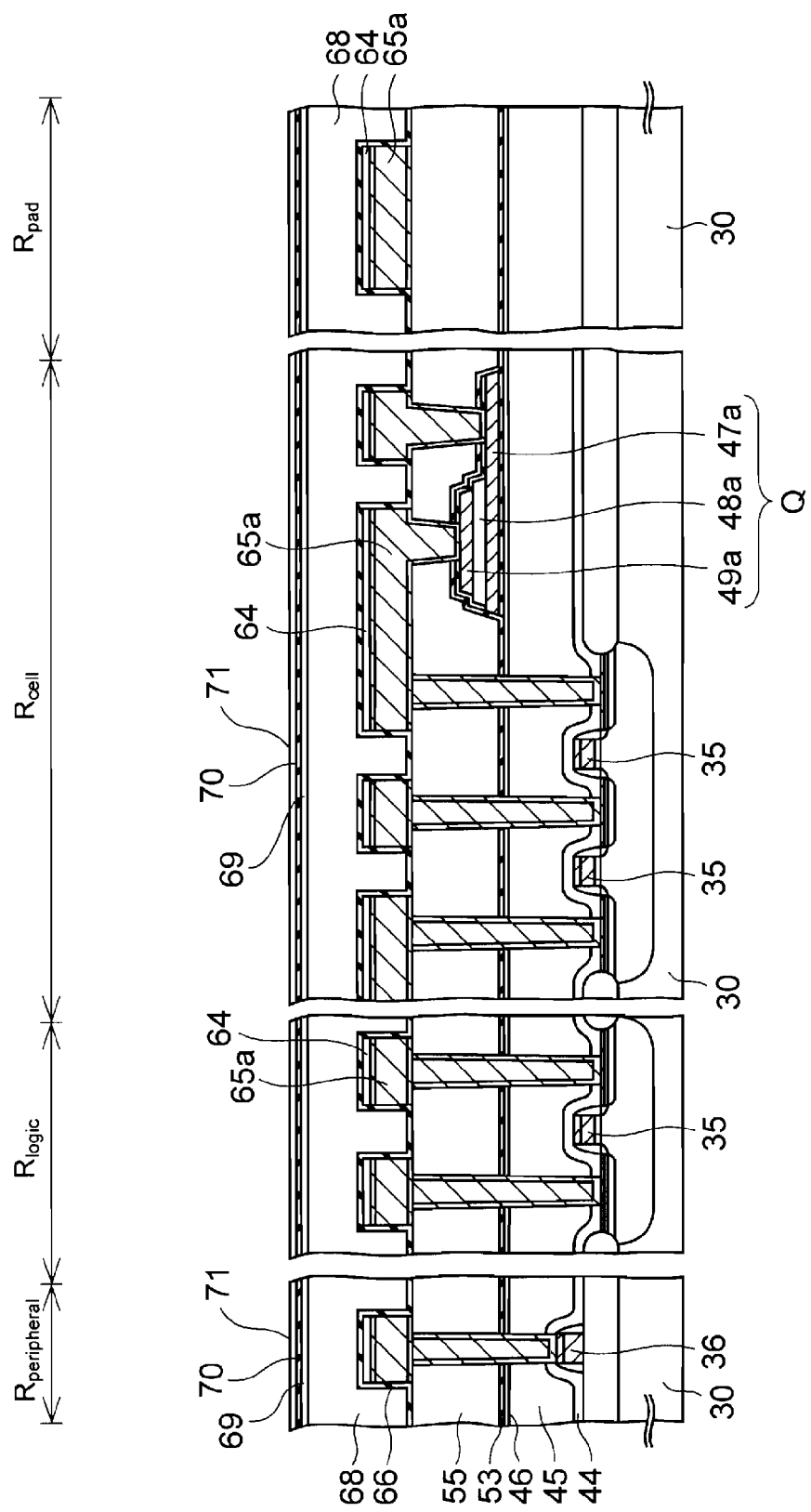

Next, as illustrated in FIG. 2T, a silicon oxide film to serve as a second cap insulating film 69 is formed on the third interlayer insulating film 68 by a plasma CVD method using TEOS gas, to have a thickness of approximately 100 nm.

Micro scratches occurring due to contact with a pad of a CMP apparatus in the CMP are formed in the upper surface of the third interlayer insulating film 68, and the second cap insulating film 69 functions to fill the micro scratches to planarize the upper surface.

Thereafter, an alumina film, having excellent blocking properties against reducing substances such as hydrogen and moisture, to serve as a fourth insulating hydrogen barrier film 70 for protecting the capacitor dielectric film 48*a* from reducing substances is formed on the second cap insulating film 69 to have a thickness of approximately 20 nm.

Moreover, a silicon oxide film to serve as a first cover insulating film 71 is formed on the fourth insulating hydrogen barrier film 70 by a plasma CVD method using TEOS gas, to have a thickness of approximately 100 nm.

An $N_2O$ plasma process may be performed on the first cover insulating film 71 in a CVD apparatus, for dehydration and prevention of moisture resorption of the first cover insulating film 71. The $N_2O$ plasma process is performed under the conditions of a substrate temperature of 350° C. and a process time of two minutes, for example.

Figure 2U:
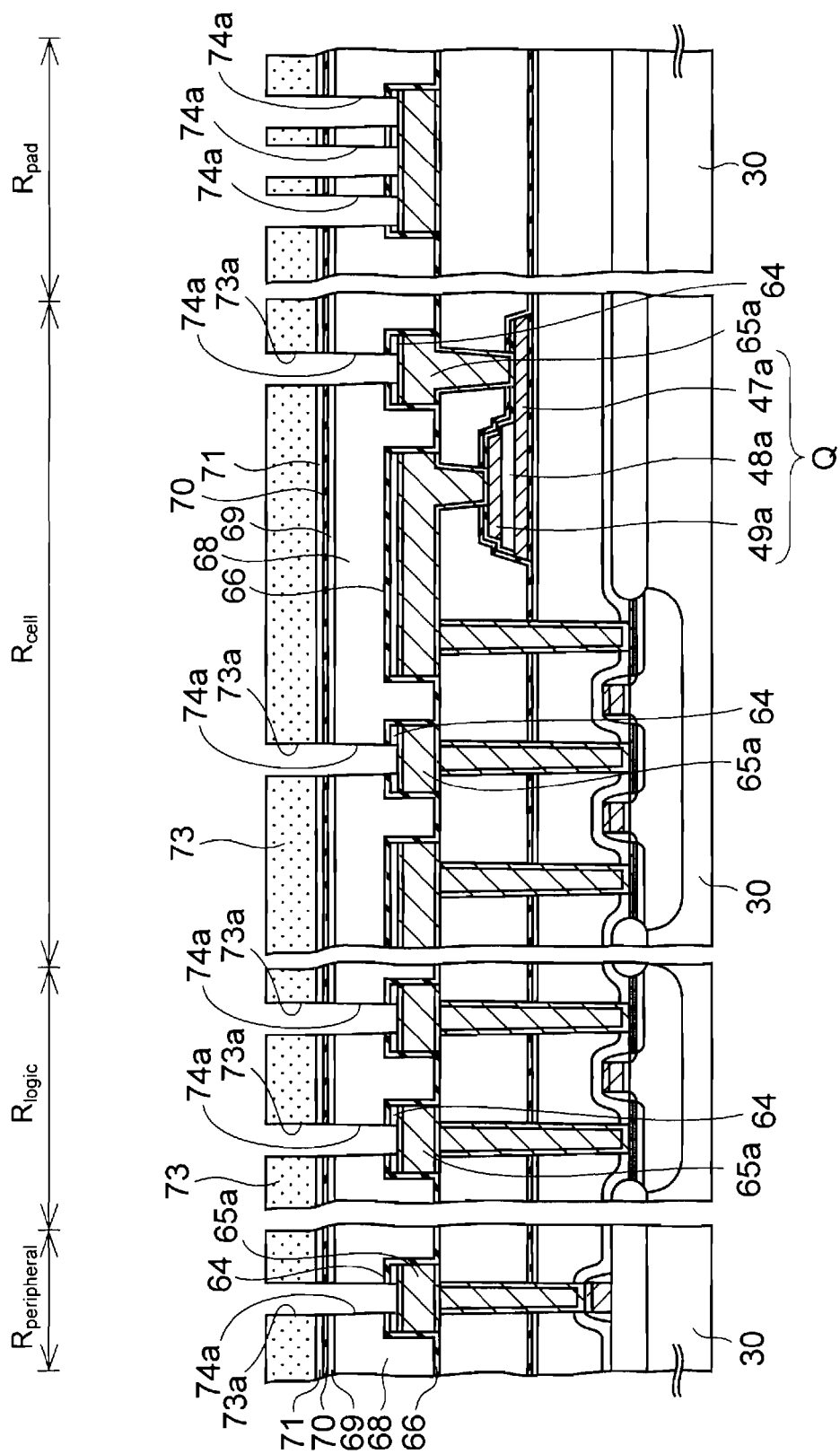

Next, description is given of steps for obtaining a cross-sectional structure illustrated in FIG. 2U.

First, a photoresist is applied onto the first cover insulating film 71, and is then exposed and developed. Thereby, a fourth resist pattern 73 including hole-shaped fourth windows 73*a* over the first metal wirings 65*a* is formed.

Then, insulating films 66 and 68 to 71 under the fourth windows 73*a* are etched by using a parallel-plate type plasma etching chamber (not illustrated) using gas mixture of $C_4F_8$, Ar, and $O_2$ as an etching gas. Thereby, fourth holes 74*a* are formed respectively on the first metal wirings 65*a*.

Here, if the third insulating hydrogen barrier film 66 to be etched is too thick, formation of the fourth holes 74*a* by etching is difficult. To facilitate the etching, the thickness of the third insulating hydrogen barrier film 66 is preferably set to be 30 nm or thinner.

When using the above-described etching gas, the titanium nitride film formed as the uppermost layer of the first metal wirings 65*a* serves as a stopper of the etching. This prevents the fourth holes 74*a* from passing through the titanium nitride film, and thereby prevents the copper-containing aluminum film constituting the first metal wirings 65*a* from being exposed from a bottom surface of the fourth hole 74*a*. Thereby, it is possible to prevent an increase in contact resistance between a conductive plug, to be formed in the fourth holes 74*a* later, and the first metal wiring 65*a* due to aluminum.

Upon completion of the etching, the fourth resist pattern 73 is removed.

Figure 2V:
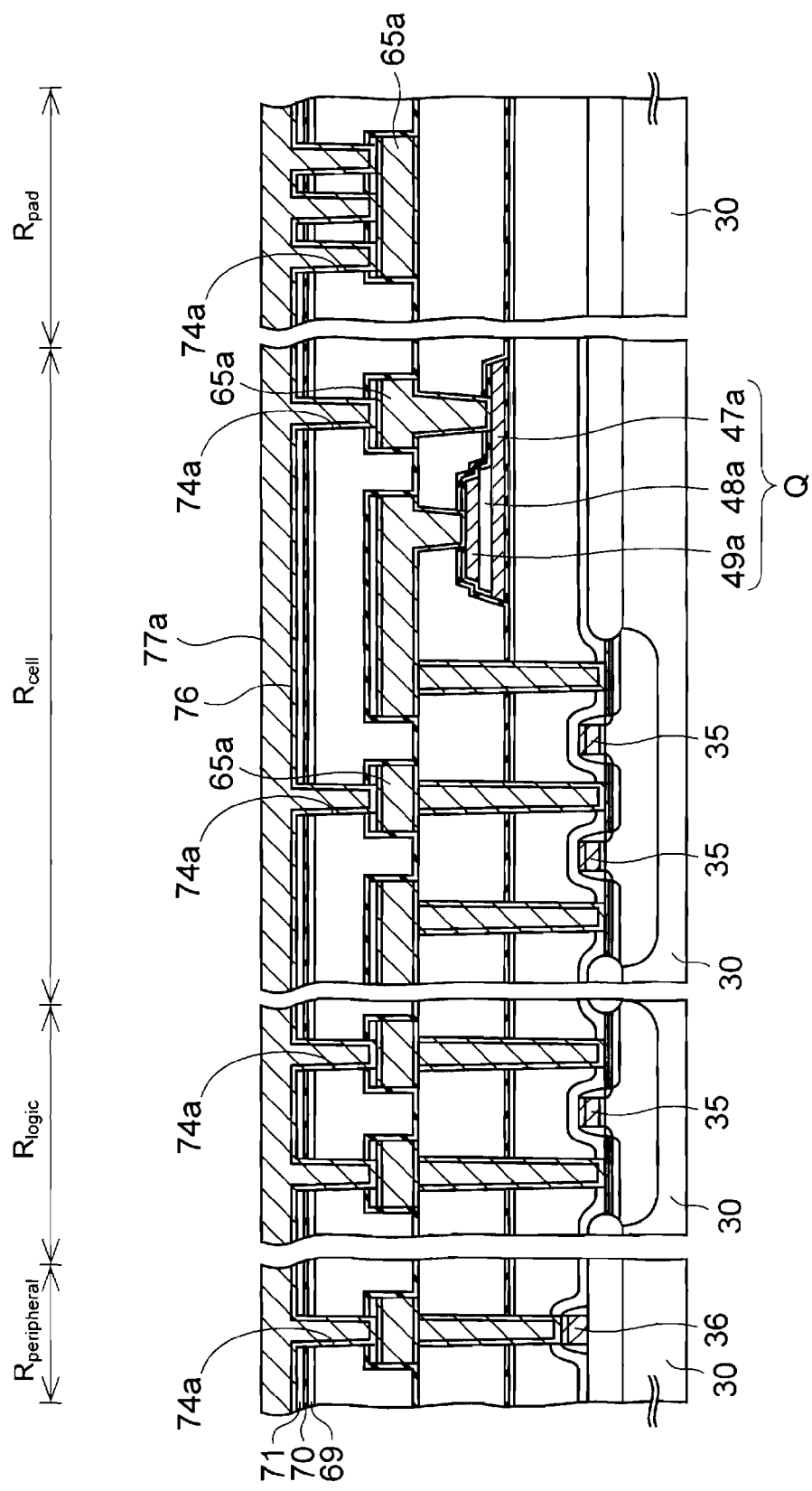

Then, as illustrated in FIG. 2V, a titanium nitride film to serve as a first glue film 76 is formed on an inner surface of each of the fourth holes 74*a* and an upper surface of the first cover insulating film 71 by a sputtering method by maintaining a substrate temperature at approximately 200° C., to have a thickness of approximately 150 nm.

Subsequently, a tungsten film 77*a* is formed on the first glue film 76 by a plasma CVD method using tungsten hexafluoride gas, to have a thickness enough to completely fill the fourth holes 74*a*, e.g., approximately 650 nm.

Figure 2W:
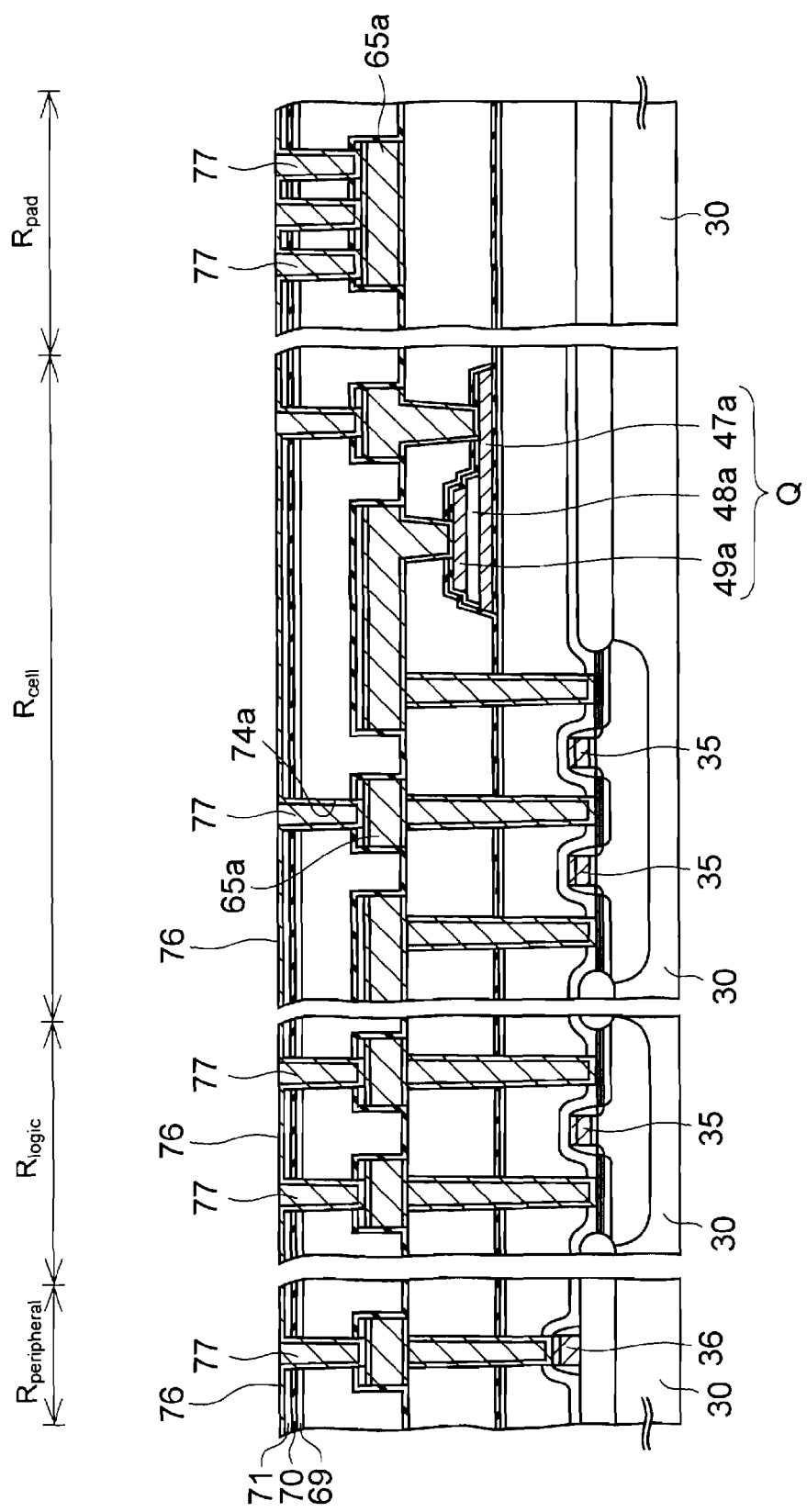

Then, as illustrated in FIG. 2W, the tungsten film 77*a* is etched back to remove the tungsten film 77*a* from the upper surface of the first cover insulating film 71 while leaving the tungsten film 77*a* only in the fourth holes 74*a*. Thereby, a second conductive plug 77 electrically connected to the first metal wiring 65*a* and mainly made of tungsten is formed in each of the fourth holes 74*a*.

Here, although the tungsten film is etched back in this example, CMP may be employed instead of etch back.

Figure 2X:
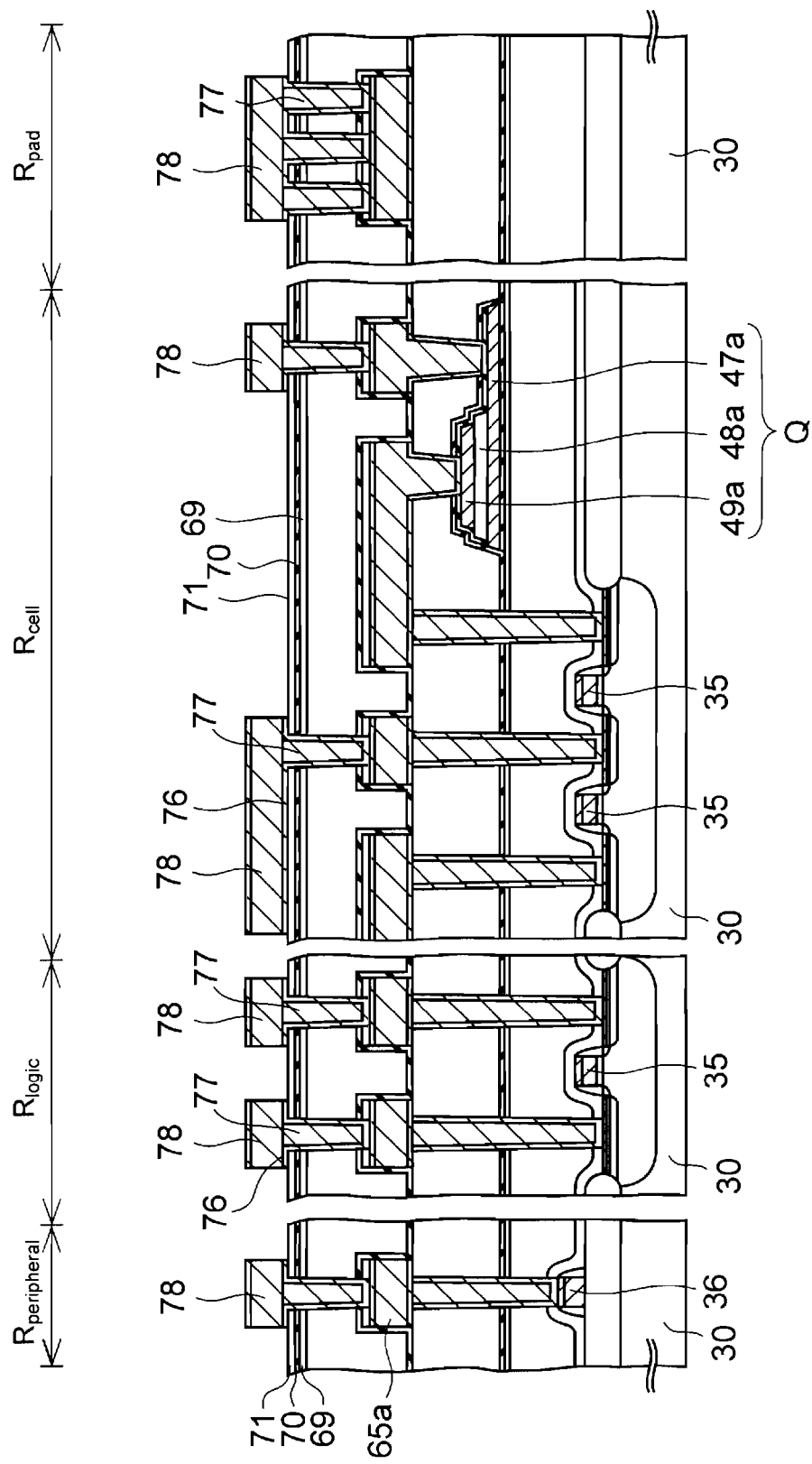

Next, description is given of steps for obtaining a cross-sectional structure illustrated in FIG. 2X.

First, a metal laminated film is formed on the second conductive plugs 77 and the first glue film 76 by a sputtering method. The metal laminated film contains, from its bottom, a copper-containing aluminum film having a thickness of approximately 550 nm, a titanium film having a thickness of approximately 5 nm and a titanium nitride film having a thickness of approximately 150 nm, in this order.

Thereafter, the metal laminated film and the first glue film 76 are patterned by a photolithography. Thereby, second metal wirings 78 formed of these films are formed on the first cover insulating film 71.

In this patterning, the metal laminated film and the first glue film 76 are over etched so as not to leave film residue on the first cover insulating film 71.

Even when such an over-etching is performed, it is possible to prevent the fourth insulating hydrogen barrier film 70 from being etched in the patterning and becoming thin, since the fourth insulating hydrogen barrier film 70 is covered with the first cover insulating film 71. Accordingly, the fourth insulating hydrogen barrier film 70 can maintain a sufficient thickness even after the above patterning, and reducing substances such as hydrogen can be effectively blocked by the fourth insulating hydrogen barrier film 70.

Subsequently, as illustrated in FIG. 2Y, a silicon oxide film to serve as a fourth interlayer insulating film 82 is formed on the first cover insulating film 71 and the second metal wirings 78 by a plasma CVD method using a mixed gas of TEOS gas and oxygen gas, to have a thickness of approximately 2200 nm.

Then, after an upper surface of the fourth interlayer insulating film 82 is polished and planarized by a CMP method, an $N_2O$ plasma process is performed on the fourth interlayer insulating film 82 under the conditions of a substrate temperature of 350° C. and a process time of four minutes. Thereby, the fourth interlayer insulating film 82 is dehydrated and a surface of the fourth interlayer insulating film 82 is nitrided. This prevents moisture resorption of the fourth interlayer insulating film 82. The $N_2O$ plasma process is performed by using a CVD apparatus, for example.

Figure 2Z:
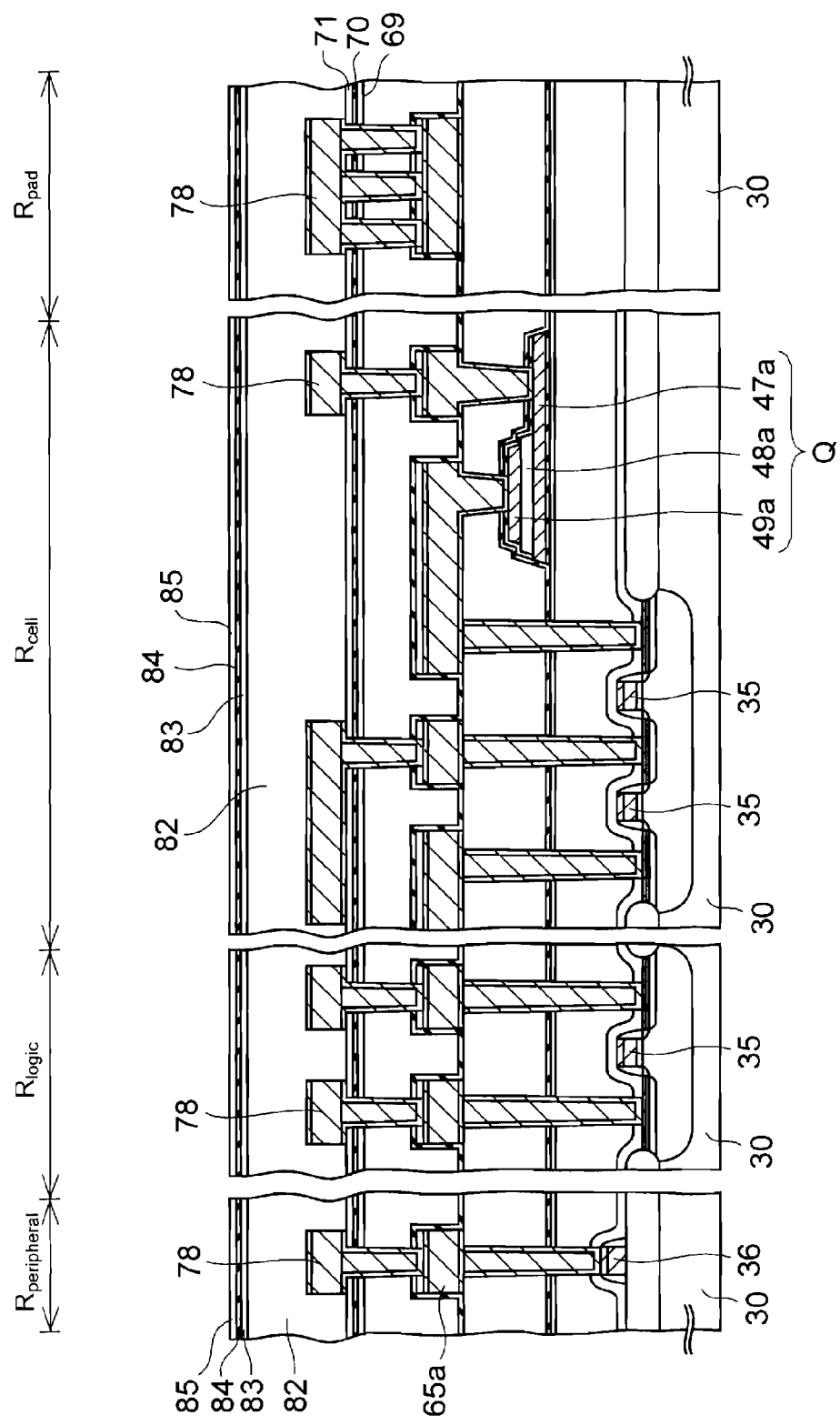

Thereafter, as illustrated in FIG. 2Z, a third cap insulating film 83, a fifth insulating hydrogen barrier film 84 and a second cover insulating film 85 are formed on the fourth interlayer insulating film 82, in the same way as the formation of the insulating films 69 to 71.

Among the insulating films, the third cap insulating film 83 and the second cover insulating film 85 are each formed by a plasma CVD method using TEOS gas, to have a film thickness of approximately 100 nm. On the other hand, the fifth insulating hydrogen barrier film 84 is formed of an alumina film having a thickness of approximately 50 nm formed by a sputtering method.

Here, an $N_2O$ plasma process may be performed on the third cap insulating film 83 and the second cover insulating film 85 after their deposition, to dehydrate the insulating films. The $N_2O$ plasma process is performed at a substrate temperature of 350° C. for two minutes, for example.

Figure 3A:
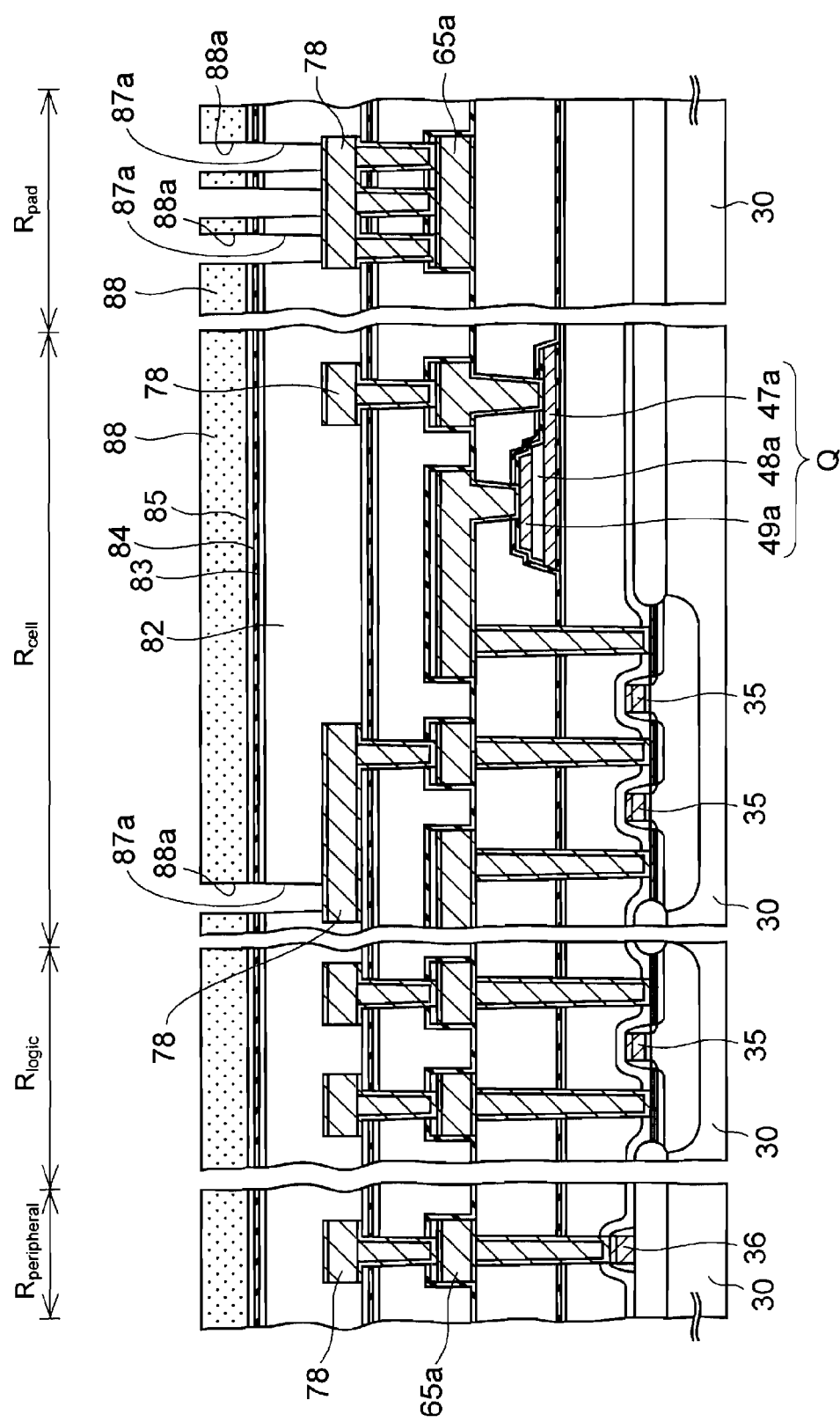

Thereafter, as illustrated in FIG. 3A, a photoresist is applied onto the second cover insulating film 85, and is then exposed and developed. Thereby, a fourth resist pattern 88 including hole-shaped fifth windows 88*a* over the second metal wirings 78 is formed.

Then, the insulating films 82 to 85 are etched in a parallel-plate type plasma etching chamber by using the fourth resist pattern 88 as a mask. Thereby, a fifth hole 87*a* is formed in portions, above each of the second metal wirings 78, of the insulating films. In this etching, gas mixture of $C_4F_8$, Ar, and $O_2$ is used as an etching gas, for example.

After the completion of the etching, the fourth resist pattern 88 is removed.

Figure 3B:
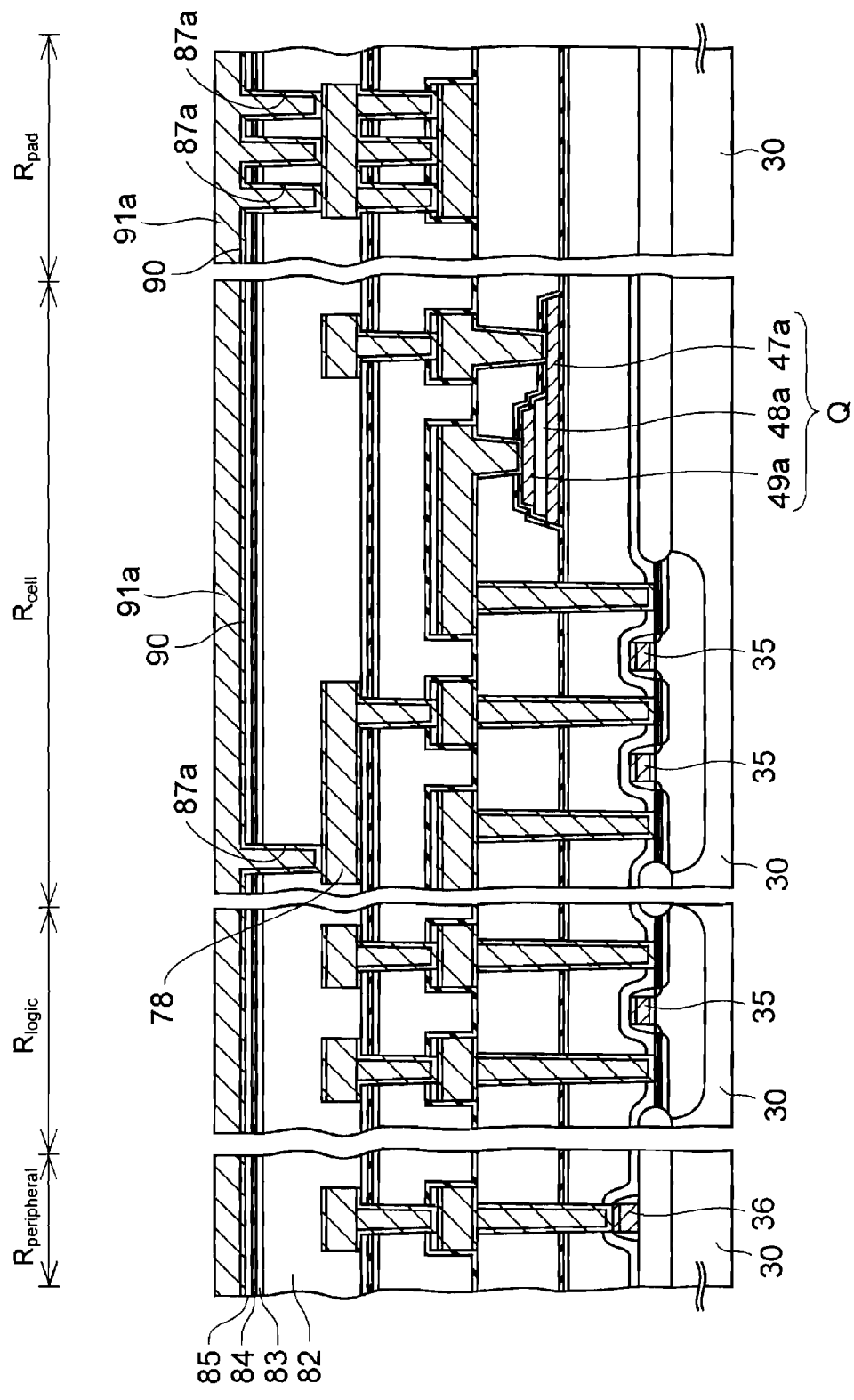

Subsequently, as illustrated in FIG. 3B, a titanium nitride film to serve as a second glue film 90 is formed on an inner surface of each of the fifth holes 87a and an upper surface of the second cover film 85 by a sputtering method, to have a thickness of approximately 50 nm. Then, a tungsten film 91a is formed on the second glue film 90 by a CVD method to completely fill the fifth holes 87a. The tungsten film 91a is formed to have a thickness of approximately 650 nm, for example.

Figure 3C:
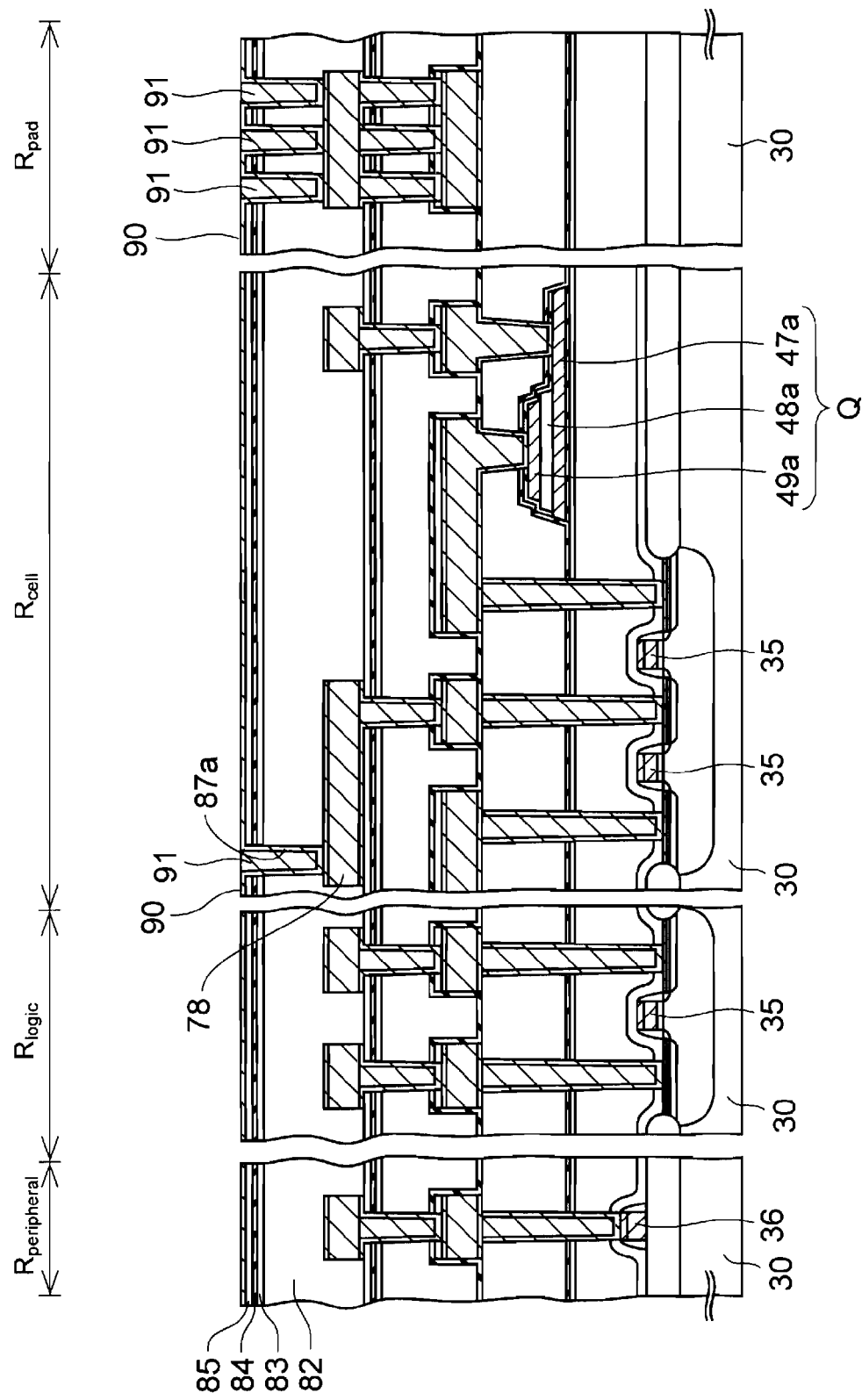

Thereafter, as illustrated in FIG. 3C, an excess tungsten film 91a on the second cover insulating film 85 is removed by etch back, to leave the tungsten film 91a as third conductive plugs 91 only in the fifth holes 87a. Here, the tungsten film 91a may be removed by a CMP method instead of etch back.

Next, description is given of steps for obtaining a cross-sectional structure illustrated in FIG. 3D.

First, a copper-containing aluminum film having a thickness of approximately 500 nm and a titanium nitride film having a thickness of approximately 150 nm are formed on the second glue film 90 and the third conductive plugs 91 in this order by a sputtering method. Then, the metal laminated film thus formed and the second glue film 90 under the metal laminated film are patterned by a photolithography, to form a third metal wiring 92 and a bonding pad 92a respectively in the cell region $R_{cell}$ and the pad region $R_{pad}$.

Figure 3E:
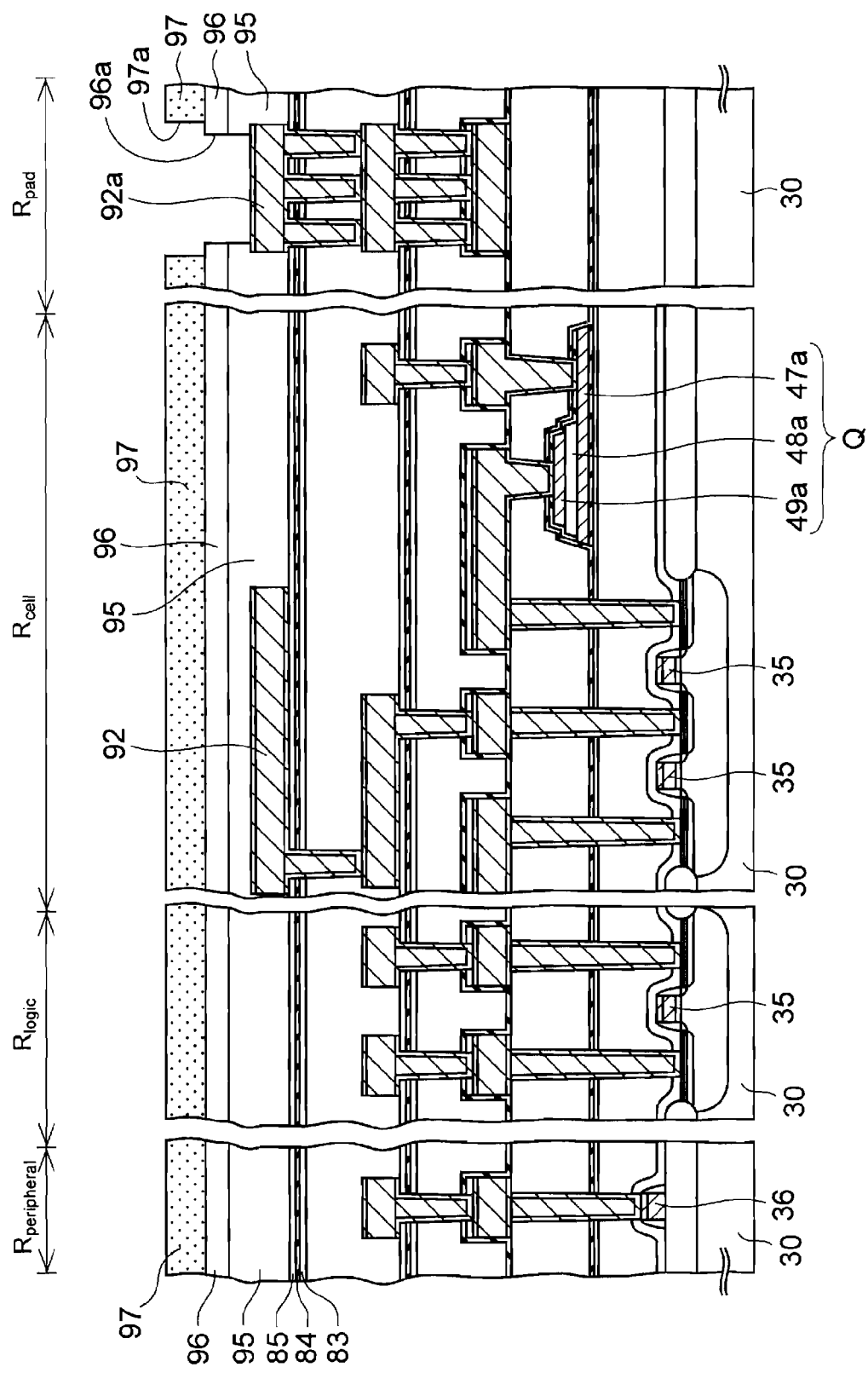

Next, description is given of steps for obtaining a cross-sectional structure illustrated in FIG. 3E.

First, a silicon oxide film as an insulating film constituting a first passivation film 95 is formed on the second cover insulating film 85 and the third metal wiring 92 by a CVD method, to have a thickness of approximately 100 nm.

Here, a $N_2O$ plasma process for a dehydration process and a moisture absorption prevention process may be performed on the first passivation film 95. The $N_2O$ plasma process is performed, for example, in a CVD apparatus under the process conditions of a substrate temperature of 350° C. and a process time of two minutes.

Moreover, a silicon nitride film to serve as a second passivation film 96 is formed on the first passivation film 95 by a CVD method, to have a thickness of approximately 350 nm.

Then, the first and second passivation films 95 and 96 are selectively dry-etched to form a sixth hole 96a, from which the bonding pad 92a in the pad region $R_{pad}$ is exposed.

Thereafter, a photosensitive polyimide to serve as a protection layer 97 made of a polyimide coating film is formed over the entire upper surface of the silicon substrate 30, to have a thickness of approximately 3 μm. Then, the protection layer 97 is exposed and developed, to form a seventh hole 97a from which the bonding pad 92a is exposed, in the protection layer 97. Subsequently, the protection film 97 is thermoset under the conditions of a substrate temperature of 310° C., a $N_2$ flow rate of 100 liter/min and a process time of 40 minutes.

Through the above steps, the basic structure of the semiconductor device according to this embodiment is completed.

According to the above-described embodiment, since the protection film 64 is formed in advance on the first metal wirings 65a, the first metal wirings 65a are not directly exposed to the plasma atmosphere in the deposition of the third interlayer insulating film 68 by the plasma CVD method. By causing the protection film 64 to function as a plasma protection film in this manner, deposition damage can be prevented from reaching the capacitor dielectric film 48a through the first metal wirings 65a, so that the capacitor dielectric film 48a can maintain high ferroelectric characteristics.

In particular, an insulating metal oxide film such as an alumina film constituting the protection film 64 has excellent barrier properties against hydrogen. Therefore, the protection film 64 also leads to such an advantage that reduction and deterioration of the capacitor dielectric film 48a due to hydrogen can be prevented.

In addition, as illustrated in FIGS. 2P and 2Q, the metal laminated film 65 is patterned to be made into the first metal wirings 65a, in the state where the protection film 64 is formed on the metal laminated film 65. Accordingly, even if impurities such as water and hydrocarbon are remaining on the side surfaces of the first metal wirings 65a in the wet process performed to remove a resist residue after the patterning, the adhesiveness between the protection film 64 and the metal laminated film 65 is unlikely to be reduced due to the impurities.

For this reason, annealing for vaporizing the impurities does not need to be performed on the first metal wirings 65a after the wet process. This can prevent deterioration of the ferroelectric characteristics of the capacitor dielectric film 48a due to heat by annealing.

Figure 4:
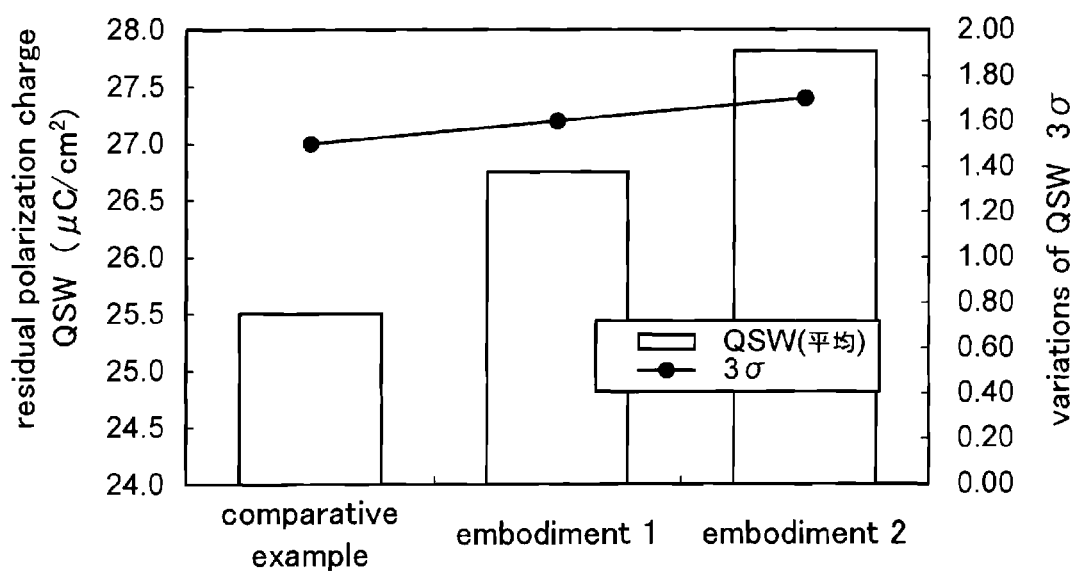
FIG. 4 is a graph depicting results of an investigation on residual polarization charges in capacitor dielectric films.

FIG. 4 is a graph obtained by actually investigating the residual polarization charge of the capacitor dielectric film 48a to verify the above-described advantages.

In this investigation, the result obtained by using capacitors Q manufactured by the method described on the basis of FIGS. 1A to 1G is provided as a comparative example.

As to the present embodiment, the case of omitting the third insulating hydrogen barrier film 66 (embodiment 1) and the case of forming the third insulating hydrogen barrier film 66 (embodiment 2) are investigated.

In each case, the graph depicts the average value of the residual polarization charges of 1224 capacitors in a wafer surface. Additionally, variations (3σ) in residual polarization charge in the wafer surface are also depicted.

As depicted in FIG. 4, in the comparative example, the residual polarization charge is decreased compared with the embodiments 1 and 2, and is only approximately 25.5 $\mu C/cm^2$. This is considered to be because the annealing for vaporizing impurities adhering to the wirings 23 is performed as described on the basis of FIG. 1E, and thereby the capacitor dielectric film 16 is deteriorated due to heat by the annealing.

On the other hand, in embodiments 1 and 2, a decrease in residual polarization charge is prevented by omitting the annealing for the first metal wirings 65a as described above, and hence a residual polarization charge which is higher by approximately 3% to 7% than that in the comparative example can be obtained. Consequently, in the embodiments 1 and 2, the operating margin of the semiconductor device including ferroelectric capacitors Q increases, and the yield of the semiconductor device is improved.

Moreover, this investigation also reveals that a decrease in residual polarization charge can be suppressed even when the third insulating hydrogen barrier film 66 is omitted as in embodiment 1.

Nevertheless, a decrease in residual polarization charge can be more effectively prevented when the third insulating hydrogen barrier film 66 is formed as in embodiment 2.

As described above, a decrease in residual polarization charge is suppressed in embodiments 1 and 2. Hence, it is not necessary to perform annealing in an oxygen-containing atmosphere to increase the residual polarization charge of the capacitor dielectric film 48a after the formation of the first metal wirings 65a. This prevents oxidation of the first metal wirings 65a and the first conductive plugs 60 by the annealing, and thereby prevents an increase in contact resistance between the first metal wirings 65a and the first conductive plugs 60.

Moreover, in this embodiment, the first metal wirings 65a and the second interlayer insulating film 55 are covered by the third insulating hydrogen barrier film 66. By the third insulating hydrogen barrier film 66, plasma damage which may be caused to the side surfaces, on which the protection film 64 is not formed, of the first metal wirings 65a can be reduced. Thereby, deterioration of the capacitor can be suppressed more effectively when forming the third interlayer insulating film 68.

The third insulating hydrogen barrier film 66 also has a function of preventing hydrogen ingress. Accordingly, the ferroelectric capacitors Q in the semiconductor device shipped as a product hardly deteriorate due to hydrogen in an external atmosphere. Consequently, the long-term reliability of the ferroelectric capacitors Q is improved.

Here, it is conceivable that, when depositing the third interlayer insulating film 68 by the plasma CVD method, the capacitor dielectric film 48a deteriorates by an electric action of charged particles included in the deposition atmosphere. In view of such possibility, it is preferable that an insulating film be formed as the protection film 64 for isolating the first metal wirings 65a from the plasma atmosphere, so that the electric action of the charged particles would not affect the capacitor dielectric film 48a through the first metal wirings 65a.

Description is given below of a preferable example of an insulating film as the protection film 64.

First Example

In this example, a silicon oxide film is formed as the protection film 64 by a sputtering method. A silicon oxide film can also protect the first metal wirings 65a from plasma generated when forming the third interlayer insulating film 68. Therefore, the protection film 64 can prevent damage from being caused to the capacitor dielectric film 48a through the first metal wirings 65a.

Moreover, in a sputtering method, plasma is attracted to a sputtering target facing a substrate. Accordingly, deposition damage caused to the capacitor dielectric film 48a is smaller in a sputtering method than in a plasma CVD method. Hence, by forming the protection film 64 made of silicon oxide by a sputtering method, damage can be prevented from being caused to the capacitor Q when forming the protection film 64.

Here, the thickness of the protection film 64 is not particularly limited in this example, and is set between 2 nm and 30 nm, for example.

The minimum film thickness is set at 2 nm, because the function for protecting the capacitor Q from the plasma atmosphere may decrease if the thickness is smaller than 2 nm. In addition, the maximum film thickness is set at 30 nm, because it is difficult to etch the protection film 64 in the step illustrated in FIG. 2Q if the thickness is larger than 30 nm.

Second Example

In this example, a coat-type insulating film is formed as the protection film 64. The coat-type insulating film is also called as a spin on glass (SOG).

Coating process does not require plasma when forming the protection film 64, and thus is less harmful to a ferroelectric-capacitor-Q.

As the coat-type insulating film, a methylsiloxane based SOG such as Allied 211 available from RASA Industries, Ltd. can be formed. Alternatively, a phosphorus-doped silicon based SOG can be formed as the protection film 64.

In the case of methylsiloxane-system SOG, a SOG coating film is formed on the metal laminated film 65 by a spin coat method, and is then baked under the conditions of a substrate temperature of 120° C. and a process time of 90 seconds. Thereafter, the SOG coating film is cross-linked by heat under the conditions of a substrate temperature of 200° C. to 250° C. and a process time of 15 minutes, to form the protection film 64. Although hydrogen and moisture are generated from the SOG coating film in the cross-linking, reduction and deterioration of the capacitor dielectric film 48a do not occur since the hydrogen and the like are blocked by the metal laminated film 65 that is already formed over the entire upper surface of the silicon substrate 30 (see FIG. 2O).

The film thickness of the protection film 64 made of the coat-type insulating film is set between 10 nm to 30 nm, for example. The minimum film thickness is set at 10 nm, because a pinhole, which disables the protection film 64 from protecting the capacitor Q from the plasma atmosphere, is more likely to be produced in the protection film 64 having thickness smaller than 10 nm. Moreover, the maximum film thickness is set at 30 nm in consideration of difficulty of etching as in the case of first example.

Third Example

In this example, a resin film such as a polyimide film is formed as the protection film 64. Any of a photosensitive polyimide film and a non-photosensitive polyimide film can be formed as the protection film 64.

In the case of forming a non-photosensitive polyimide film, a polyimide coating film is formed on the metal laminated film 65, and is then cross-linked in a nitrogen atmosphere under the conditions of a substrate temperature of 180° C. to 220° C. and a process time of 20 minutes. Thereby, the protection film 64 is formed.

As in the second example, alcohol, hydrogen, water and the like are generated in the cross-linking of the polyimide coating film. However, downward diffusion of these reducing substances is prevented by the metal laminated film 65, and hence the capacitor dielectric film 48a is unlikely to be deteriorated by these reducing substances.

However, if the substrate temperature at the time of cross-linking is too high or the cross-linking time is too long, the capacitor dielectric film 48a may be deteriorated due to heat. For this reason, it is preferable that the polyimide coating film be cross-linked under the conditions of the relatively low substrate temperature of 180° C. to 250° C., and a process time of 15 minutes or shorter.

The thickness of the protection film 64 made of polyimide is preferably between 10 nm and 30 nm for the same reasons as in the second example.

To form a polyimide film having such a thin film thickness, it suffices to dilute polyimide by solvent to lower concentration than in the case of forming the protection layer 97 (see FIG. 3E), and apply the polyimide whose viscosity is thus lowered. Although polyimide used here is not limited to a particular kind, polyimide SP-811 from TORAY Industries, Inc. can be used, for example.

Fourth Example

In this example, a ferroelectric oxide film is formed as the protection film 64 by a sputtering method. A ferroelectric oxide film has characteristics of occluding hydrogen. Accordingly, the protection film 64 made of a ferroelectric oxide film occludes hydrogen contained in an external atmosphere and hydrogen generated in manufacturing. Thus, the protection film 64 prevents reduction and deterioration of the capacitor film 48a due to hydrogen, and consequently contributes to improvement of the long-term reliability of the ferroelectric capacitor Q.

Examples of such a ferroelectric oxide film include a PZT. Alternatively, a PZT doped with a small amount of additive such as lanthanum and calcium (PLZT, for example) may be formed as the ferroelectric oxide film. Moreover, a ferroelectric oxide film made of a bismuth layer structured compound such as SBT or BLT may be formed as the protection film 64.

Moreover, by forming a ferroelectric oxide film by a sputtering method that causes less damage due to plasma than in a plasma CVD method, damage can be prevented from being caused to the capacitor Q through the metal laminated film 65 when depositing the ferroelectric oxide film.

Although not particularly limited, the thickness of the protection film 64 made of ferroelectric oxide is set between 2 nm to 10 nm, for example. The reasons why the minimum and maximum film thicknesses are thus set are the same as those in the first example.

It is to be noted that the etching of the protection film 64 in FIG. 2Q can be performed by using the same etching gas as that used in this embodiment described above, in any cases of forming the insulating films of the above-described first to fourth examples as the protection film 64.

Second Embodiment

Next, description is given of a second embodiment.

In this embodiment, the first embodiment described above is applied to a stack-type FeRAM.

Figure 6A:
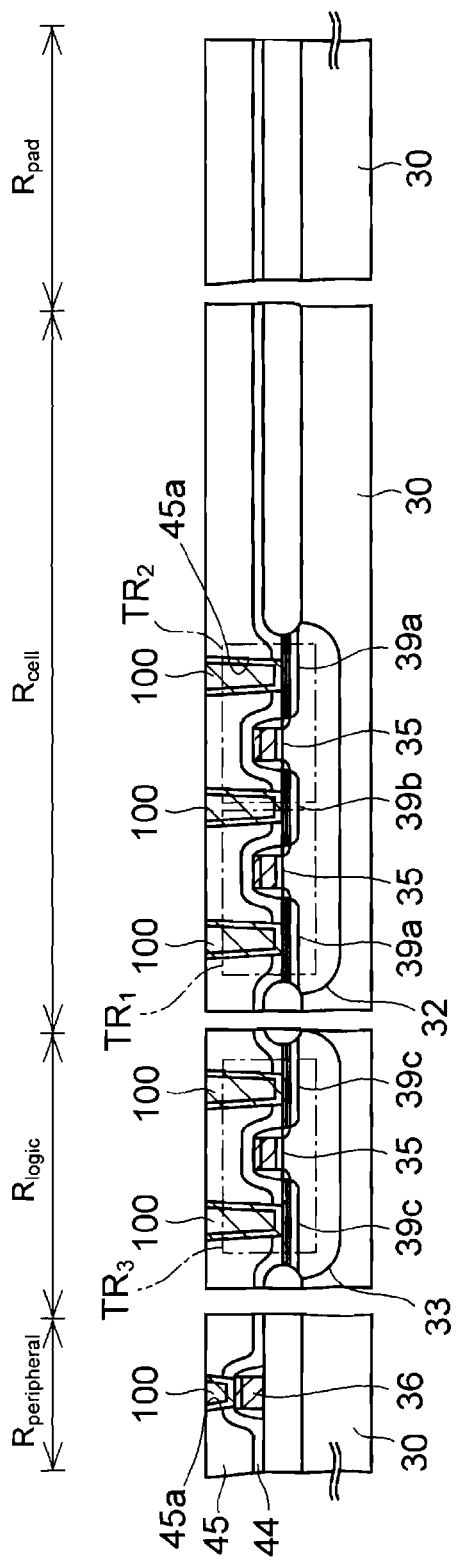
FIGS. 6A to 6V are cross-sectional views of a semiconductor device according to the second embodiment in the course of manufacturing.
Figure 6B:
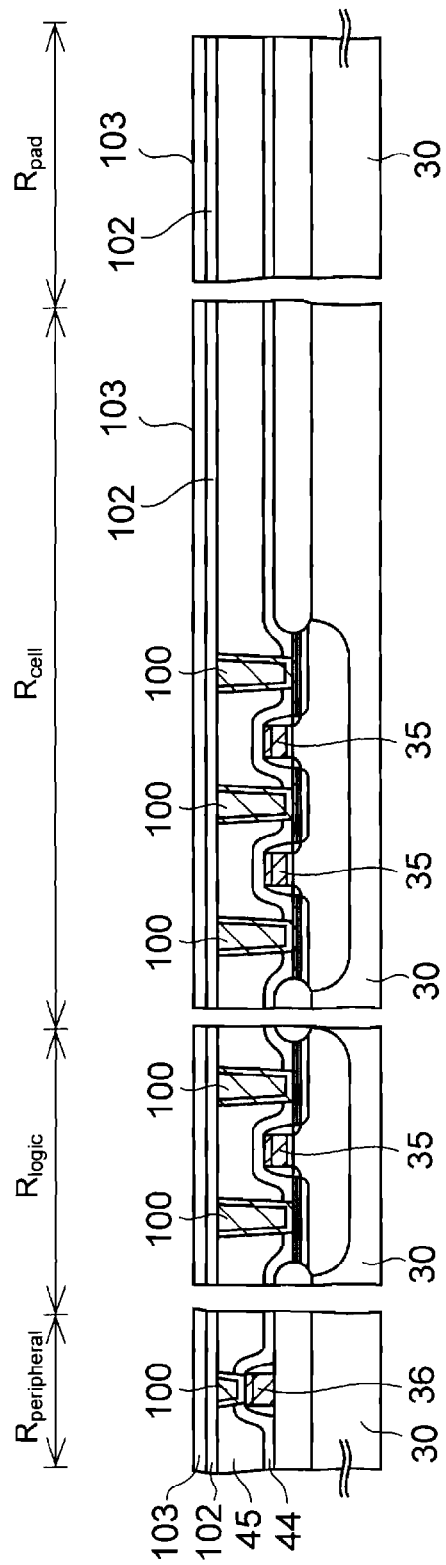
Figure 6C:
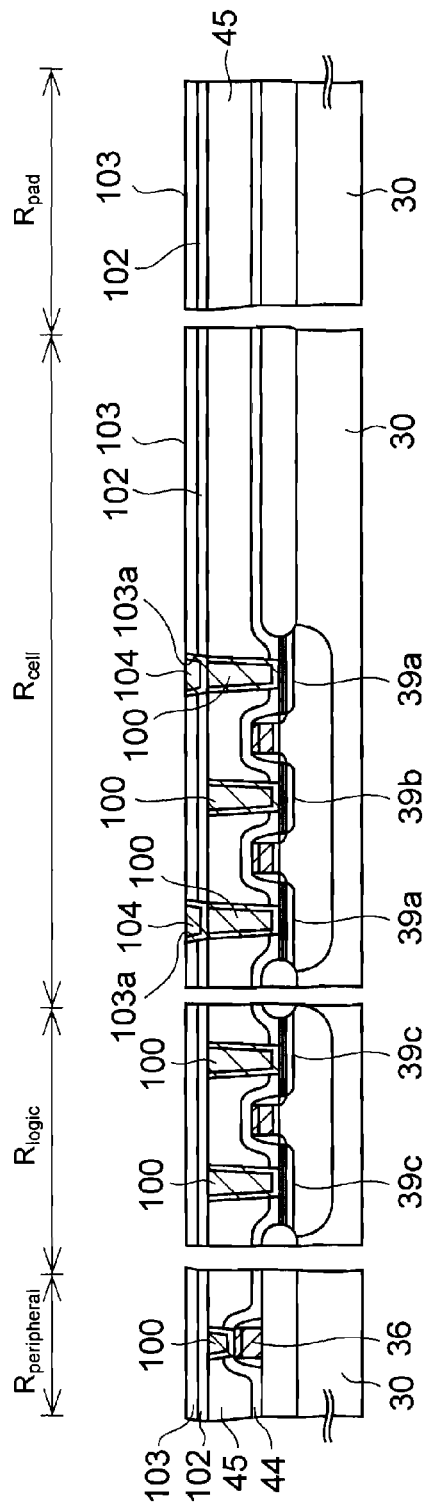
Figure 6D:
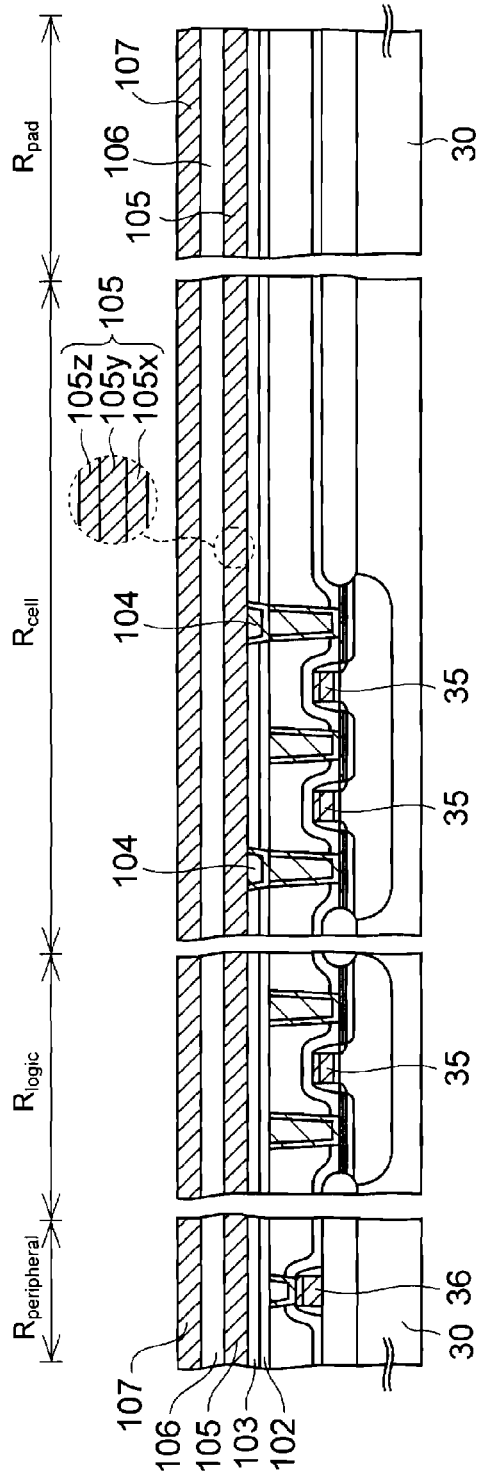
Figure 6E:
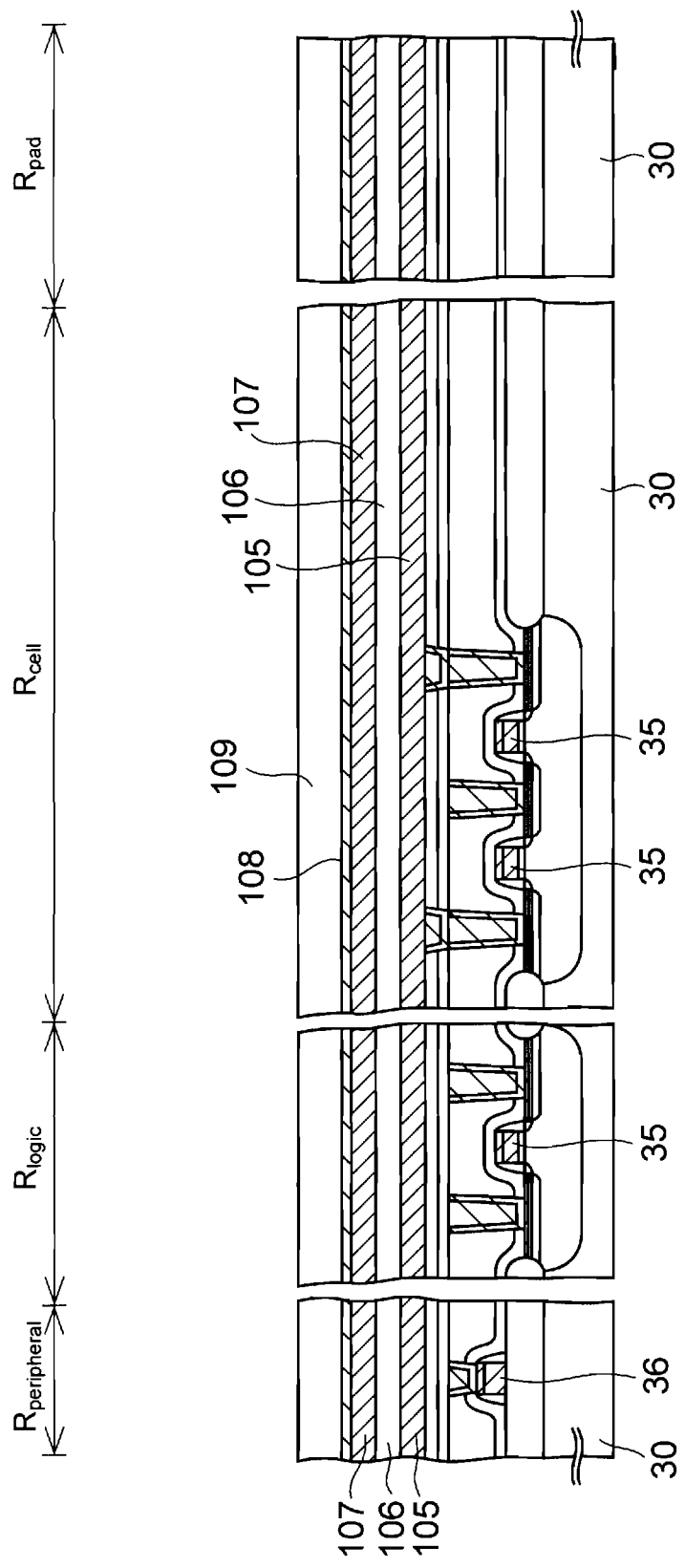
Figure 6F:
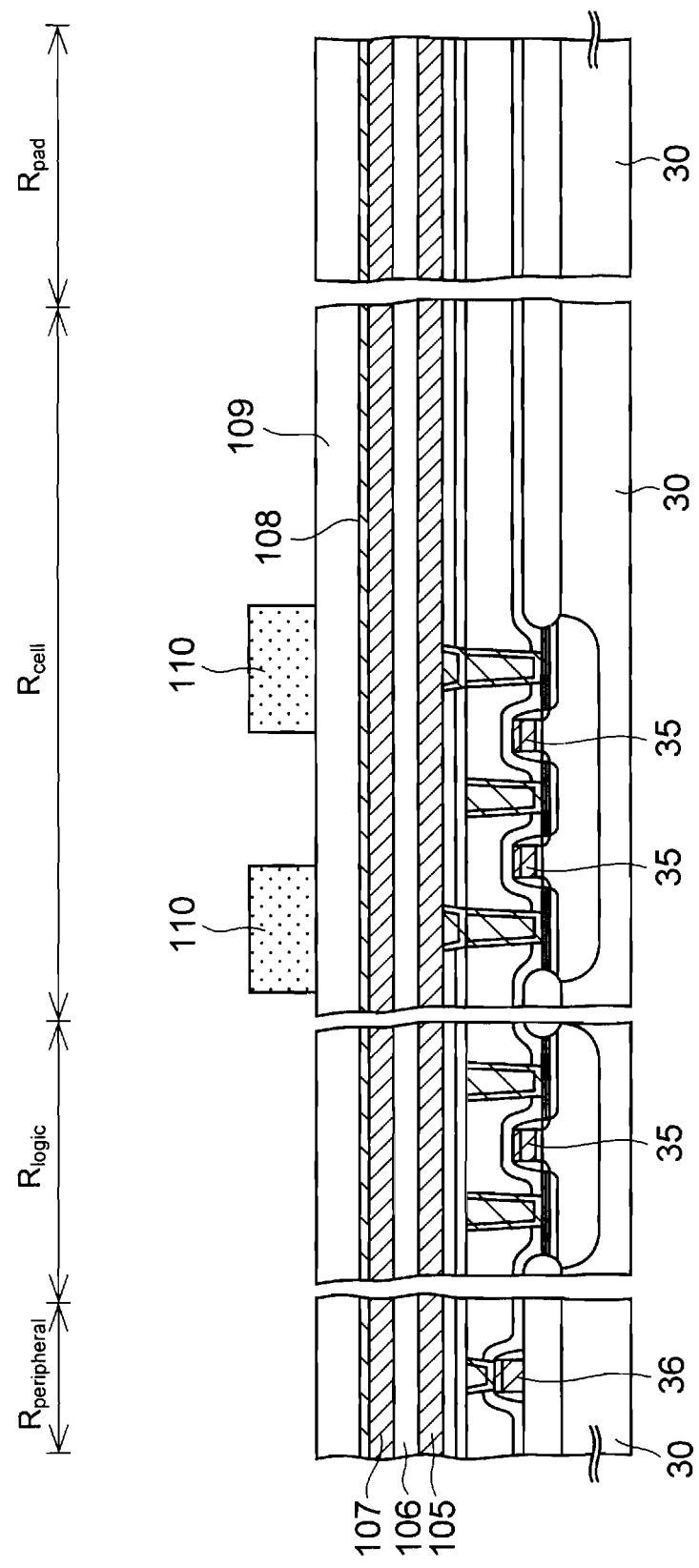
Figure 6G:
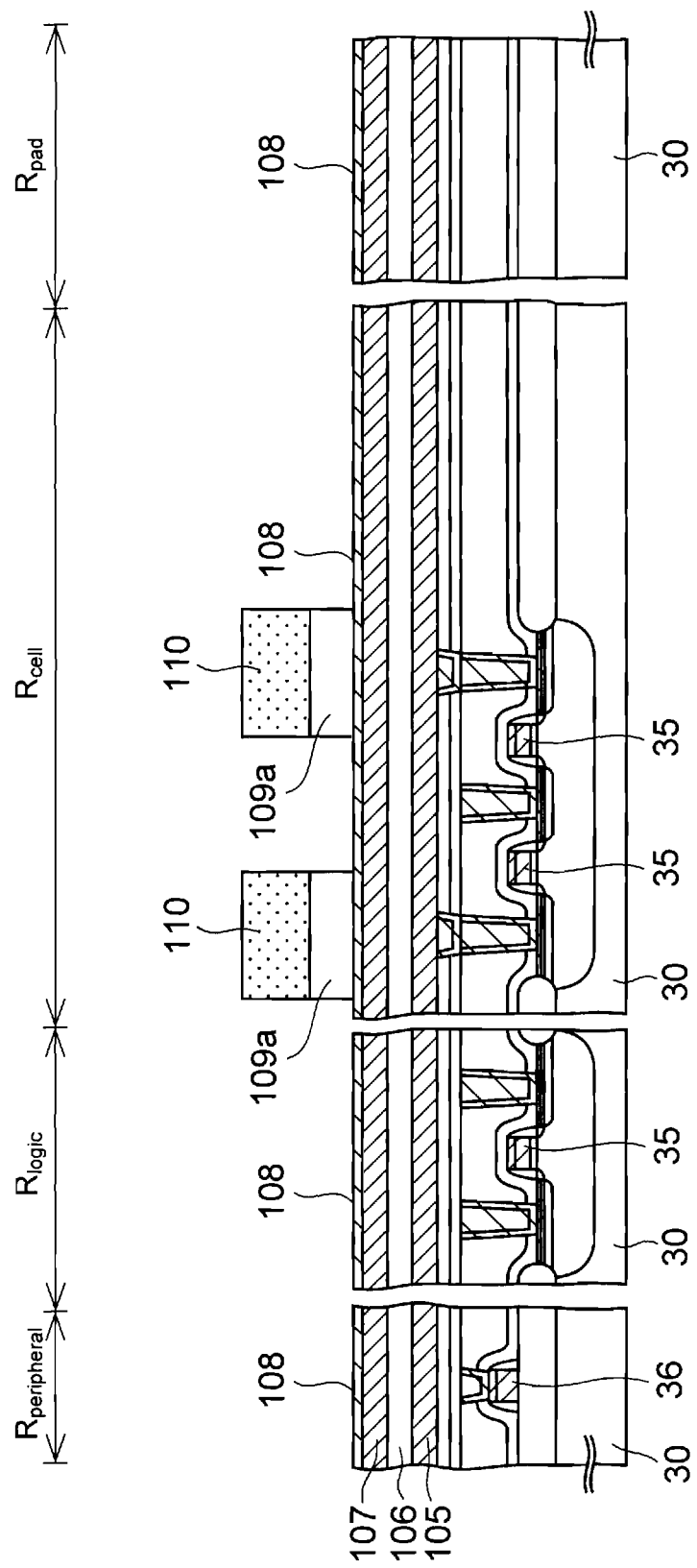
Figure 6H:
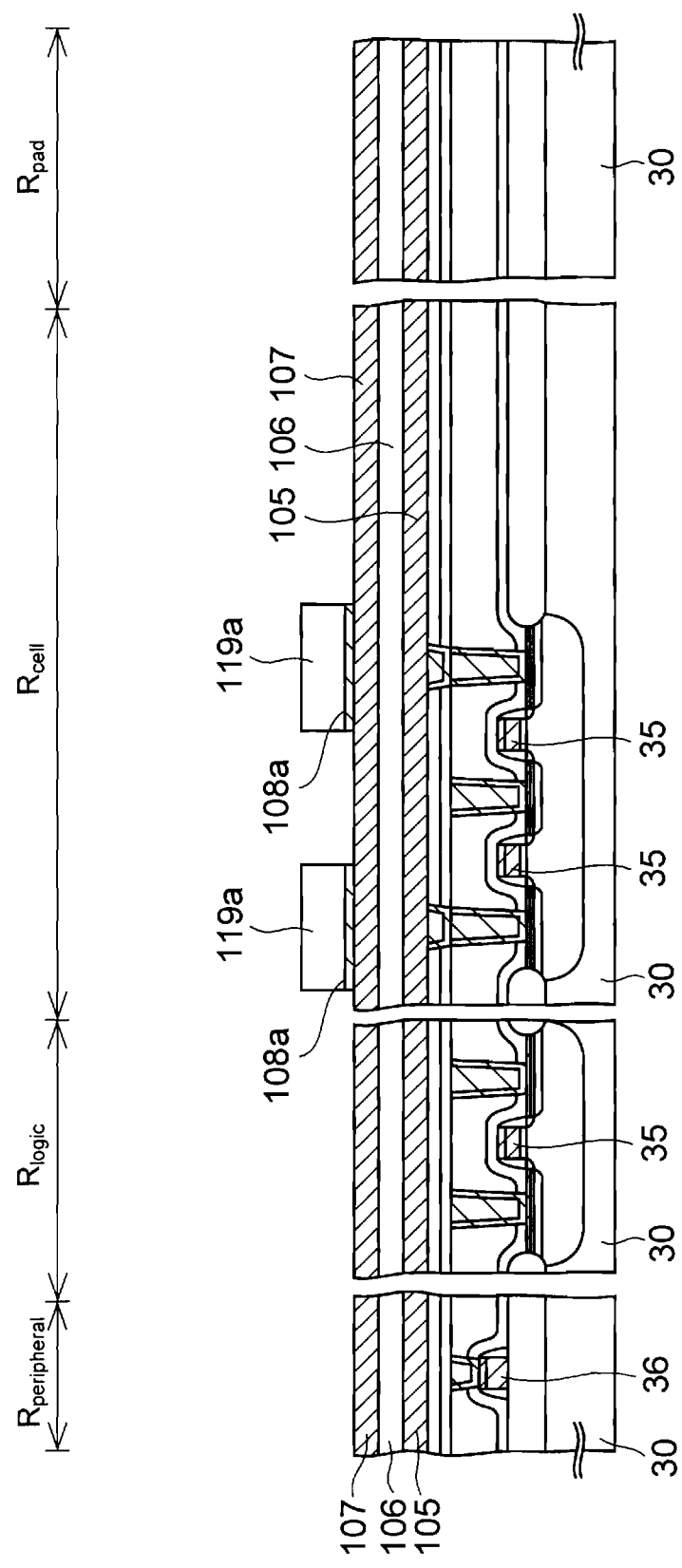
Figure 6I:
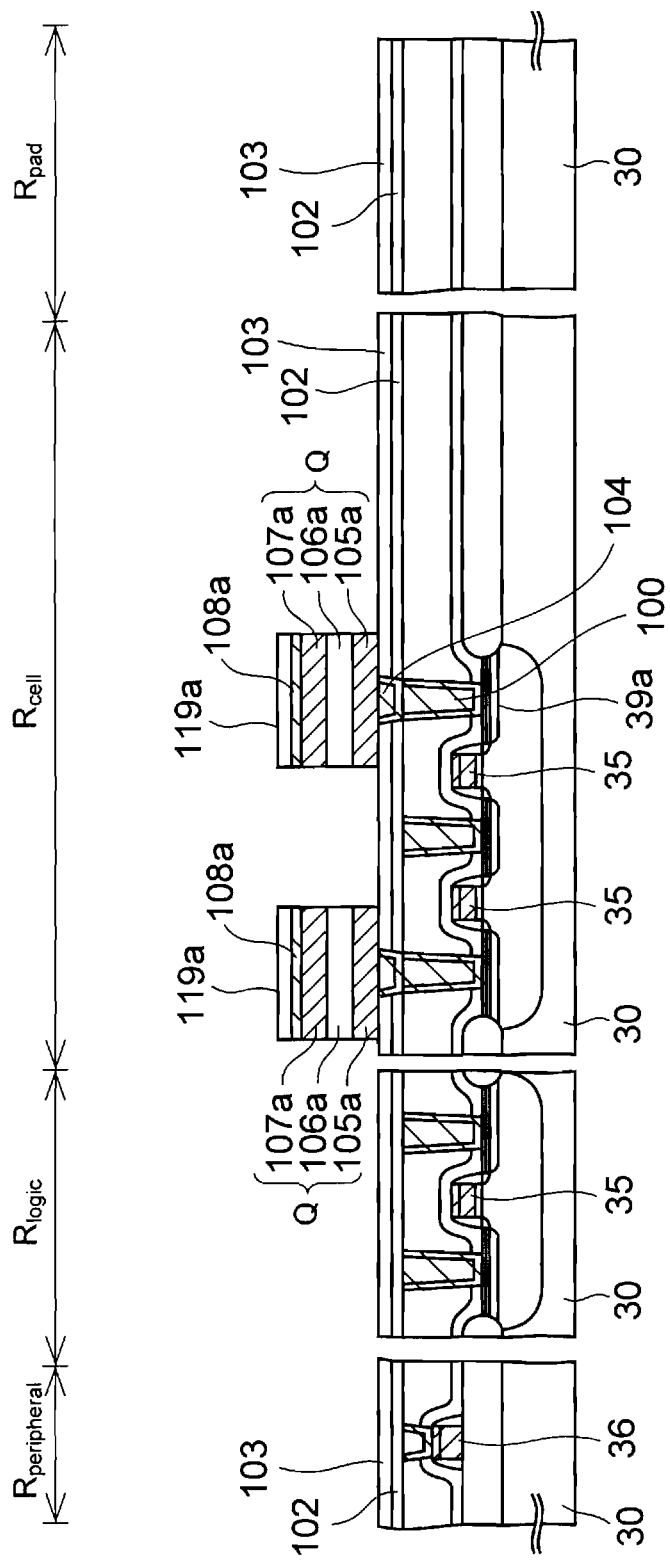
Figure 6J:
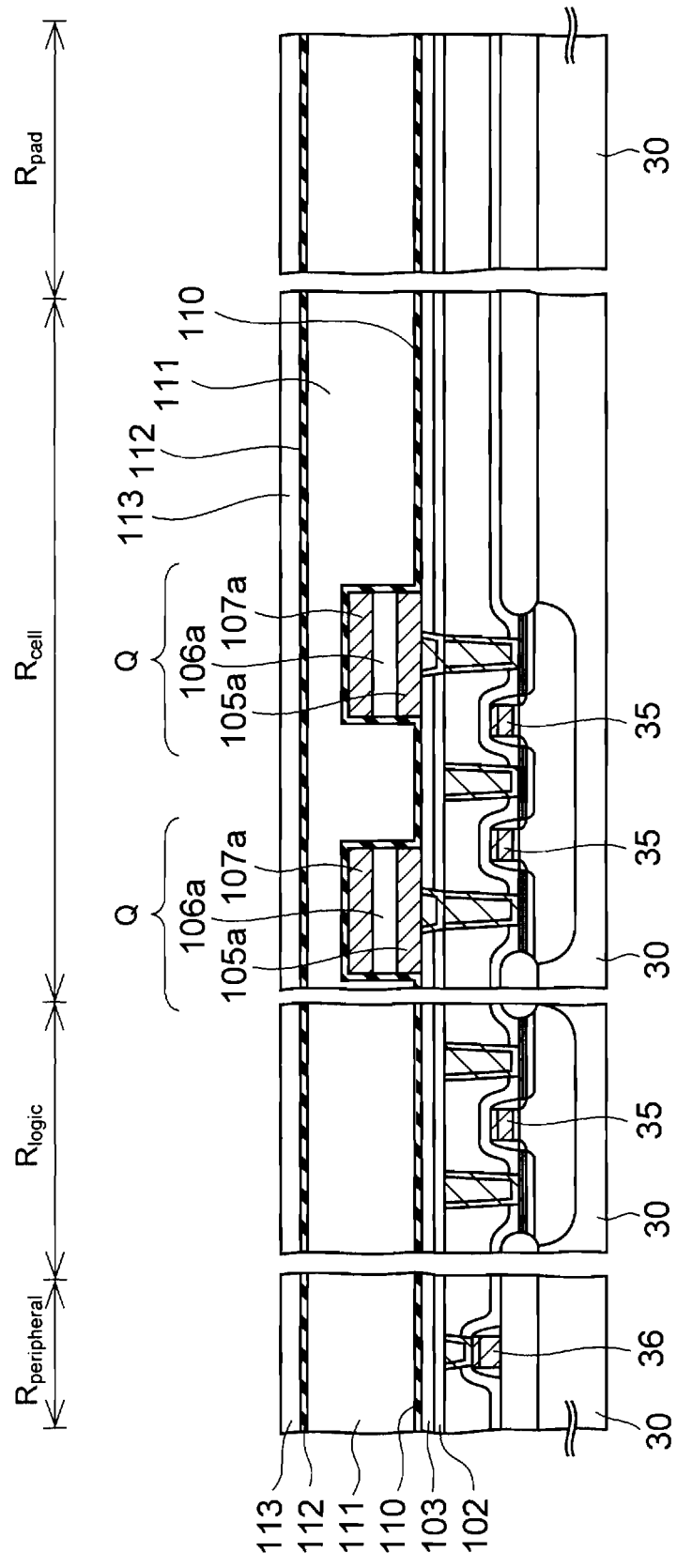
Figure 6K:
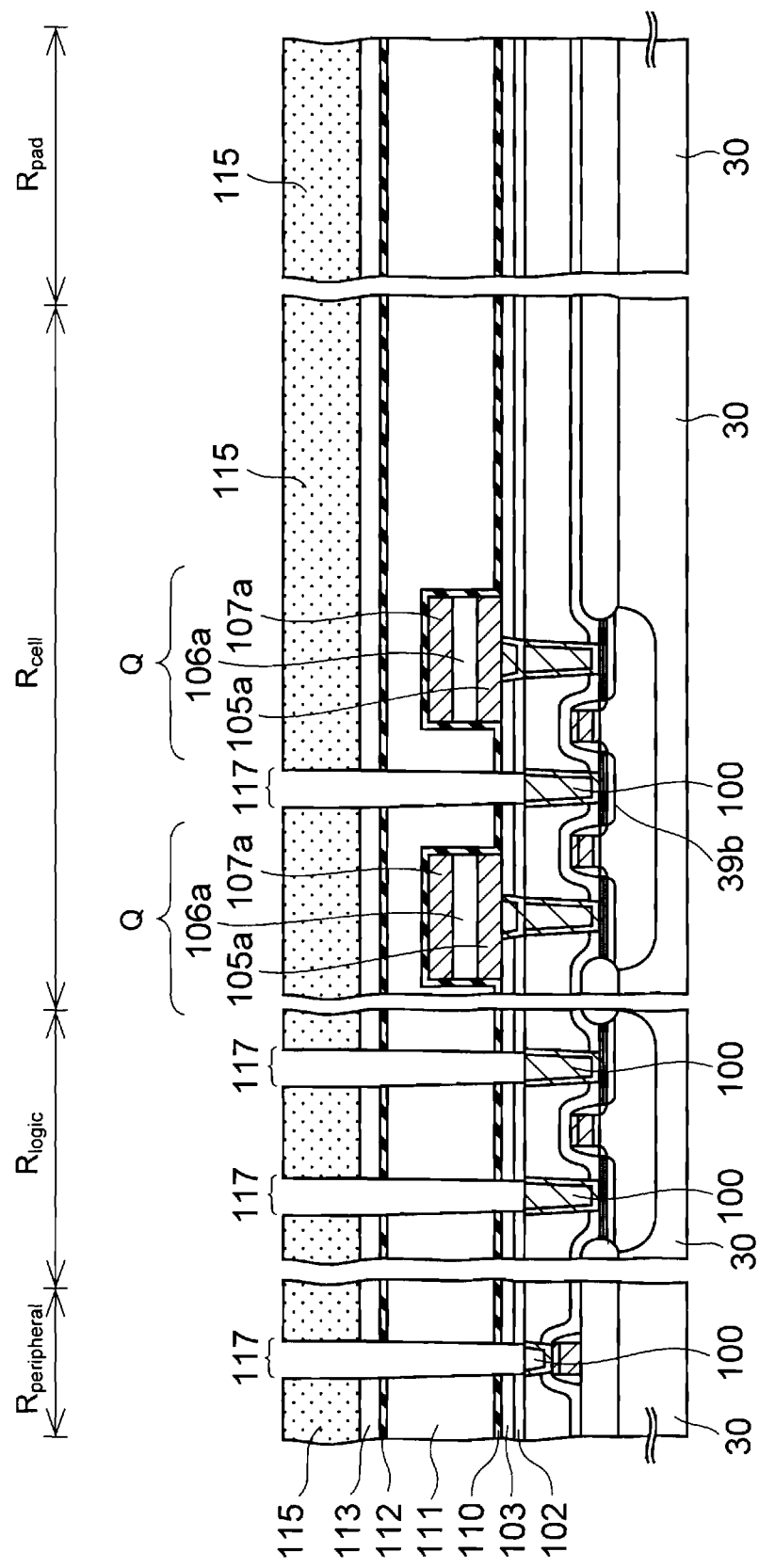
Figure 6L:
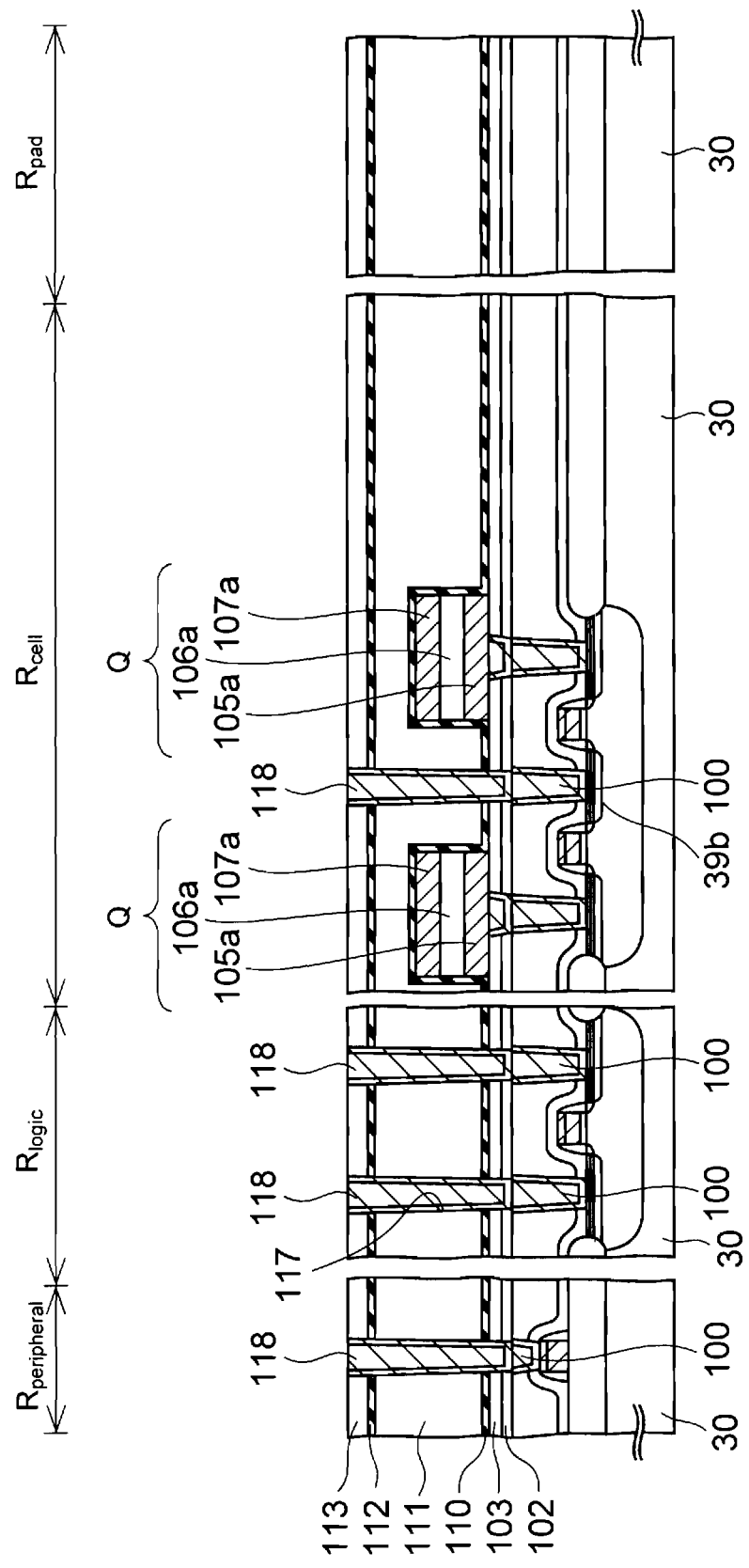
Figure 6M:
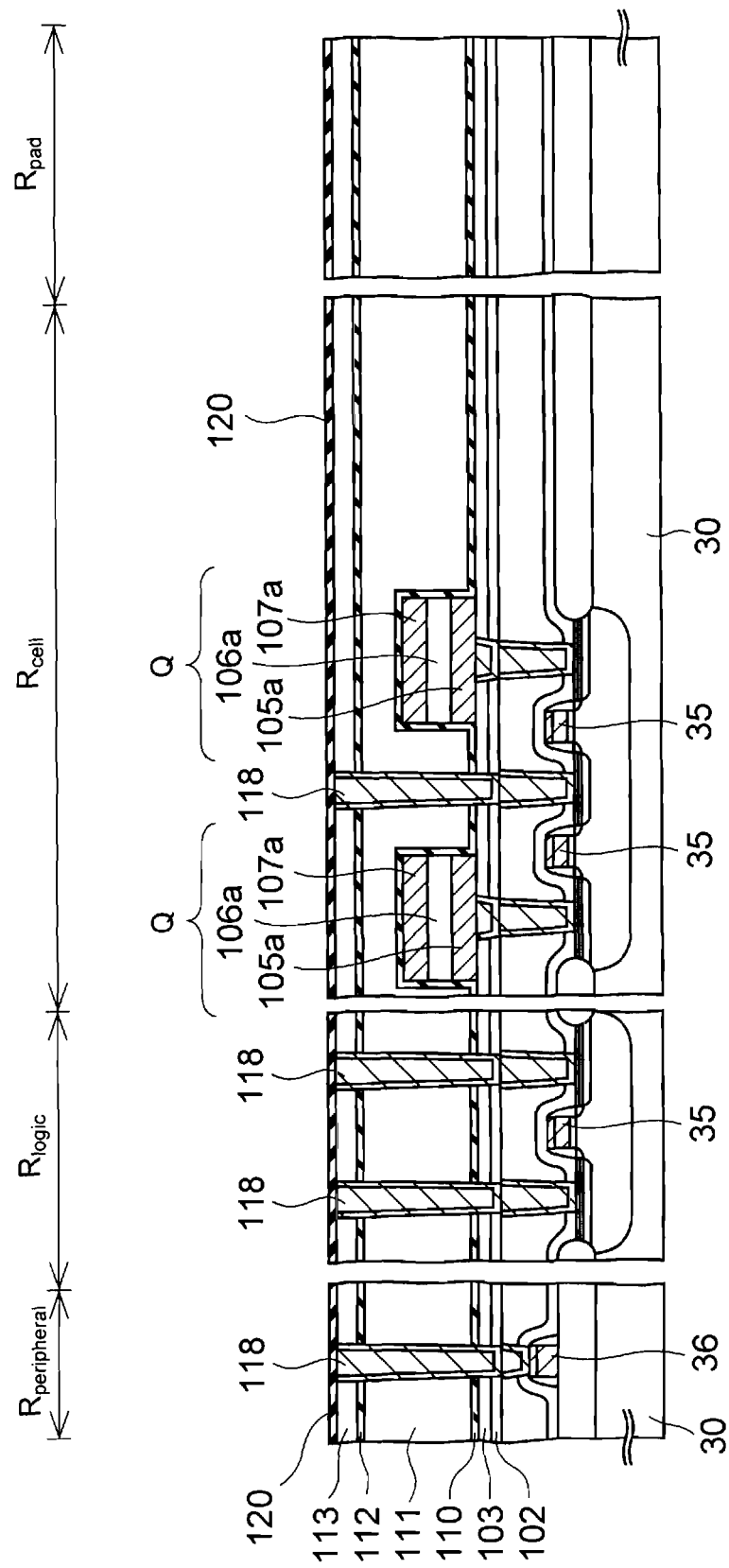
Figure 6N:
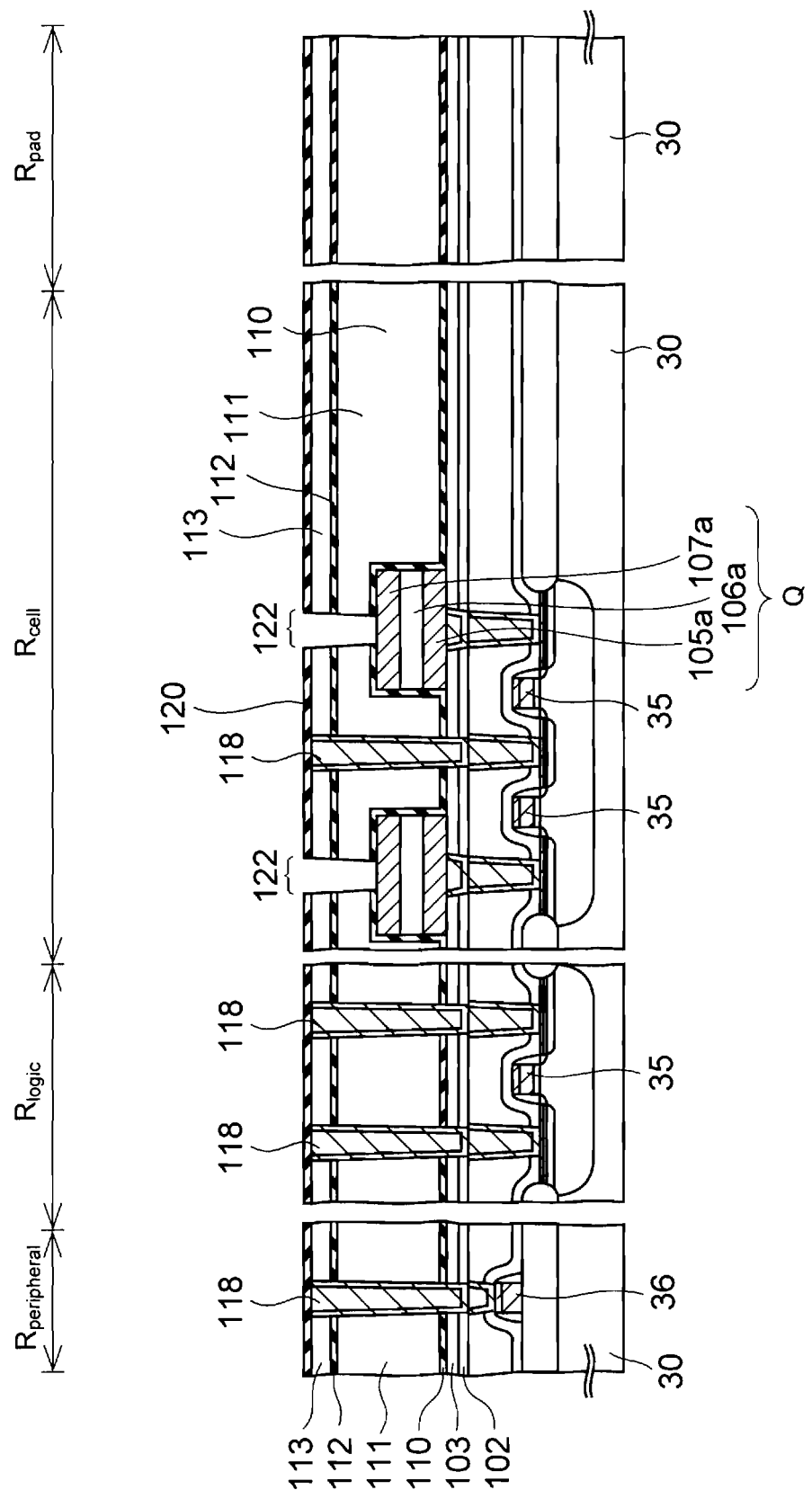
Figure 60:
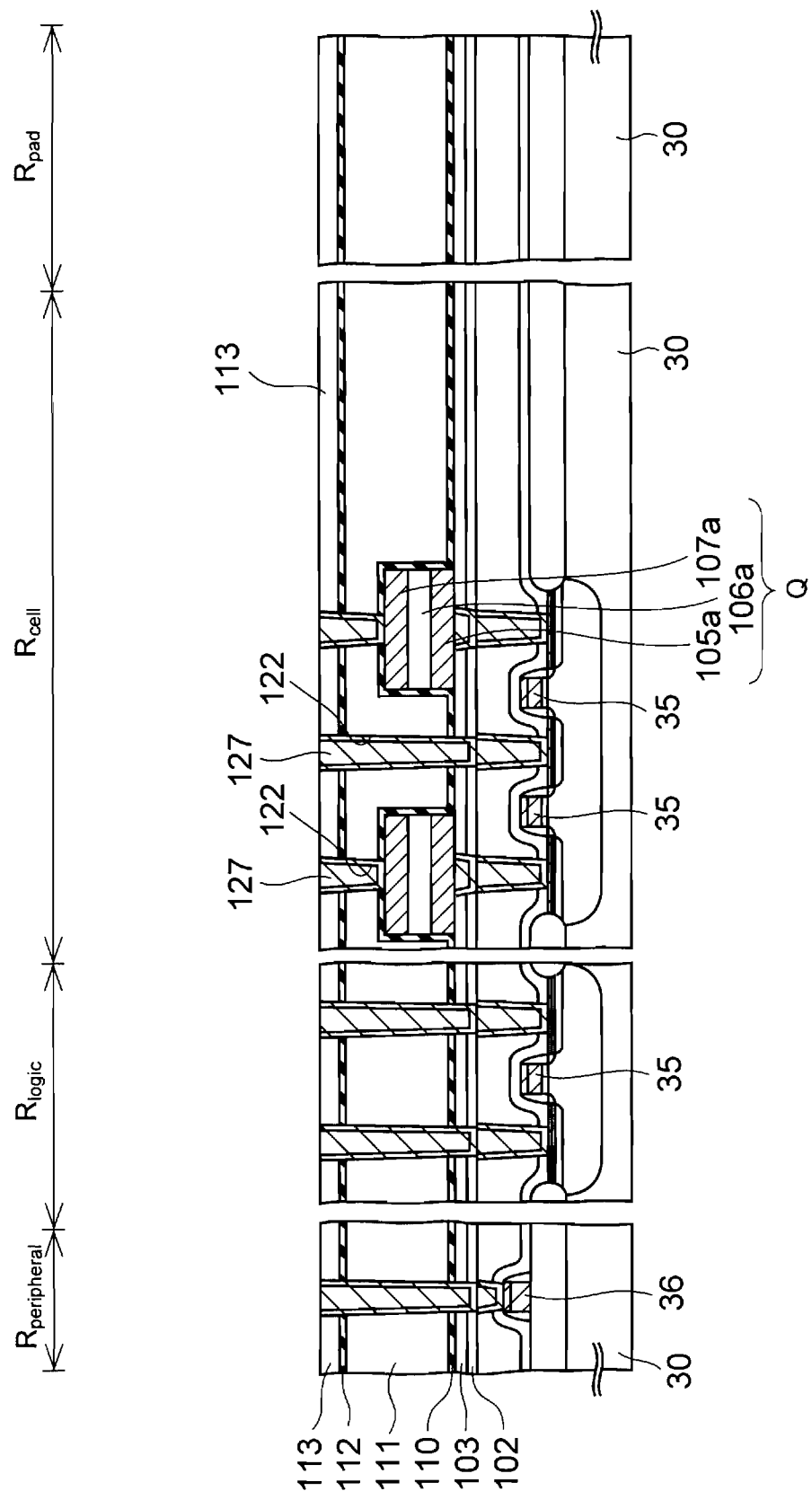
Figure 6P:
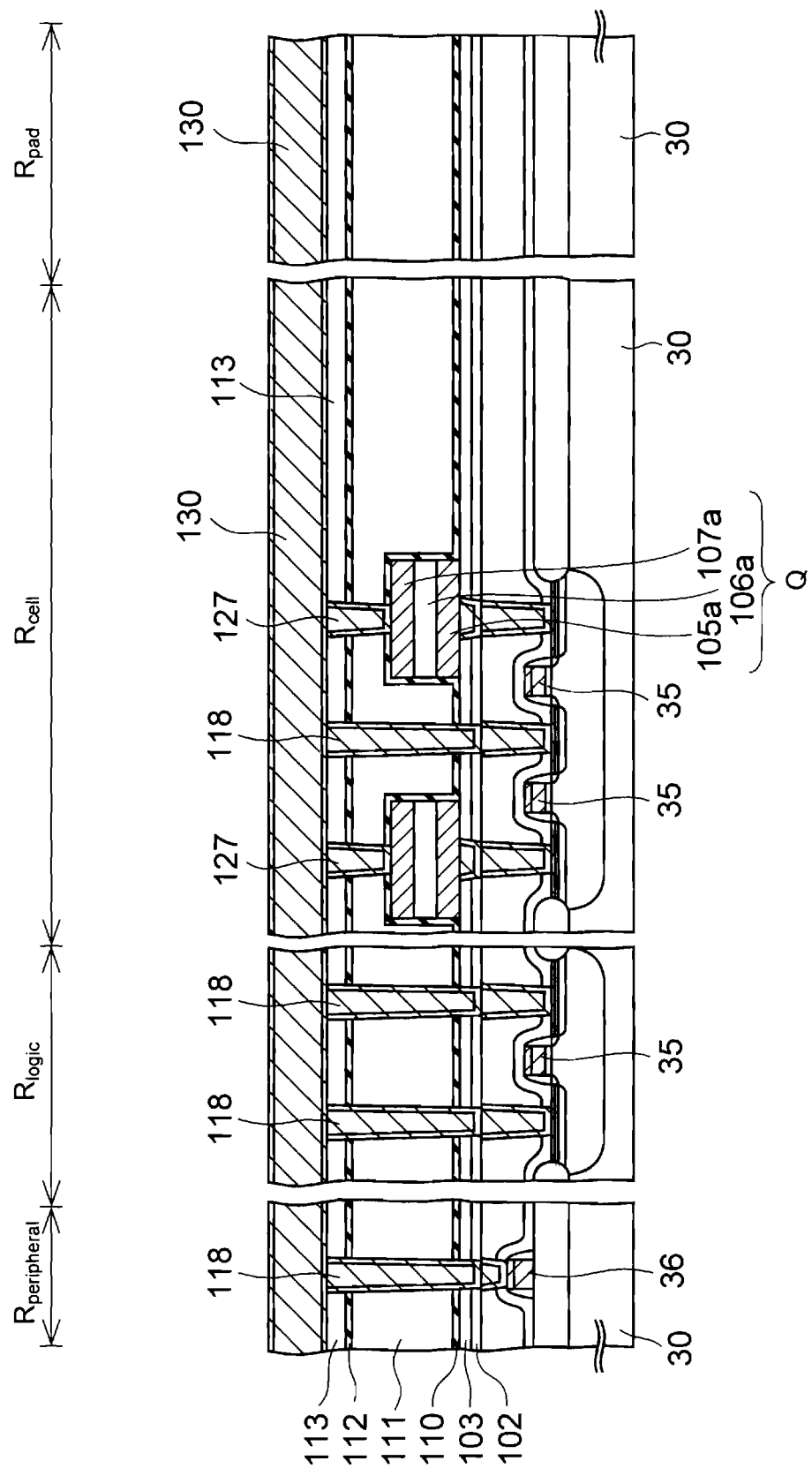
Figure 6Q:
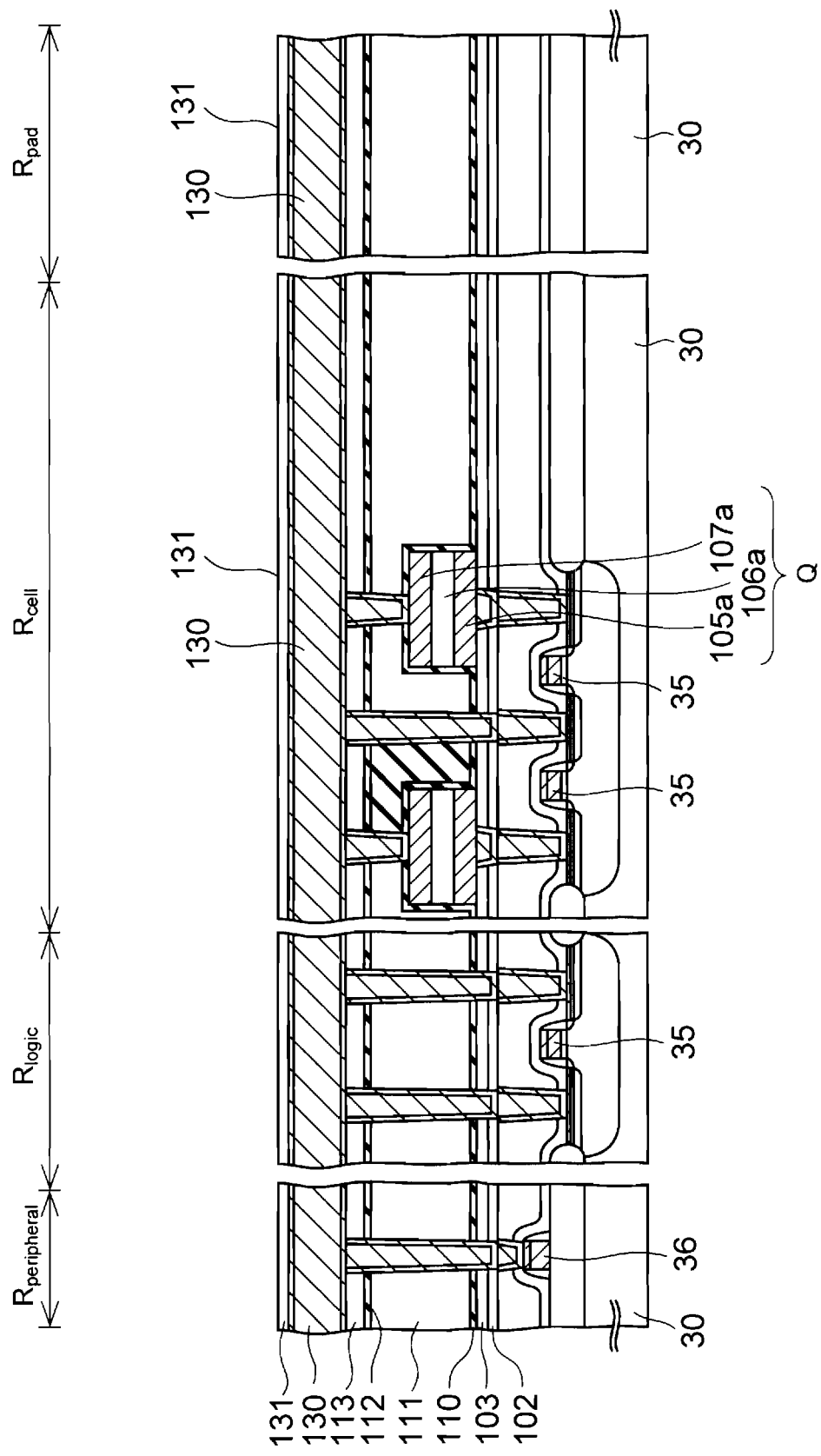
Figure 6R:
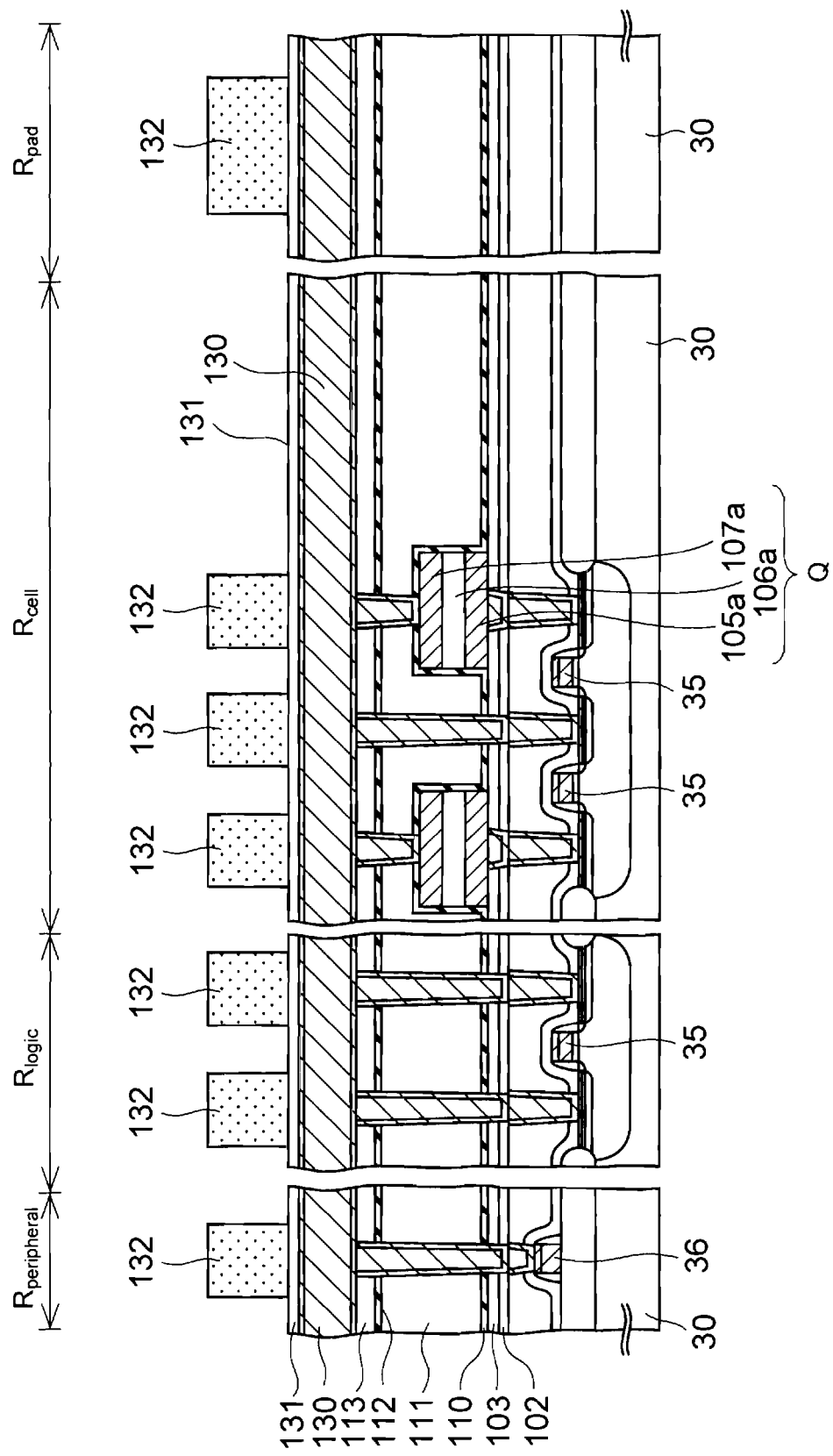
Figure 6S:
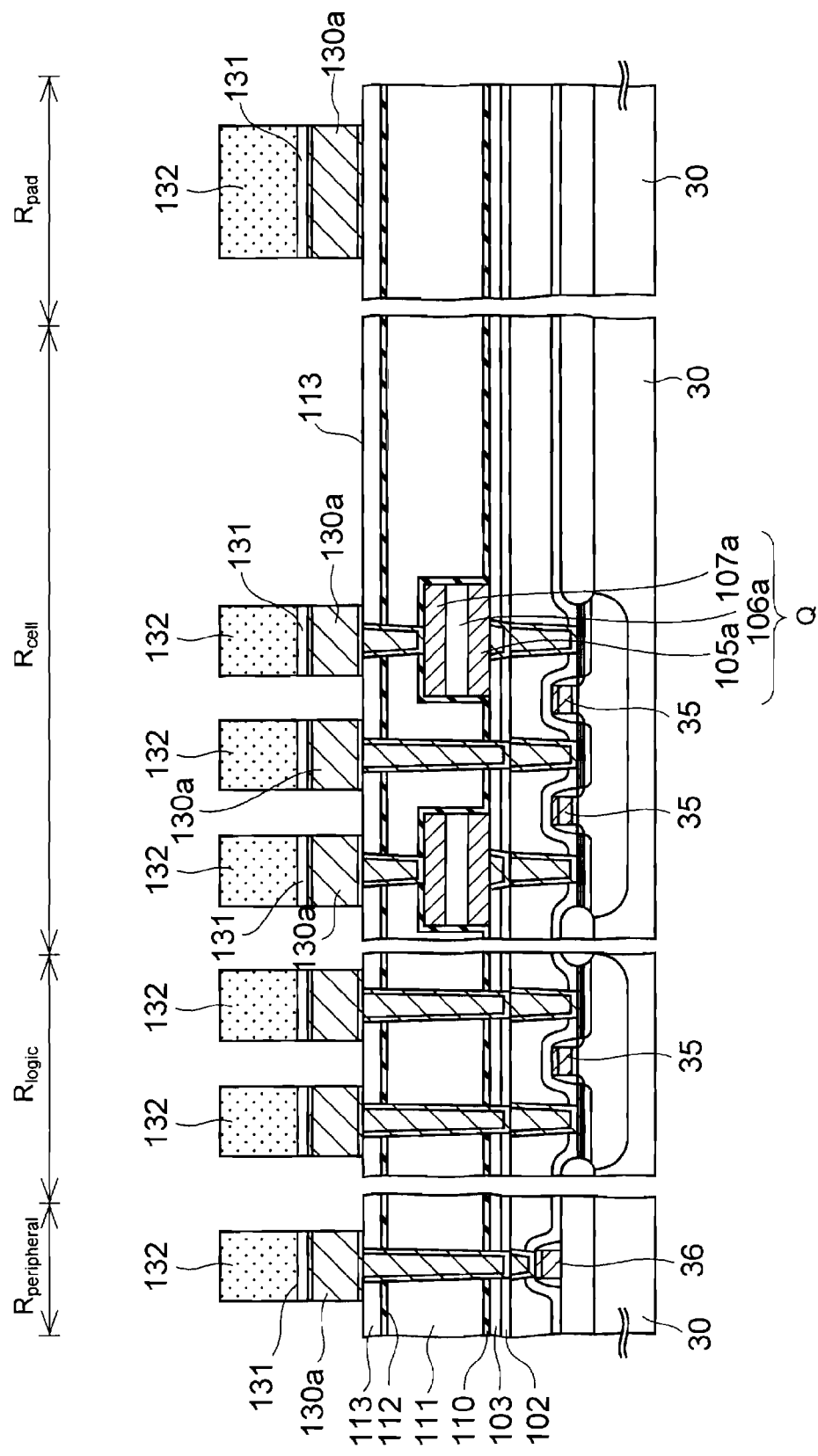
Figure 6T:
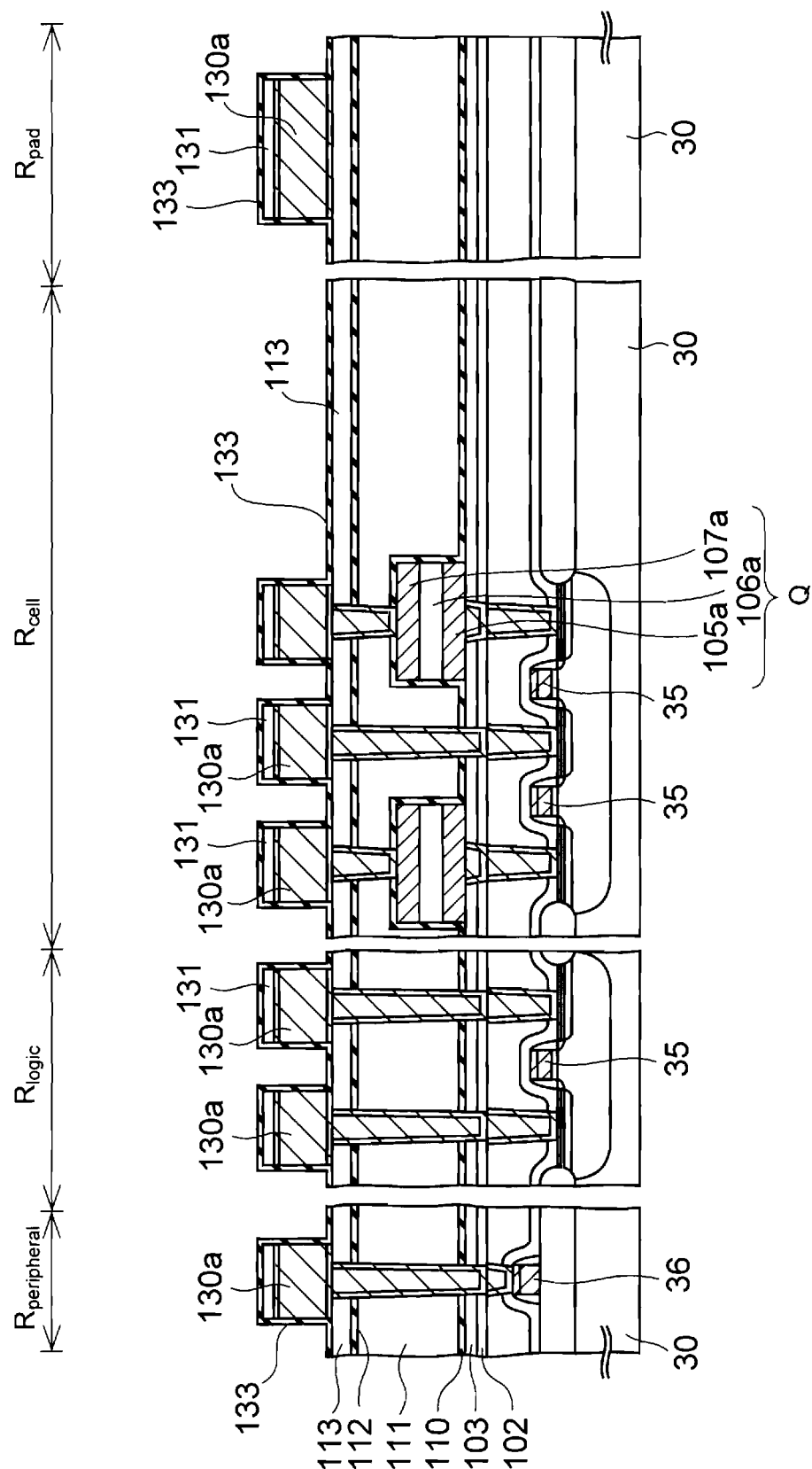
Figure 6U:
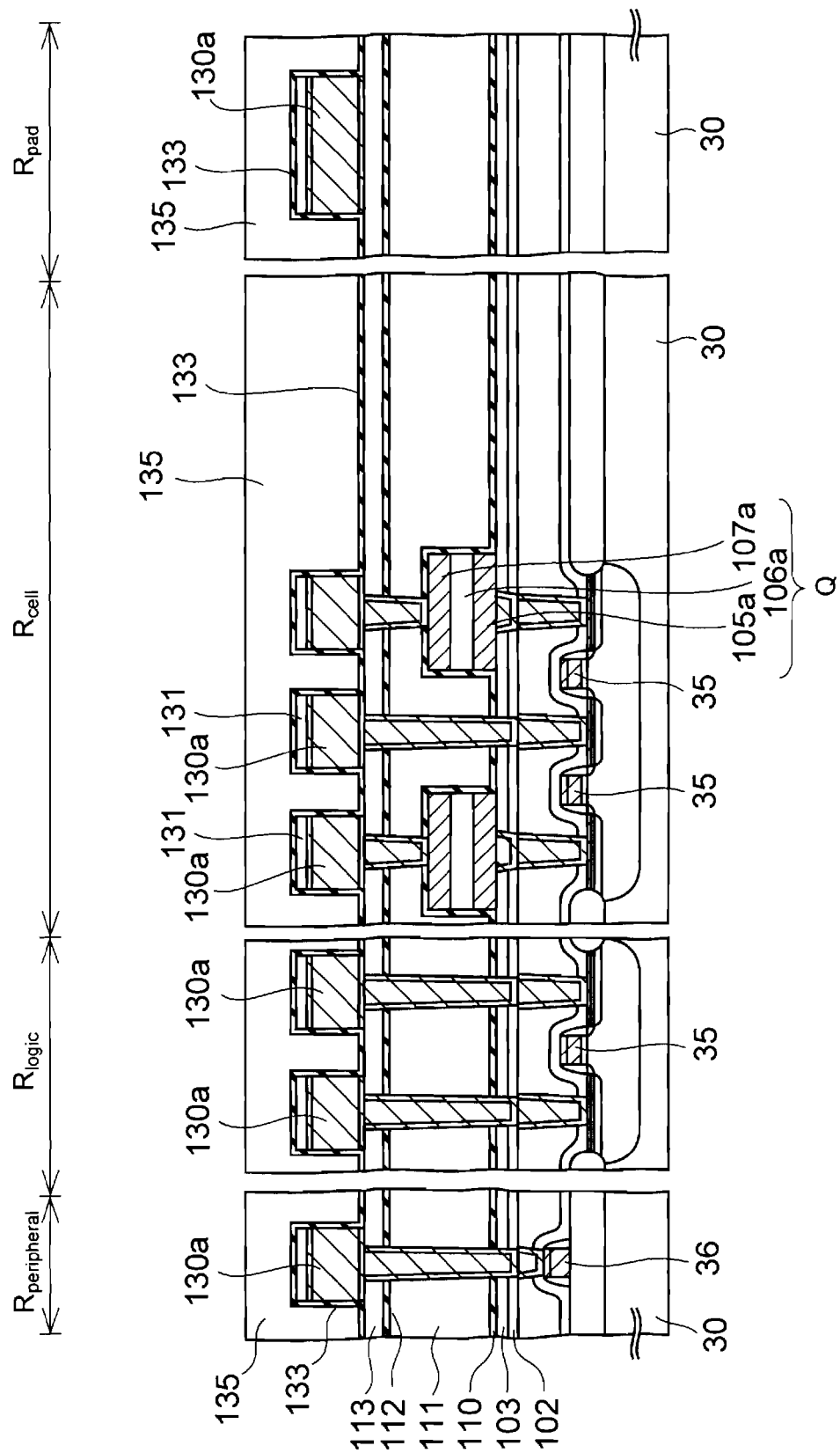
Figure 6V:
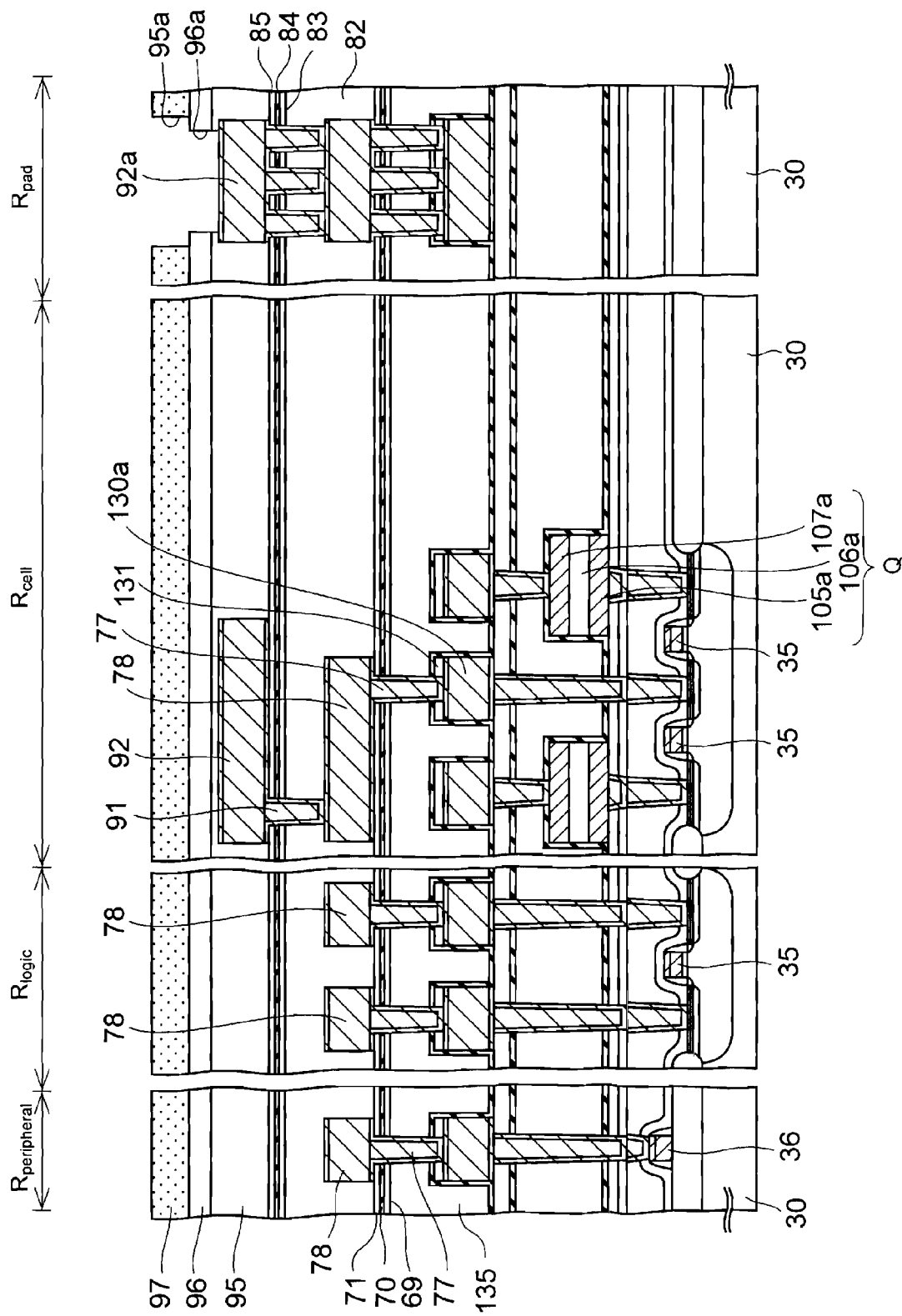

FIGS. 6A to 6V are cross-sectional views of a semiconductor device according to this embodiment in the course of manufacturing. In the drawings, the same elements as those described in the first embodiment are denoted by the same numerals, and description thereof is omitted in the following.

Firstly, description is given of steps for obtaining a cross-sectional structure illustrated in FIG. 6A.

First, after the steps illustrated in FIGS. 2A and 2B in the first embodiment, the base insulating film 44 and the first interlayer insulating film 45 are patterned, and thereby first holes 45a are formed in the insulating films. Then, a titanium film and a titanium nitride film to serve as a glue film are formed in this order in the first holes 45a and on the first interlayer insulating film 45. The titanium film and the titanium nitride films are formed by a sputtering method to have a thickness of approximately 20 nm and a thickness of approximately 50 nm, respectively.

Moreover, a tungsten film is formed on the glue film by a CVD method to completely fill the first holes 45a. Thereafter, an excess of the glue film and the tungsten film on the first interlayer insulating film 45 is polished by a CMP method and removed. Thereby, the films are left as first conductive plugs 100 only inside the first holes 45a.

Subsequently, the first interlayer insulating film 45 is exposed to $N_2O$ plasma. Thereby, the first interlayer insulating film 45 is dehydrated and a surface of the first interlayer insulating film 45 is nitrided to prevent moisture resorption. Conditions for the $N_2O$ plasma process are not particularly limited. In this embodiment, the process is performed for two minutes under the condition of a substrate temperature of 350° C.

Then, as illustrated in FIG. 6B, a silicon oxy-nitride film to serve as a first oxidation prevention insulating film 102 for preventing oxidation of the first conductive plugs 100 is formed by a CVD method to have a thickness of approximately 100 nm.

Alternatively, instead of a silicon oxy-nitride film, a silicon nitride film may be formed as the first oxidation prevention insulating film 102.

Moreover, to increase the adhesiveness between the first oxidation prevention insulating film 102 and capacitor lower electrodes to be described later, a silicon oxide film to serve as an insulating adhesive film 103 is formed on the first oxidation prevention insulating film 102 to have a thickness of approximately 100 nm.

Subsequently, as illustrated in FIG. 6C, the insulating films 102 and 103 are patterned to form a second hole 103a in portions, above each first source/drain region 39a, of the insulating films. Then, a second conductive plug 104 is formed in the second hole 103a.

The second conductive plug 104 is formed by forming a glue film and a tungsten film in this order, and is formed by the same method as that for the first conductive plugs 100, the glue film being formed of a laminated film including a titanium film and a titanium nitride film.

Thereafter, an $N_2O$ plasma process is performed on the insulating adhesive film 103 under the conditions of a substrate temperature of 350° C. and a process time of two minutes, for dehydration and prevention of moisture resorption of the insulating adhesive film 103.

Next, description is given of steps for obtaining a cross-sectional structure illustrated in FIG. 6D.

First, a titanium film 105x is formed on the insulating adhesive film 103 by a sputtering method to have a thickness of approximately 20 nm. The titanium film 105x functions to make the orientation of a ferroelectric film to be formed thereabove uniform, by its orientation.

Then, a titanium aluminum nitride (TiAlN) film 105y having a thickness of approximately 100 nm and an iridium oxide film 105z having a thickness of approximately 100 nm are formed on the titanium film 105x in this order by a sputtering method. Thereby, a first conductive film 105 is formed of the films 105x to 105z.

Even if oxygen permeates through the iridium oxide film 105z in recovery annealing in an oxygen-containing atmosphere to be described later, the oxygen can be blocked by the titanium aluminum nitride film 105y formed in the first conductive film 105 as described above. Thus, it is possible to prevent oxidation and contact failure of the second conductive plugs 104. Additionally, the titanium aluminum nitride film 105y has conductivity even if being oxidized, and is therefore preferable as a film for blocking oxygen on the plugs 104.

Thereafter, a PZT film to serve as a ferroelectric film 106 is formed on the first conductive film 105 by a MOCVD method to have a thickness of approximately 120 nm.

Then, a first iridium oxide film is formed on the ferroelectric film 106 by a sputtering method to have a thickness of approximately 50 nm, and then RTA is performed on the first iridium oxide film in an oxygen-containing atmosphere. The RTA is performed under the conditions of a substrate temperature of 725° C. and a process time of 60 seconds, for example. Moreover, oxygen gas of 0.025 litter/min is supplied to the annealing atmosphere.

Subsequently, a second iridium oxide film is formed on the first iridium oxide film by a sputtering method to have a thickness of approximately 100 nm. Thus, a second conductive film 107 formed of the laminated film including the first and second iridium oxide films is formed.

RTA is performed on the second conductive film 107 in an oxygen-containing atmosphere under the conditions of a substrate temperature of 700° C., an oxygen flow rate of 0.025 liter/min and a process time of 60 seconds.

Then, as illustrated in FIG. 6E, a titanium nitride film to serve as a first mask material layer 108 is formed on the second conductive film 107 by a sputtering method to have a thickness of approximately 200 nm.

Moreover, a silicon oxide film to serve as a second mask material layer 109 is formed on the first mask material layer 108 by a CVD method using TEOS gas, to have a thickness of approximately 700 nm.

Thereafter, as illustrated in FIG. 6F, a first resist pattern 110 having capacitor planar shapes is formed on the second mask material layer 109.

Then, as illustrated in FIG. 6G, the second mask material layer 109 is etched by using the first resist pattern 110 as a mask, to thereby form a second hard mask 109a.

Moreover, as illustrated in FIG. 6H, the first mask material layer 108 is etched by using the second hard mask 109a as a mask, to thereby form a first hard mask 108a. The first resist pattern 110 is reduced in film thickness by being exposed to the etching atmosphere, and mostly disappears by the time when the etching is completed.

Subsequently, as illustrated in FIG. 6I, the first conductive film 105, the ferroelectric film 106 and the second conductive film 107 are etched all at once by using the first and second hard masks 108a and 109a as masks. Thereby, capacitors Q each having the lower electrode 105a, the capacitor dielectric film 106a and the upper electrode 107a stacked in this order are formed as illustrated in FIG. 6I.

The lower electrode 105a forming the capacitor Q is directly connected to a corresponding one of the second conductive plugs 104, and is electrically connected to a corresponding one of the first source/drain regions 39a through the first conductive plug 100 under the second conductive plug 104.

In addition, the plugs in two levels, i.e., the first and second conductive plugs 100 and 104, are provided immediately under the capacitor Q, and the holes 45a and 103a in which the plugs are embedded respectively are formed individually. This reduces the aspect ratio of each of the holes, thereby facilitating formation of the holes.

Then, the first and second hard masks 108a and 109a are removed by dry etching and wet etching.

Then, to recover damage caused to the capacitor dielectric film 106a in the above-described steps, recovery annealing is performed on the capacitor dielectric film 106a in a vertical furnace having an oxygen-containing atmosphere. The conditions for the recovery annealing are not particularly limited. In this embodiment, the annealing is performed under the conditions of a substrate temperature of 350° C., an oxygen flow rate of 20 litter/min and a process time of 40 minutes.

Next, description is given of steps for obtaining a cross-sectional structure illustrated in FIG. 6J.

First, to protect the capacitor dielectric film 106a from reducing substances such as moisture and hydrogen, an alumina film to serve as a first insulating hydrogen barrier film 110 is formed over the entire upper surface of the silicon substrate 30 by an atomic layer deposition (ALD) method, to have a thickness of approximately 50 nm. An alumina film is excellent in blocking the reducing substances.

Then, a silicon oxide film to serve as a second interlayer insulating film 111 is formed on the first insulating hydrogen barrier film 110 to have a thickness of approximately 1500 nm. The silicon oxide film fills a narrow gap between two adjacent capacitors Q, and is hence preferably formed by a high density plasma CVD (HDPCVD) method, which provides excellent gap-filling properties.

Thereafter, an upper surface of the second interlayer insulating film 111 is polished by a CMP method and planarized, and then an alumina film to serve as a second insulating hydrogen barrier film 112 for protecting the capacitor dielectric film 106a from reducing substances is formed by an ALD method to have a thickness of approximately 50 nm.

Furthermore, a silicon oxide film to serve as a buffer insulating film 113 is formed on the second insulating hydrogen barrier film 112 to have a thickness of approximately 100 nm. The silicon oxide film can be formed by a CVD method using TEOS gas.

Then, as illustrated in FIG. 6K, a photoresist is applied on the buffer insulating film 113, and is then exposed and developed. Thereby, a second resist pattern 115 is formed.

Subsequently, the insulating films from the buffer insulating film 113 to the first oxidation prevention insulating film 102 are etched by using the second resist pattern 115 as a mask. Thereby, a third hole 117 is formed in portions, above each of the first conductive plugs 100, of the insulating films.

Thereafter, the second resist pattern 115 is removed.

Then, as illustrated in FIG. 6L, a titanium film having a thickness of approximately 20 nm and a titanium nitride film having a thickness of approximately 50 nm to serve as a glue film are formed in this order in the third holes 117 and on the buffer insulating film 113 by a sputtering method. Further, a tungsten film is formed on the glue film by a CVD method to completely fill the third holes 117. Then, an excess of the glue film and the tungsten film on the buffer insulating film 113 is polished by a CMP method and removed, to leave the films as third conductive plugs 118 only inside the third holes 117. The third conductive plugs 118 are each directly connected to the first conductive plug 100 thereunder.

The third conductive plugs 118 are mainly made of tungsten, which is easily oxidized, and are hence likely to be oxidized in the course of manufacturing the semiconductor device and consequently have contact failure.

In view of this, as illustrated in FIG. 6M, in the next step, a silicon oxy-nitride film to serve as a second oxidation prevention insulating film 120 is formed on the third conductive plugs 118 and the buffer insulating film 113 by a CVD method to have a thickness of approximately 100 nm. Thereby, the second oxidation prevention insulating film 120 protects the third conductive plugs 118 from an oxygen-containing atmosphere.

Subsequently, as illustrated in FIG. 6N, the insulating films 110 to 113 and 120 are patterned. Thereby, a fourth hole 122 is formed in portions, above each of the upper electrodes 107a, of the insulating films.

Then, to recover damage caused to the capacitor dielectric film 106a in the above-described steps, recovery annealing is performed on the capacitor dielectric film 106a in an oxygen-containing atmosphere in a vertical furnace.

The recovery annealing is performed under the conditions of a substrate temperature of 500° C., an oxygen gas flow rate of 20 liter/min and a process time of 60 minutes, for example.

Even if the annealing is performed in an oxygen-containing atmosphere, oxidation and contact failure of the third conductive plugs 118, mainly made of tungsten, are prevented since the third conductive lugs 118 are protected by the second oxidation prevention insulating film 120.

After the recovery annealing is completed, the second oxidation prevention insulating film 120 is etched and removed.

Then, as illustrated in FIG. 6O, a fourth conductive plug 127 is formed in each of the fourth holes 122 to be electrically connected to the corresponding upper electrode 107a.

To form such fourth conductive plugs 127, a titanium nitride film to serve as a glue film is formed inside the fourth holes 122 and on the buffer insulating film 113 by a sputtering method, and a tungsten film is formed on the glue film by a CVD method, to completely fill the fourth holes 122 with the tungsten film. Then, an excess of the glue film and the tungsten film on the buffer insulating film 113 is polished by a CMP method and removed. Thereby, the fourth conductive plugs 127 formed of these films can be formed in the fourth holes 122.

Subsequently, as illustrated in FIG. 6P, a metal laminated film 130 is formed on the third and fourth conductive plugs 118 and 127 and the buffer insulating film 113 by a sputtering method. The metal laminated film 130 is formed of a copper-containing aluminum film having a thickness of approximately 550 nm, a titanium film having a thickness of approximately 5 nm and a titanium nitride film having a thickness of approximately 150 nm in this order from the bottom.

Then, as illustrated in FIG. 6Q, an alumina film to serve as a protection film 131 for protecting the metal laminated film 130 and the capacitor dielectric film 106 from a plasma atmosphere is formed on the metal laminated film 130 by a sputtering method to have a thickness of approximately 20 nm.

The protection film 131 is not limited to an alumina film. Instead of an alumina film, an insulating metal oxide film such as a titanium oxide film, a zirconium oxide film, a magnesium oxide film or a titanium magnesium oxide film may be formed as the protection film 131.

Still alternatively, any one of the insulating films described in the first to fourth examples of the first embodiment may be formed as the protection film 131. Such insulating films include a silicon oxide film formed by a sputtering method (first example), a coat-type insulating film (second example), a resin film (third example) and ferroelectric oxide film (fourth example).

Thereafter, as illustrated in FIG. 6R, a photoresist is applied onto the protection film 131, and is then exposed and developed. Thereby, a third resist pattern 132 is formed.

Then, as illustrated in FIG. 6S, the protection film 131 and the metal laminated film 130 are dry-etched by using the third resist pattern 132 as a mask. Thereby, the metal laminated film 130 is made into first metal wirings 130a.

The dry etching for the protection film 131 is performed in a parallel-plate type etching apparatus by using gas mixture of $C_4F_8$, Ar, and $O_2$ as an etching gas. In this case, the flow rates of $C_4F_8$ gas, Ar gas and $O_2$ gas are 20 sccm, 500 sccm and 12 sccm, respectively, for example. Additionally, $CF_4$, $CHF_3$ or CO may be mixed into any of the gases.

Meanwhile, the dry etching for the metal laminated film 130 is performed in an ECR etching apparatus by using gas mixture of $BCl_3$ and $Cl_2$ as an etching gas. The flow rates of $BCl_3$ gas and $Cl_2$ gas are 105 sccm and 45 sccm, respectively, for example.

After the etching is completed, the third resist pattern 132 is removed by ashing, and a resist residue is removed by a wet process using chemicals and pure water.

In the wet process, impurities such as moisture and hydrocarbon adhere to side surfaces of the first metal wirings 130a. However, the adhesiveness of the protection film 131 already formed on the first metal wirings 130a does not decrease due to the impurities.

Accordingly, annealing for vaporizing the impurities does not need to be performed on the first metal wirings 130a. This prevents deterioration of the capacitor dielectric film 106a due to heat by annealing.

Thereafter, as illustrated in FIG. 6T, an alumina film to serve as a third insulating hydrogen barrier film 133 for covering the first metal wirings 130a and the buffer insulating film 113 is formed by a sputtering method to have a thickness of 5 nm to 30 nm, e.g., 20 nm.

The third insulating hydrogen barrier film 133 functions to protect the capacitor dielectric film 48a by blocking reducing materials such as hydrogen and moisture, and may be formed of any insulating metal oxide film among a titanium oxide film, a zirconium oxide film, a magnesium oxide film and a titanium magnesium oxide film, instead of an alumina film.

Alternatively, a silicon-containing insulating film containing nitrogen such as a silicon nitride film or a silicon oxynitride film may be formed as the third insulating hydrogen barrier film 133.

Then, as illustrated in FIG. 6U, a silicon oxide film to serve as a third interlayer insulating film 135 is formed on the third insulating hydrogen barrier film 133 by a plasma CVD method using a mixed gas of TEOS gas and oxygen gas as a reactant gas, to completely fill gaps between the first metal wirings 130a.

The third interlayer insulating film 135 may be deposited by a plasma CVD method by using, for example, the plasma CVD apparatus 200 described on the basis of FIG. 5.

Even though a plasma CVD method is employed, upper surfaces of the first metal wirings 130a are covered by the protection film 131, which functions as a plasma protection film. Accordingly, it is possible to reduce a possibility that damage caused in deposition due to plasma reaches the capacitor dielectric film 106a through the first metal wirings 130a, and to maintain excellent ferroelectric characteristics of the capacitor dielectric film 106a.

Thereafter, an upper surface of the third interlayer insulating film 135 is polished by a CMP method and planarized.

Then, an $N_2O$ plasma process is performed on a surface of the third interlayer insulating film 135 in a CVD apparatus, to dehydrate the third interlayer insulating film 135 and prevent moisture resorption by nitriding the surface. The $N_2O$ plasma process is performed in a CVD apparatus under the conditions of a substrate temperature of approximately 350° C. and a process time of approximately four minutes.

After the above-described steps, a base structure of the semiconductor device according to this embodiment is completed as illustrated in FIG. 6V, by performing the steps described in FIGS. 2T to 2Z and 3A to 3E of the first embodiment.

According to the above-described embodiment, the protection film 131 prevents the first metal wirings 130a from being exposed to the plasma atmosphere when depositing the third interlayer insulating film 135 as described with reference to FIG. 6U. Accordingly, as in the first embodiment, plasma damage is less likely to be caused to the capacitors Q electrically connected to the first metal wirings 130a. This reduces damage caused to the capacitor dielectric film 106a when forming the third interlayer insulating film 135 by a plasma CVD method, and prevents deterioration of the ferroelectric characteristics of the capacitor dielectric film 106a.

Moreover, as illustrated in FIG. 6R, the protection film 131 is formed before the metal laminated film 130 is subjected to patterning. Accordingly, even if impurities such as moisture and hydrocarbon adhere to the side surfaces of the first metal wirings 130a in the wet process performed after the patterning of the metal laminated film 130, the adhesiveness between the first metal wirings 130*a* and the protection film 131 does not decrease due to the impurities. Consequently, annealing for vaporizing the impurities adhering to the first metal wirings 130*a* can be omitted, which prevents deterioration of the capacitor dielectric film 106*a* due to heat by annealing.

Furthermore, the third insulating hydrogen barrier film 133 is formed on the protection film 131, and can thereby prevent hydrogen contained in the atmosphere used when depositing the third interlayer insulating film 135 from reaching the capacitor dielectric film 106*a*. This prevents reduction of the capacitor dielectric film 106*a* due to hydrogen, and suppresses a degradation of the capacitor dielectric film 106*a* in ferroelectric characteristics.

While this embodiment has been described in detail above, the present invention is not limited to the above-described embodiment. Although the semiconductor substrate W having the orientation flat OF formed therein is used in the above-described embodiment, the semiconductor substrate W having a notch formed therein instead of the orientation flat OF may be used, for example.

What is claimed is:

1. A method of manufacturing a semiconductor device, comprising:
    forming a transistor on a semiconductor substrate;
    forming a first interlayer insulating film over the semiconductor substrate and the transistor;
    forming a ferroelectric capacitor over the first interlayer insulating film;
    forming a second interlayer insulating film over the first interlayer insulating film and the ferroelectric capacitor;
    forming a hole in the second interlayer insulating film at a portion over any one of a lower electrode and an upper electrode constituting the ferroelectric capacitor;
    forming a wiring over the second interlayer insulating film, wherein the wiring is in contact with the any one of the lower electrode and the upper electrode through the hole;
    forming a protection film over an upper surface of the wiring but not on a side surface of the wiring, wherein the protection film is formed of an alumina film;
    wherein the formation of the wiring includes:
    forming a conductive film over the second interlayer insulating film;
    forming the protection film over the conductive film;
    forming a resist pattern over the protection film;
    etching the conductive film and the protection film by using the resist pattern as a mask, to thereby make the conductive film into the wiring and leave the protection film only over the upper surface of the wiring; and
    removing the resist pattern.

2. The method of manufacturing a semiconductor device according to claim 1,
    wherein no annealing is performed on the wiring after forming the resist pattern and before forming a next film over the second interlayer insulating film.

3. The method of manufacturing a semiconductor device according to claim 1, wherein the protection film is formed by any one of a sputtering method and a deposition method not using plasma.

4. The method of manufacturing a semiconductor device according to claim 1, further comprising:
    forming a third interlayer insulating film over the second interlayer insulating film, the wiring and the protection film by a deposition method using plasma.

5. The method of manufacturing a semiconductor device according to claim 4,
    wherein a plasma protection film for protecting the wiring from damage caused by plasma used in depositing the third interlayer insulating film is formed as the protection film.

6. The method of manufacturing a semiconductor device according to claim 1, wherein either any one of a silicon oxide film and a ferroelectric oxide film is formed by a sputtering method as the insulating film, or any one of a coat-type insulating film and a resin film is formed as the insulating film.

7. The method of manufacturing a semiconductor device according to claim 1, further comprising:
    forming an insulating hydrogen barrier film over the protection film, the second interlayer insulating film, and on the side surface of the wiring.

8. The method of manufacturing a semiconductor device according to claim 7, wherein any one of an insulating metal oxide film and a silicon-containing insulating film containing nitrogen is formed as the insulating hydrogen barrier film.

9. The method of manufacturing a semiconductor device according to claim 1, wherein said removing the resist pattern includes a wet process.

* * * * *